(12) United States Patent
Kurata et al.

(10) Patent No.: US 6,243,290 B1
(45) Date of Patent: Jun. 5, 2001

(54) NONVOLATILE SEMICONDUCTOR MEMORY DEVICE

(75) Inventors: Hideaki Kurata, Kokubunji; Naoki Kobayashi, Tokyo; Takashi Kobayashi, Tokorozawa; Katsutaka Kimura, Akishima; Hitoshi Kume, Musashino; Shunichi Saeki, Ome, all of (JP)

(73) Assignees: Hitachi, Ltd., Tokyo; Hitachi Device Engineering Co., Ltd., Chiba, both of (JP)

( * ) Notice: Subject to any disclaimer, the term of this patent is extended or adjusted under 35 U.S.C. 154(b) by 0 days.

(21) Appl. No.: 09/645,878

(22) Filed: Aug. 25, 2000

(30) Foreign Application Priority Data

Aug. 31, 1999 (JP) .................................... 11-246327

(51) Int. Cl.[7] .................................................. G11C 16/04
(52) U.S. Cl. ................................ 365/185.03; 365/185.24
(58) Field of Search ....................... 365/185.03, 185.18, 365/185.21, 185.22, 185.23, 185.24

(56) References Cited

U.S. PATENT DOCUMENTS

| 5,572,462 | * | 11/1996 | Lee ................................ 365/185.03 |
| 5,768,191 | * | 6/1998 | Choi ............................... 365/185.03 |
| 6,078,518 | * | 6/2000 | Chevallier ....................... 365/185.03 |

FOREIGN PATENT DOCUMENTS

| 3-219496 | 9/1991 | (JP) . |
| 4-57294 | 2/1992 | (JP) . |
| 6-77437 | 3/1994 | (JP) . |
| 7-37393 | 2/1995 | (JP) . |
| 8-279566 | 10/1996 | (JP) . |
| 9-180471 | 7/1997 | (JP) . |
| 10-214373 | 9/1998 | (JP) . |

OTHER PUBLICATIONS

Raul Cernea, et al., "A 34Mb 3.3V Serial Flash EEPROM for Solid–State Disk Applications", IEEE International Solid–State Circuits Conference, Session 7, Paper TA 7.4, pp. 126–127, Feb. 1995.

* cited by examiner

*Primary Examiner*—Trong Phan
(74) *Attorney, Agent, or Firm*—Vorys, Sater, Seymour and Pease LLP

(57) ABSTRACT

The present invention provides a nonvolatile semiconductor memory device for multilevel data storage that simultaneously carries out programming of multilevel data and subsequent verification at a high programming throughput.

For this purpose, the present device includes a circuit 6 to hold programming data when programming is executed, a circuit 7 to generate timing signals to set up level-specific phases of verifying multilevel programming data during a verification period, a circuit 2 to increase stepwise the selected word line voltage during verification in accordance with the above timing signals, a circuit 4 to select target memory cells 1 for verification, depending on the data retrieved from the latch in accordance with the above timing signals, and verify whether the selected memory cells have been programmed on threshold voltage level, according to the energized or de-energized state thereof, and a circuit 5 to supply programming bias to the bit line to program data into insufficiently programmed memory cells, according to the verify results.

20 Claims, 49 Drawing Sheets

NONVOLATILE SEMICONDUCTOR MEMORY DEVICE

BACKGROUND OF THE INVENTION

1. Field of the Invention

The present invention relates to electrically rewritable nonvolatile semiconductor devices, particularly to nonvolatile semiconductor memory devices with memory cells for storing multilevel data.

2. Description of the Related Art

The number of cells of a semiconductor memory device made so as to be capable of storing N bits per cell by setting three or more threshold voltages for programming per cell can be reduced to 1/N of a semiconductor device capable of storing one bit per cell. The number of states of threshold voltages in which a cell of such memory device is placed shall satisfy the condition $K=2^N$. An example of distribution of threshold voltages for programming data into memory cells to store two bits (N=2) per cell is shown in FIG. 59. Here, four states of threshold voltages, zero state through third state are set, because K=4, and three voltages V pref 1 through V pref 3 are used to identify the first through third states of threshold voltages.

It is usually difficult for such multilevel memory device to reach the states of the threshold voltages shown in FIG. 59 by one programming in view of precision. Thus, such a programming method is used that verification is executed as to whether the expected threshold voltage state for programming is gained after programming is executed; if programming is insufficient, programming is executed again; and programming and verification are repeated until the predetermined threshold voltage state has been reached. For example, for a memory device wherein data is programmed into a cell by injecting electrons into the floating gate of the cell, the quantity of charge at the floating gate is gradually increased by injecting a small amount of electrons into the floating gate each time programming is repeated and programming is continued until a predetermined quantity of charge has been gained at the floating gate, that is, the memory cell has reached the threshold voltage state for programming (storing) the data.

FIG. 60 shows examples of voltages that are applied to a word line (the control gate of a memory cell) when the above programming steps are taken. When programming is executed, a high voltage (bias) is applied to the word line and a programming bias voltage lower than the bias applied to the word line is applied to a bit line (the drain of the memory cell). When verification is executed, voltages V prf j (j=1, 2, . . . , K−1) required to verify whether programming is complete are applied. In this example, the word line voltage gradually increases during programming as the programming cycle advances and the programming data level changes, thereby increasing the quantity of electrons injected per application of the programming bias.

Because a complex circuitry is required to control the quantity of electrons injected as described above, a method in which the word line voltage is set constant and a simple circuitry is configured is often used. In this case, more programming and verification cycles are necessary, particularly in a case where a high threshold voltage is used for programming data.

A previous programming and verification scheme is known; for example, the one disclosed in Japanese Patent Prepublication No. Hei 9-180471, which will be referred to as a first scheme hereinafter. In relation to this scheme, FIG. 59 shows distribution of threshold voltages for memory cells capable of storing information of two bits per cell, FIG. 60 shows the relation between the voltage of selected word line and programming verify actions, and FIG. 61 shows a flowchart of the process thereof. In the distribution of threshold voltages shown in FIG. 59, data is erased in the zero state of threshold voltage.

This first scheme is characterized in that programming of multilevel programming data is completed sequentially from one level to another level. First, for memory cells to be programmed in the first state of threshold voltage, first threshold level programming verification is executed. After the completion of the programming in the first state, for memory cells to be programmed in the second state of threshold voltage, second threshold level programming and verification are executed. After the completion of the programming in the second state, for memory cells to be programmed in the third state of threshold voltage, third threshold level programming and verification are executed. When programming in the third state is complete, the programming on all levels of threshold voltages terminates. In this scheme, threshold voltages are controlled with high precision because programming is completed by repeating programming action to program data into memory cells by applying bias to word and bit lines (programming bias application action) and verify action until the memory cells have reached a desired state of threshold voltage. However, sequential operation of precise threshold voltage control per level requires a great number of cycles of programming and verification, and consequently, long programming time is inevitable.

Another previous programming and verification scheme is also known, for example, the one disclosed in Japanese Patent Prepublication No. Hei 4-57294, which will be referred to as a second scheme hereinafter. The second scheme is characterized in that simultaneous programming of multilevel data is executed and verification procedure starts upon the completion of programming. Because of simultaneous programming and verification for multilevel data, in the second scheme, verification cycles can be decreased and programming time can be reduced.

In the programming verification procedure of the second scheme, as shown in FIG. 62, a memory cell current is compared with a plurality of reference currents and thereby programming on threshold voltage level is verified. When a constant voltage is applied to the bit line of memory cells, the current flow through the memory cells differs, depending on the threshold voltage of the memory cells. Then, current I cell flowing through a target memory cell 1 for verification is compared with currents I ref1 through I ref3 flowing through a reference cell array R and difference between both is detected by detectors SA1 through SA3. A logic circuit LC executes arithmetic operation of the result of detection and outputs programming data level as D1 and D2 of two bits. This second scheme uses current sense amplifiers.

However, this scheme has the following natures. (1) Generating a plurality of reference current levels with precision is difficult in limited circuitry and the size of circuit structure becomes larger. (2) Because current sense amplifiers consume large current during current sensing operation, simultaneous verification for many memory cells is difficult and the programming throughput is limited. (3) Amplifiers of high sensitivity are required to verify multilevel data programming by using memory cell currents, which results in increased chip area. Therefore, the second scheme is not used in a case where a high programming throughput is especially required.

Another current sense amplifier example shown in FIG. 63 is disclosed in Japanese Patent Prepublication No. Hei 10-241373. In this example, a single reference level I ref is used and memory cell current I cell flowing through a cell when bias voltage (WL voltage) on the word line is gradually increased in steps is compared with the reference level I ref. A timing detector TD detects timing when the memory cell current I cell becomes greater than the reference level I ref and thereby verification of programming is performed.

In this example, stepwise transition of the word line voltage is required in accordance with threshold voltage levels for programming and thus this requires longer verification than verification in the scheme shown in FIG. 62. However, because verification can be performed by using a single reference level, the circuitry size can be reduced. Nevertheless, because current sense amplifiers are a means to verify the memory data also in this case, current consumption during sensing is inevitably increased, which restricts the number of cells put to simultaneous verification. Thus, the programming throughput is limited.

SUMMARY OF THE INVENTION

An object of the present invention is provide a nonvolatile semiconductor memory device for multilevel data storage that implements programming and verification operation at a high programming throughput by simultaneously carrying out programming of multilevel programming data and subsequent verification.

To attain this object, a nonvolatile semiconductor memory device according to the present invention includes a data latch circuit to hold N bits of data, a timing controller that generates timing signals to set up a (K−1) number of verify phases for data levels corresponding to a (K−1) number of threshold voltages other than the erasure-level threshold voltage during a verification period following programming, a word line voltage driver to increase stepwise the word line voltage during verification in accordance with the above timing signals, and a verification circuit to select target memory cells for verification, depending on the data retrieved from the data latch circuit in accordance with the above timing signals and verify whether the threshold voltage for programming is gained. In combination of these components, programming bias is applied to the bit line to insufficiently programmed memory cells, according to the result of verification, to reprogram the data into these memory cells.

With the above features, the nonvolatile semiconductor memory device performs programming verify action comprising simultaneous data programming on the data levels corresponding to the (K−1) threshold voltages and subsequent verification and repeats this action until all data of the (K−1) data levels has been programmed into memory cells. In this way, programming is executed.

Verifying whether memory cells have been programmed on threshold voltage is implemented by detecting the energized or de-energized state of the memory cells. For example, the bit line is precharged and detection is performed as to whether the bit line is discharged though the memory cells or remains charged, according to whether the memory cells are live or dead. In this way of detection, verification can be performed. Detection of charge/discharge, or in other words, voltage change is similar to reading and static current flow for detection is not necessary, and thus operation is rapid. Because of rapid operation of verifying whether memory cells has reached a desired threshold voltage, the nonvolatile semiconductor memory device of the present invention does not decrease the programming throughput unlike current sense amplifiers that would do so.

From the verify phases that are assigned to programming levels during a verification period, according to the above detection method, an appropriate phase is selected, depending on the programming data, and verification is executed for target memory cells during the selected phase. By setting timing to verify whether the memory cells have been programmed, depending on the programming data, while increasing stepwise the word line voltage, a series of verify actions for multiple levels is then performed. In this way, simultaneous verification for a great number of memory cells can be performed and a rapid nonvolatile semiconductor memory device featuring a high programming throughput can be realized.

Furthermore, the timing controller again generates different timing signals to set up a (K−1) number of programming phases for data levels corresponding to a (K−1) number of threshold voltages other than the erasure-level threshold voltage during a programming period. It is desirable to select target memory cells for programming, depending on the data retrieved from the data latch circuit in accordance with the above different timing signals and increase stepwise the bit line voltage in accordance with the above different timing signals. Because the higher the threshold voltage level, the more data will be programmed by one programming action, programming time can be reduced.

In addition, by appropriately assigning programming phases to multiple programming data levels during a programming period, a series of multilevel data programming actions can be performed and rapid programming of multilevel data can be implemented. The word line voltage may be increased stepwise instead of increasing stepwise the bit line voltage.

Another embodiment of the nonvolatile semiconductor memory device of the present invention is characterized in that the above timing is set such that programming of data on a level that is the greatest difference from the threshold voltage of data erasure level (which will be hereinafter referred to as "data level of greatest gap") is completed and then programming on the remaining threshold voltages is executed.

If, for example, the threshold voltage of erasure level is the lowest and the data level of greatest gap is the highest threshold voltage, by narrowing the distribution band of the memory cell threshold voltages other than the erasure level threshold voltage and the highest memory cell threshold voltage, the voltage difference between the erasure and highest levels can be reduced. Moreover, verification time for the memory cells other than those for which the highest threshold voltage is set can be reduced per memory cell and high-rate programming verify actions can be implemented. Reducing the threshold voltage difference can also prevent the degradation of the charge retentivity of the memory cells.

To accomplish programming in the manner described above, the timing controller again generates different timing signals to set up a (K−2) number of different programming phases for a (K−2) number of data levels other than the erasure level and the data level of greatest gap during a programming period. Programming is executed by selecting target memory cells for programming, depending on the data retrieved from the data latch circuit in accordance with the above different timing signals, while increasing stepwise the bit line voltage in accordance with the above different timing signals. Because the higher the threshold voltage level, the more data will be programmed by one programming action, programming time can be reduced.

In addition, by appropriately assigning programming phases to multiple programming data levels during a programming period, a series of multilevel data programming actions can be performed and rapid programming of multilevel data can be implemented. The word line voltage maybe increased stepwise instead of increasing stepwise the bit line voltage.

The foregoing and other objets, advantages, manner of operation and novel feature of the present invention will be understood from the following detailed description when read in conjunction with the accompanying drawings.

DESCRIPTION OF THE PREFERRED EMBODIMENTS

Referring to the relevant drawings, preferred embodiments of the nonvolatile semiconductor memory device according to the present invention will be explained in detail below.

Figure 1:
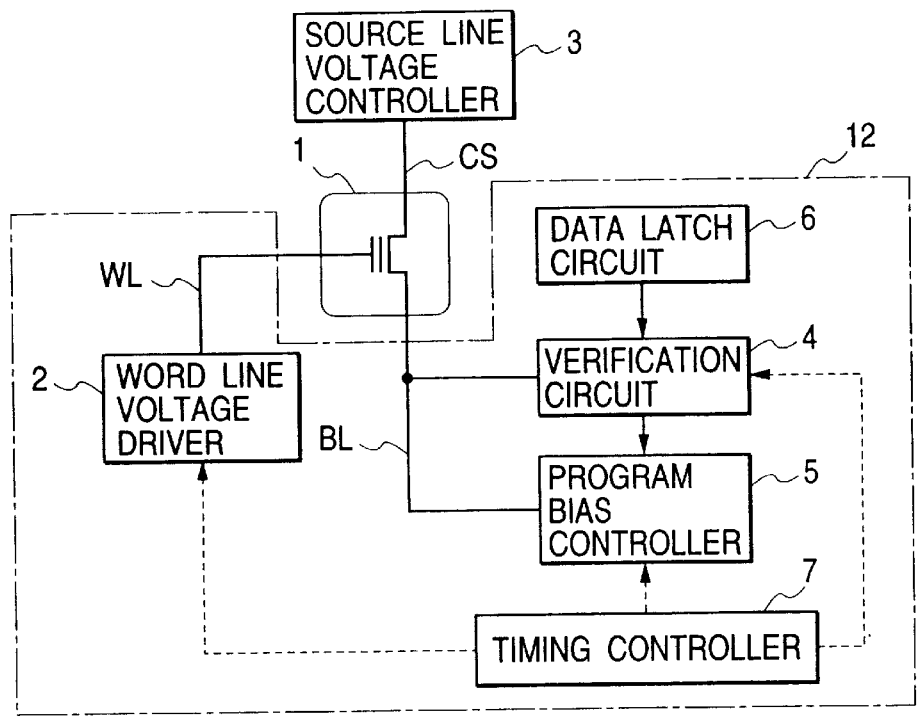
FIG. 1 is a circuit structure diagram for explaining the overview of a nonvolatile semiconductor memory device according to the present invention that may be implemented in preferred embodiments.

FIG. 1 shows a basic schematic circuit structure for implementing the programming and verification operation in the preferred embodiments of the present invention. The gate terminal of memory cells 1 is connected to a word line voltage driver 2 through word line WL, the source terminal thereof is connected to a source line voltage controller 3 through common source line CS, and the drain terminal thereof is connected to bit line BL. To the bit line BL, a verification circuit 4 and a program bias controller 5 are connected.

A data latch circuit 6 holds programming data during programming. A timing controller 7 generates timing signals to set up level-specific phases of verifying multilevel programming data during a verification period following the application of programming bias. The word line voltage driver 2 increases stepwise the voltage on selected word lines WL per verify phase in accordance with the above timing signals. The verification circuit 4 selects memory cells 1 for which it will verify the data programming thereto, depending on the data retrieved from the data latch circuit 6 in accordance with the above timing signals, and verifies whether the data has been programmed on threshold voltage level by detecting the energized or de-energized state of the selected memory cells 1. Depending on the result of verification, the program bias controller 5 supplies programming bias to the bit line to insufficiently programmed memory cells.

Timing signals for controlling timing of verification as described above are supplied from the timing controller 7 to the word line voltage driver 2, verification circuit 4, and programming bias controller 5. To the verification circuit 4, the data latch circuit 6 is connected. The verification circuit 4 selects memory cells 1 for which it will verify the data programming thereto by retrieving the data from the data latch circuit 6 in accordance with the above timing signals and executes verify action by detecting the energized or de-energized state of the selected memory cells 1. After executing the verify action for all data from the data latch circuit 6, the verification circuit 4 judges whether programming into the memory cells 1 has been completed and sends a signal indicating the result of judgment to the programming bias controller 5. Depending on the result of judgment received, the programming bias controller 5 supplies programming bias to only the bit line BL to the incompletely programmed memory cells. It should be noted that the verification circuit 4 is activated when selecting target memory cells 1 for verification.

Figure 2A:
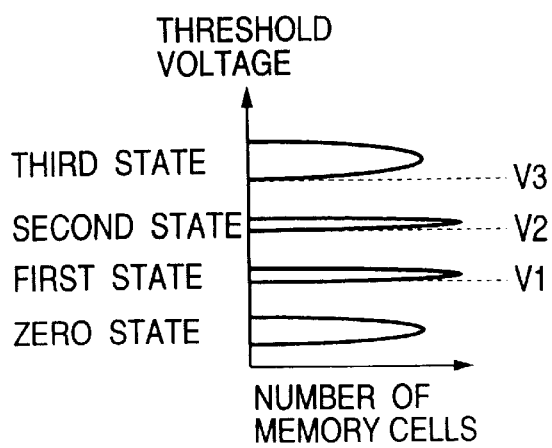
FIG. 2A is a diagram showing one example of distribution of threshold voltages of memory cells and FIG. 2B is a diagram showing another example of distribution of threshold voltages of memory cells.
Figure 2B:
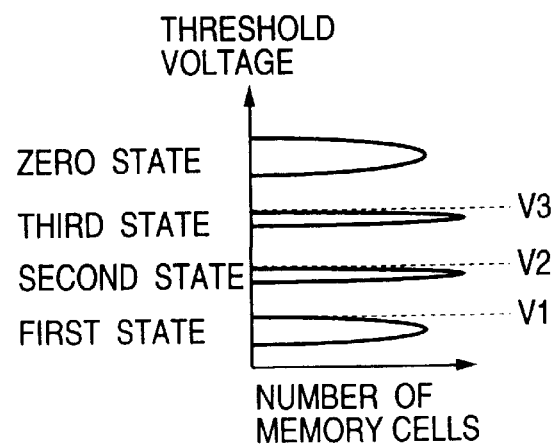
Figure 3:
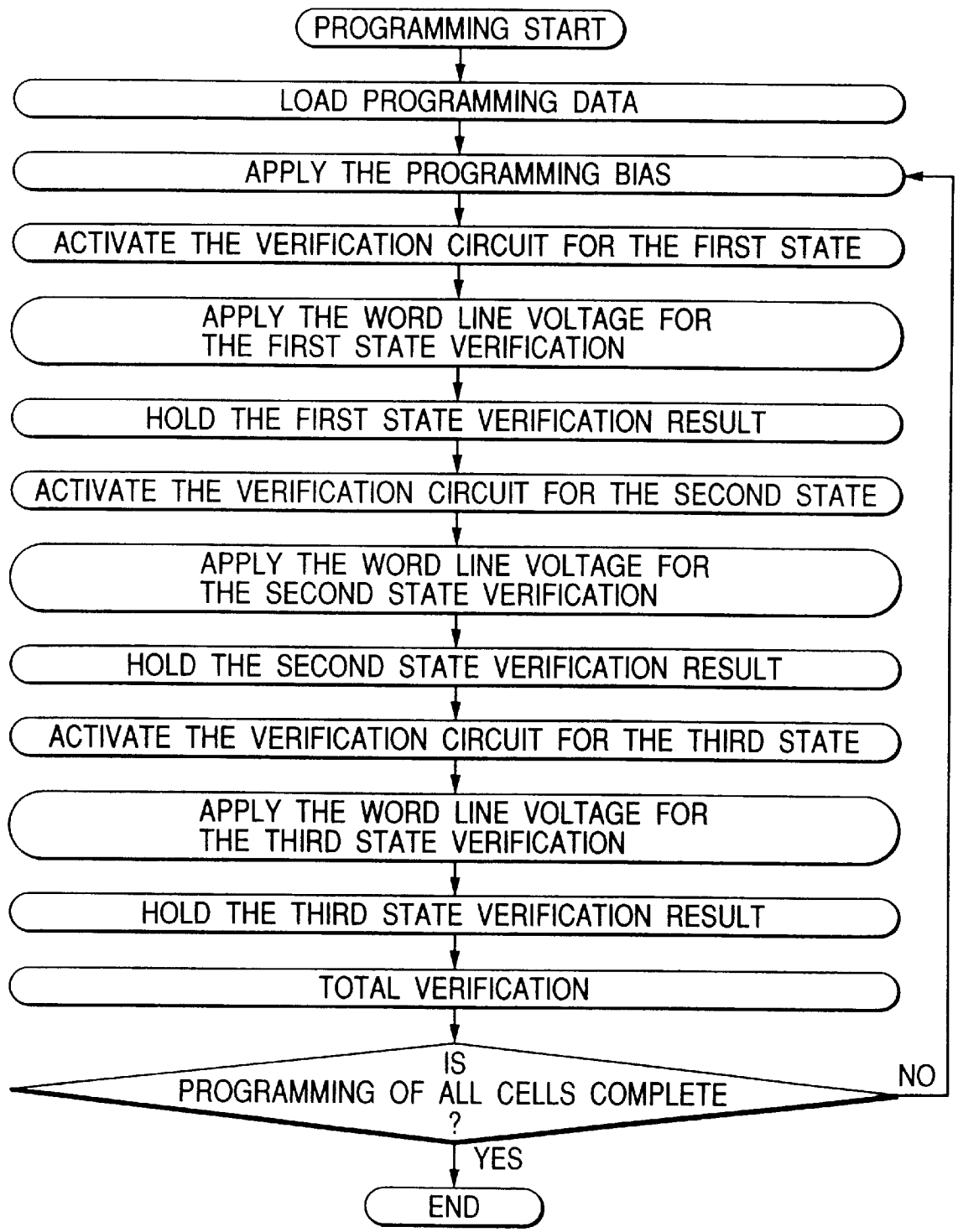
FIG. 3 is a flowchart for explaining the overview of the programming and verification scheme implemented in the schematic of the present invention shown in FIG. 1.

The memory cells 1 are capable of storing data of two bits per cell and can be placed in four states of threshold voltages shown in FIG. 2a and 2b. In FIG. 2a, the data erased state is a zero state and programming into the cells is performed by increasing the threshold voltage to first, second, and third states. In FIG. 2b, the threshold voltage is highest in the data erased state (zero state) and programming into the cells is performed by decreasing the threshold voltage to third, second, and first states. The states of threshold voltages may be in order shown in either FIG. 2a or FIG. 2b. Together with FIG. 1, using FIG. 3 that is a flowchart illustrating programming and verify action, the overview of the present invention will be explained below.

With the input of a programming instruction, programming data is transferred to the circuitry shown in FIG. 1 from outside and set in the data latch circuit 6. At the same time, programming bias is applied to the memory cells 1 into which data is to be programmed, and then verification is executed by using the data in the data latch circuit 6.

Verification is executed as follows. First, the verification circuit 4 is activated by selecting memory cells 1 whose intended programming level is the first state of threshold voltage. Then, the word lines WL to these memory cells are set at a first-state verify level of voltage so that the verification circuit 4 will hold the first-state verify results for the memory cells to be programmed in the first threshold voltage state. Connection of the bit line BL to the verification circuit 4 is made, depending on the data retrieved from the data latch circuit in accordance with the above timing signals. Next, similarly, the verification circuit 4 is activated to verify the data in memory cells to be programmed in the second threshold voltage state and the word lines WL to these memory cells are set at a second-state verify level of voltage so that the verification circuit 4 will hold the second-state verify results for the memory cells to be programmed in the second threshold voltage state. Next, the verification circuit 4 is activated to verify memory cells to be programmed in the third threshold voltage state and the word lines WL to these memory cells are set at a third-state verify level of voltage so that the verification circuit 4 will hold the third-state verify results for the memory cells to be programmed in the third threshold voltage state. Therefore, the verification circuit 4 has a set of first, second, and third verify results and executes simultaneous verification, based on these results. In this way, by setting timing to verify whether specific data has been programmed in each threshold voltage state of the memory cells, depending on the programming data, verification of programming in the three threshold voltage states is performed at a time before the next programming is executed for insufficiently programmed memory cells.

As the result of the simultaneous verification, if there are memory cells of incomplete programming, the program bias controller 5 operates such that programming bias is applied to only the memory cells where programming is incomplete. The above process of verification action and programming bias application action that follows is repeated until programming into all memory cells to be programmed has been completed.

Of course, the operation scheme described above can easily be applied to memory cells that can be placed in, for example, four or more levels per cell of threshold voltage states.

Figure 4:
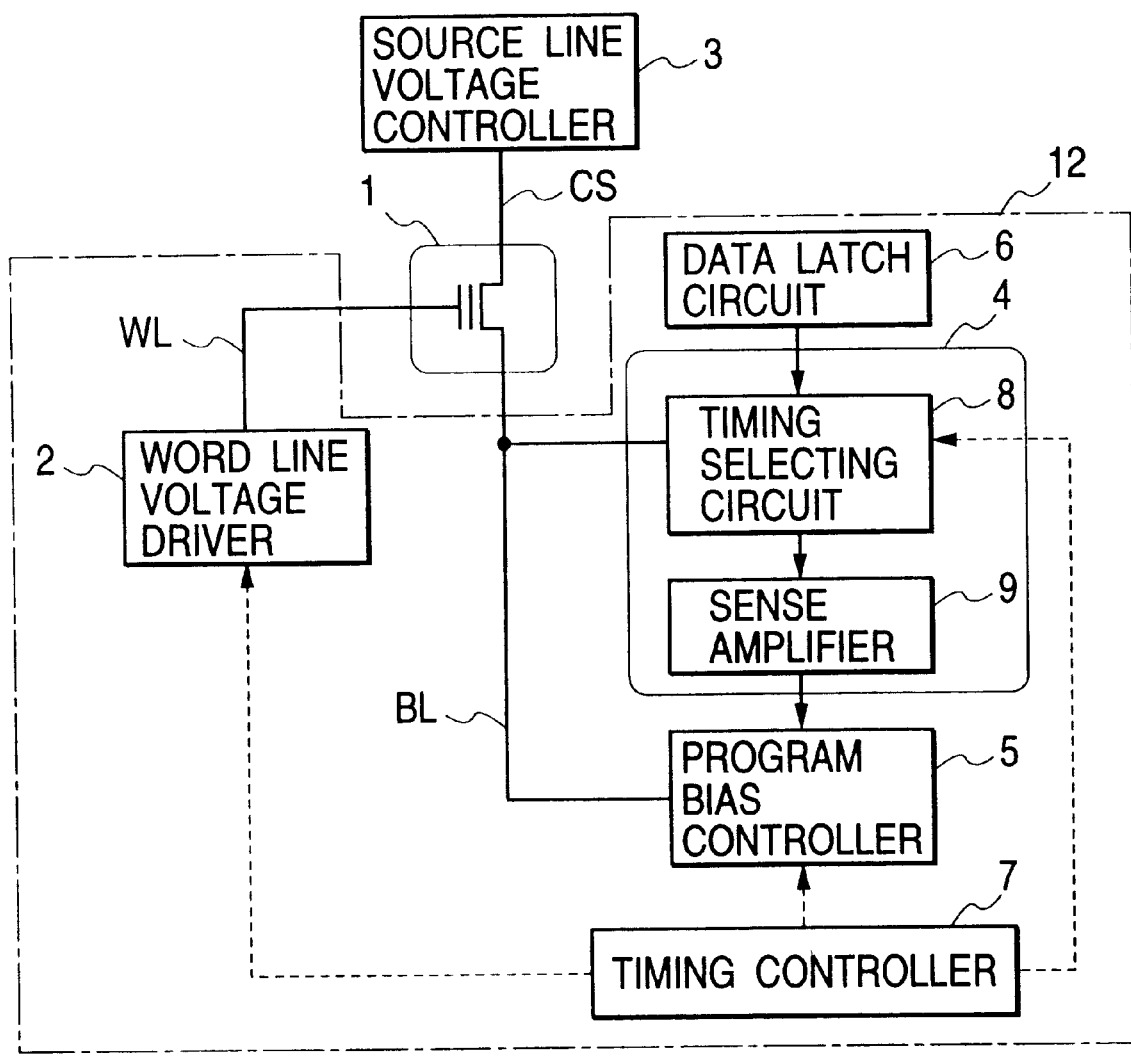
FIG. 4 is a circuit structure diagram for explaining the schematic of preferred embodiments of a nonvolatile semiconductor memory device according to the present invention.

As one example of embodying the feature of the invention described above, the verification circuit can be configured with a timing selecting circuit 8 and a sense amplifier 9, for example, as shown in FIG. 4. To the timing selecting circuit 8, the programming data held by the data latch circuit 6 and timing signals from the timing controller 7 are input. Only when the timing selecting circuit 8 retrieves the data from the data latch circuit 6 in accordance with a timing signal from the timing selecting circuit 8, it connects the bit line BL to the sense amplifier 9 and selects target memory cells for verification. When connected to the bit line BL, the sense amplified is activated to detect the energized or de-energized state of the memory cells. In this way, timing to verify the programming for each of the threshold voltage states of memory cells is set, according to the relevant programming.

Figure 5:
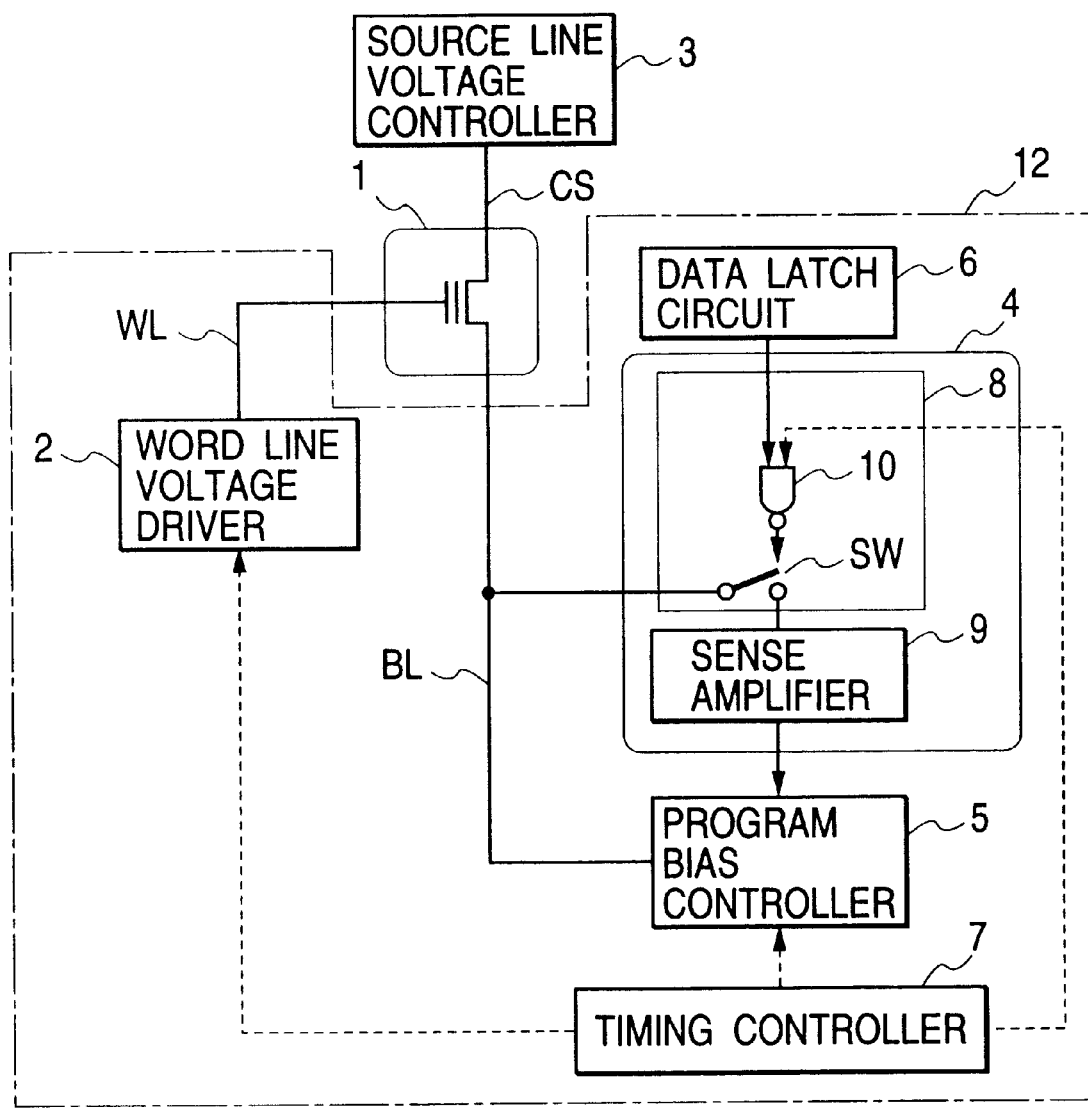
FIG. 5 is a circuit structure diagram for explaining a concrete example of the schematic of preferred embodiments of the invention.

Furthermore, a concrete example of the timing selecting circuit 8 is given in FIG. 5. This timing selecting circuit 8 is configured with a switch SW that connects the bit line BL and the sense amplifier 9 and a logic gate 10 that is supplied with output signals from the data latch circuit 6 and the timing controller 7 and generates control signals to the switch SW. The switch SW is ON only when the output signals from both the data latch circuit 6 and the timing controller 7 are supplied to the logic gate 10.

Figure 6:
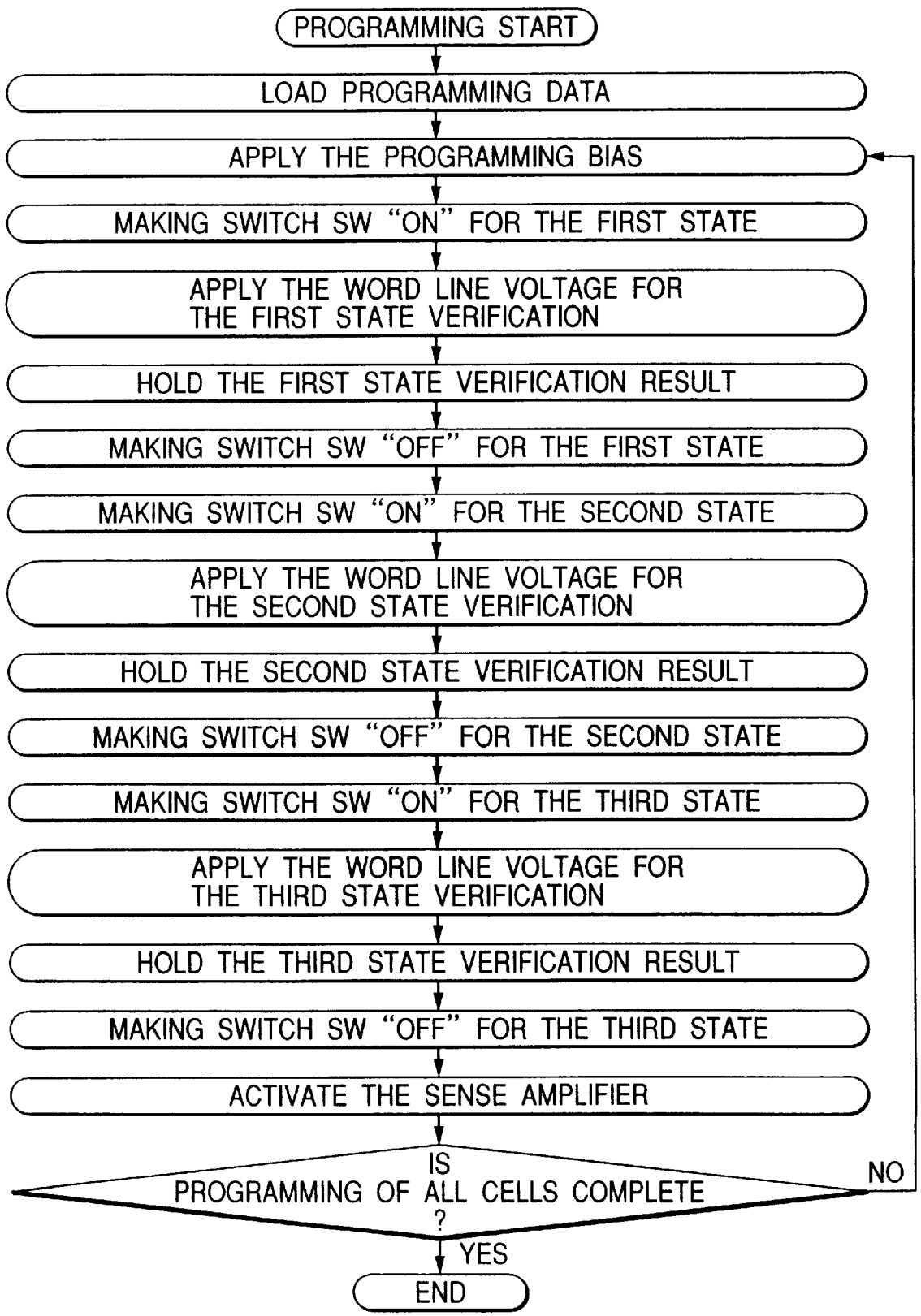
FIG. 6 is a flowchart for explaining the programming and verification scheme implemented in the schematic of preferred embodiments of the invention shown in FIG. 5.

Using the flowchart shown in FIG. 6, the process of programming and verification to be performed by the circuitry configured as shown in FIG. 5 will be explained below. The memory cells 1 are capable of storing data of two bits per cell and can be placed in the states of threshold voltages as shown in FIG. 2.

With the input of a programming instruction, programming data transferred from outside is loaded into the data latch circuit 6. After the application of programming bias to the memory cells 1 into which the data need to be programmed, verification of the programming is performed.

To verify whether the programming is complete, initially, the switch SW becomes ON to check memory cells whose intended programming level is the first state of threshold voltage. Thereby, the sense amplifier 9 is activated to check the above memory cells that must be programmed in the first threshold voltage state. Then, the word lines WL to these memory cells are set at a first-state verify level of voltage so that the sense amplifier 9 will hold the first-state verify results for the memory cells that must be programmed in the first threshold voltage state.

After the switch SW closed to check the memory cells for programming in the first threshold voltage state becomes OFF, the switch SW becomes ON to check memory cells that must be programmed in the second threshold voltage state and the sense amplifier 9 is activated to check these memory cells. Then, the word lines WL to these memory cells is set at a second-state verify level of voltage so that the sense amplifier 9 will hold the second-state verify results for the memory cells that must be programmed in the second threshold voltage state.

After the switch SW closed to check the memory cells for programming in the second threshold voltage state becomes OFF, the switch SW becomes ON to check memory cells that must be programmed in the third threshold voltage state and the sense amplifier 9 is activated to check these memory cells. Then, the word lines WL to these memory cells are set at a third-state verify level of voltage so that the sense amplifier 9 will hold the third-state verify results for the memory cells that must be programmed in the third threshold voltage state.

Then, the sense amplifier 9 is amplified for all states and judges whether programming is complete for all states of programming at a time. In this way, by setting timing to verify whether specific data has been programmed in each threshold voltage state of the memory cells, depending on the programming data, verification of the programming in the three states can be performed simultaneously.

Table 1 below tabulates the ON and OFF states of the switch SW, depending on each state's verify voltage level at which selected word lines WL are set.

TABLE 1

| Programming data | First-state verify level | Second-state verify level | Third-state verify level |
| --- | --- | --- | --- |
| Zero state | OFF | OFF | OFF |
| First state | ON | OFF | OFF |
| Second state | ON/OFF | ON | OFF |
| Third state | ON/OFF | ON/OFF | ON |

In the zero threshold voltage state of programming data, that is, the state in which no programming is performed, the switch SW remains OFF and the sense amplifier 9 necessarily makes the judgment of the programming complete state. In the first threshold voltage state of programming data, the switch SW is ON only when the word line WL voltage is the first-state verify level and OFF when the word line voltage is the second-state or third-state verify level.

Thus, the sense amplifier 9 eventually holds the first-state verify results. In the second threshold voltage state of programming data, the switch SW may be either ON or OFF when the word line voltage is the first-state verify level, but must be ON when the word line voltage is the second-state verify level and OFF when the word line voltage is the third-state verify level. Eventually, the sense amplifier 9 holds the second-state verify results. In the third threshold voltage state of programming data, the switch SW may be either ON of OFF when the word line is the first-state or second-state verify level, but must be ON when the word line voltage is the third-state verify level. Eventually, the sense amplifier 9 holds the third-state verify results.

Embodiment 1

Using FIGS. 7, 8, and 9, a preferred Embodiment 1 of the present invention will be explained below.

Figure 7:
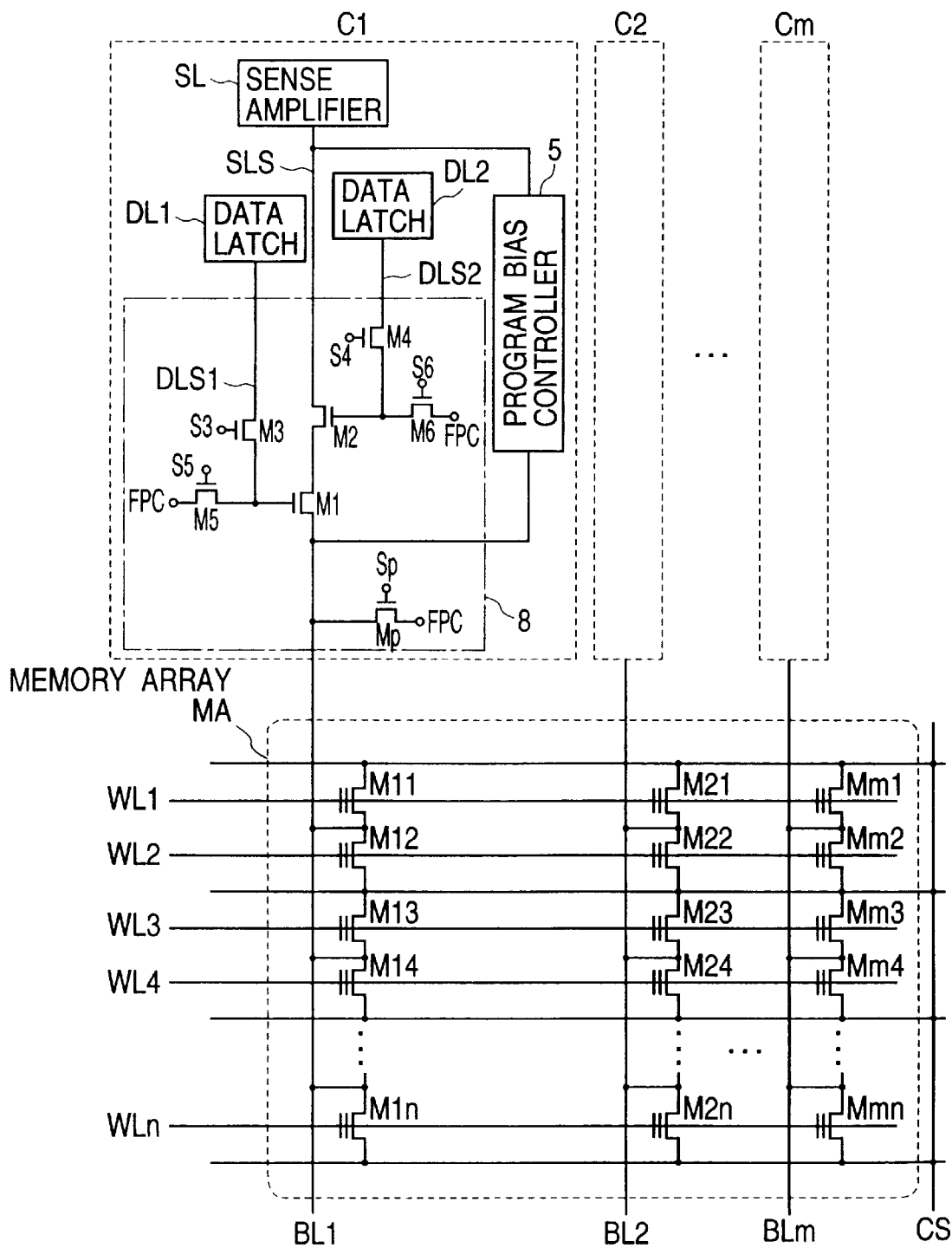
FIG. 7 is a circuit structure diagram for explaining a preferred Embodiment 1 of the present invention.

FIG. 7 shows a concrete circuit structure of Embodiment 1. The memory array MA shown in FIG. 7 is, for example, an equivalent to the flash EEPROM described in Japanese Patent Prepublication No. Hei 3-219496. Memory cells M11 through Mmn (corresponding to the memory cells in FIGS. 1, 4, and 5) are arrayed in a matrix. The drain terminal of each memory cell M is connected to any of the bit lines BL1 through BLm, the source terminal thereof is connected to a common source line CS, and the control gate thereof is connected to any of the word lines WL1 through WLn. All the memory cells M are capable of storing information of two bits per cell (N=2, K=4).

Figure 8:
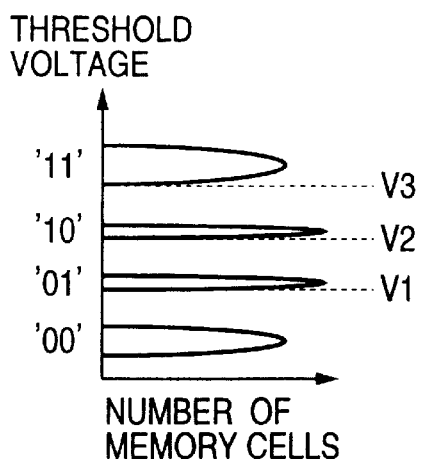
FIG. 8 is a diagram showing an example of distribution of threshold voltages of memory cells in the preferred embodiments of the invention.
Figure 9:
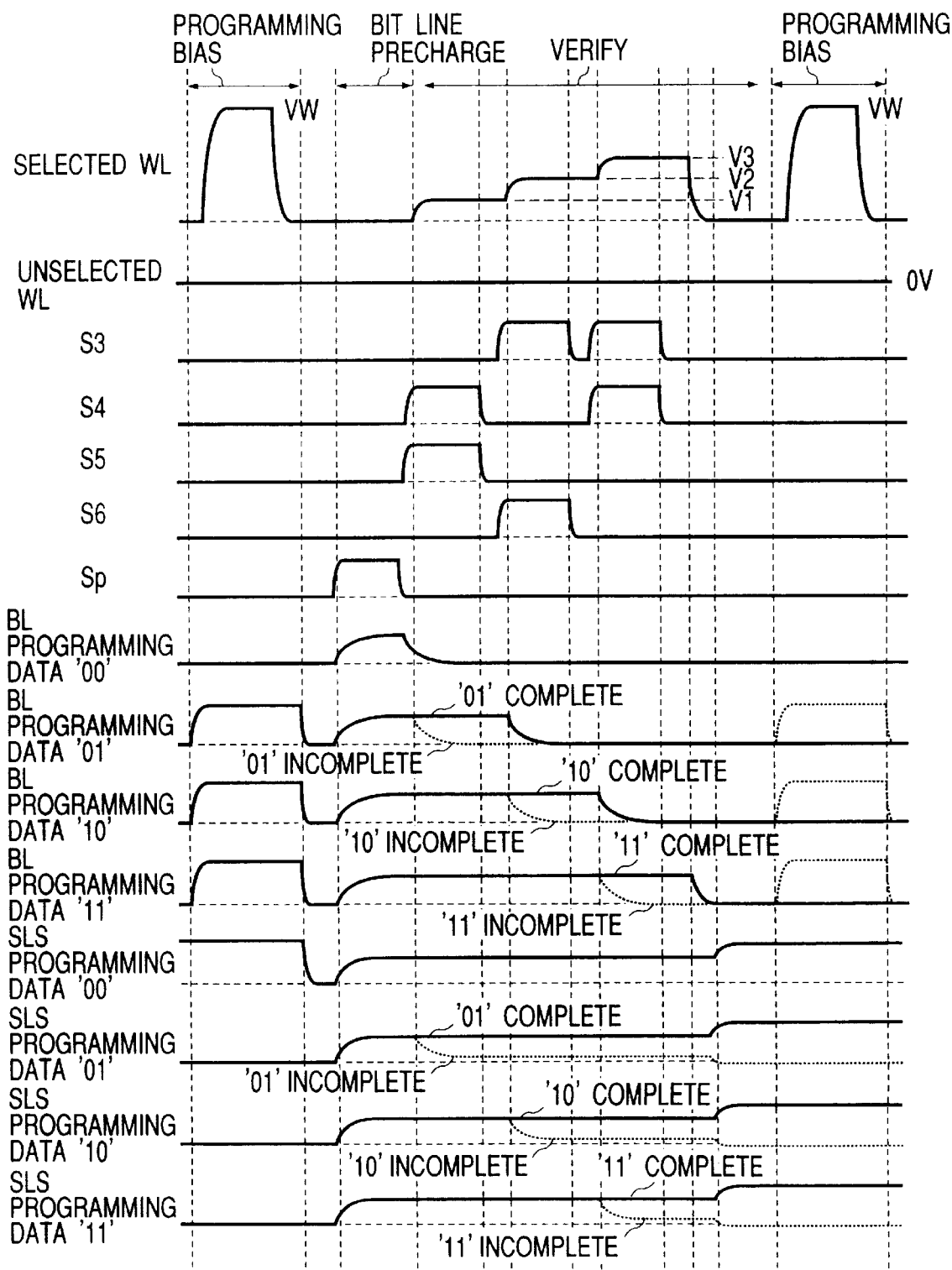
FIG. 9 is a timing chart for explaining programming and verification to be performed in Embodiment 1.

Four states of threshold voltages in which the memory cells M can be placed are shown in FIG. 8. Here, the data erased state is level '00' and programming into the memory cells is performed by increasing the threshold voltage to '01,' '10,' and '11' that are three threshold voltages other than that of erasure level; K−1=3. Programming into the memory cells M is accomplished by injecting electrons into the floating gates thereof by means of hot electron injection (hereinafter referred to as "HE injection"). The voltage requirements (as an example) of programming bias to cause HE injection are tabulated in Table 2.

TABLE 2

| Node | Voltage |
| --- | --- |
| Word line voltage | 12 V |
| Drain voltage | 5 V |
| Source line voltage | 0 V |
| Well voltage | 0 V |

Using the timing chart shown in FIG. 9 together with FIGS. 7 and 8, programming and verification to be performed in Embodiment 1 will be explained below.

In FIG. 7, Metal Oxide Transistors (MOS) M1 through M6 and Mp constitute the timing selecting circuit 8 shown in FIGS. 4 and 5, data latch circuits DLS1 and DLS2 correspond to the data latch circuit 6 shown in FIGS. 1, 4, and 5, and a sense amplifier SL corresponds to the sense amplifier 9 shown in FIGS. 4 and 5. These circuits and the program bias controller 5 for supplying programming bias constitute each of the programming/verification controllers C1 through Cm.

With the input of a programming instruction, programming data is transferred to the circuitry shown in FIG. 7 from outside and the upper bit of 2-bit data is stored into the data latch circuit DL1 and the lower bit of the data is stored into the data latch circuit DL2. The states of nodes DLS1 and DLS2 after 2-bit data is stored are tabulated in Table 3.

TABLE 3

|  | DL1 | DL2 |
| --- | --- | --- |
| '00' | 0 V | 0 V |
| '01' | 0 V | VDL |
| '10' | VDL | 0 V |
| '11' | VDL | VDL |

The data latch circuits DLS1 and DLS2 are, for example, latch circuits and VDL represents the power supply voltage of the latch circuits.

To program data of bits '01,' '10,' and '11' into the memory cells, programming bias is then applied in accordance with the voltage requirements shown in Table 2 above.

After the application of programming bias, programming verify action is performed. First, a timing signal Sp is supplied to the MOS transistor Mp and a power supply voltage EPC (for example, 1 V) is applied to bit line BL. All bit lines BL are precharged at 1 V and then put floating.

Then, timing signals S4 and S5 rise, thereby respectively turning the MOS transistors M4 and M5 ON, selectively turning the MOS transistors M1 and M2 ON only for the programming data with the lower bit of '1,' that is, bits '01' and '11,' and making the connection between bit line BL and sense amplifier SL. The rise of these timing signals S4 and S5 sets verify timing to start a phase of verifying data level '01' as shown in FIG. 9.

After bit line BL is connected to the sense amplifier SL, selected wordlines WL for target memory cells are set at a verify voltage V1 for '01" level (for example, 2 V) and verify action for '01' is performed. The memory cells where the threshold voltage is lower than the verify voltage V1, that is, '01' level programming is incomplete become alive and the bit line is discharged through the memory cells to the common source line CS. On the other hand, the memory cells where the threshold voltage is equal to or higher than the V1, that is, '01' level programming is complete are dead and the bit line remains at 1 V.

In consequence of this verify action, in the group of the memory cells into which bits '01' or '11' must be programmed, for a memory cell where '01' level programming is complete, the node SLS at which its bit line terminates remains in the high-level (hereinafter, symbolized into "HI" ) state, whereas, for a memory cell where the '01' level is no t attained, the node SLS at which its bit line terminates is placed in the low level (hereinafter, symbolized into "LO") state. Meanwhile, as concerns the bits '00' and '10' of programming data, the MOS transistor M2 is turned OFF and the node SLS is placed in the HI state, regardless of the threshold voltage of the memory cells. For example, for a memory cell placed at erasure level '00,' its bit line is discharged due to the verify action for '01', but the node SLS remains in the HI state because the bit line BL is not connected to the sense amplifier SL.

After the timing signals S4 and S5 fall, timing signals S3 and S6 rise, thereby turning the MOS transistors M3 and M6 ON, selectively turning the MOS transistors M1 and M2 ON only for the programming data with the upper bit of '1,' that is, bits '10' and '11,' and making the connection between bit line BL and sense amplifier SL. The rise of these timing signals S3 and S6 sets verify timing to start a phase of verifying data level '10' as shown in FIG. 9.

After bit line BL is connected to the sense amplifier SL, the word line WL voltage is set at a verify voltage V2 for '10' level (for example, 3 V) and verify action for '10' is performed. In consequence of this verify action, the memory cells where the threshold voltage is lower than the verify voltage V2 become alive and the bit line is discharged through the memory cells to the common source line CS. On the other hand, the memory cells where the threshold voltage is equal to or higher than the V2, that is, '10' level programming is complete are dead and the bit line remains charged. In consequence, in the group of the memory cells into which bits '10' or '11' must be programmed, for a memory cell where '10' level programming is complete, the node SLS at which its bit line terminates remains in the HI state, whereas, for a memory cell where the '10' level is not attained, the node SLS at which its bit line terminates is placed in the LO state. Meanwhile, as concerns the memory cells into which bits '00' or '01' must be programmed, the MOS transistor M1 is turned OFF and the bit line BL is not connected to the sense amplifier SL, and therefore the '01' verify results read out onto the node SLS in the preceding verify action are not destroyed.

After the timing signals S3 and S6 fall, timing signals S3 and S4 rise, thereby turning the transistors M3 and M4 ON, selectively turning the MOS transistors M1 and M2 ON only for the bits '11' of programming data, and making the connection between bit line BL and sense amplifier SL. The rise of these timing signals S3 and S4 sets verify timing to start a phase of verifying data level '11' as shown in FIG. 9.

After bit line BL is connected to the sense amplifier SL, the selected word line WL voltage is set at a verify voltage V3 for '11' level (for example, 4 V) and verify action for '11' is performed. In consequence of this verify action, the memory cells where the threshold voltage is lower than the verify voltage V3 become alive and the bit line is discharged through the memory cells to the common source line CS. On the other hand, the memory cells where the threshold voltage is equal to or higher than the V3, that is, '11' level programming is complete are dead and the bit line remains charged. In consequence, in the group of the memory cells into which bits '11' must be programmed, for a memory cell where programming of bits '11' is complete, the node SLS at which its bit line terminates remains in the HI state, whereas, for a memory cell where the '11' level is not attained, the node SLS at which its bit line terminates is placed in the LO state. Meanwhile, as concerns the memory cells into which bits '00, '01,' or '10' must be programmed, at least one of the MOS transistors M1 and M2 is turned OFF and the bit line BL is not connected to the sense amplifier SL. Therefore, the '01' and '10' verify results retained on the node SLS as the result of the verify actions performed before the '11' verify action are not destroyed.

For the memory cells into which bits '00' must be programmed, the bit line is discharged during the '01,' '10,' and '11' verify actions, while the bit line BL is not connected to the sense amplifier SL, and consequently the sense amplifier judges that programming of the bits is complete.

Figure 10:
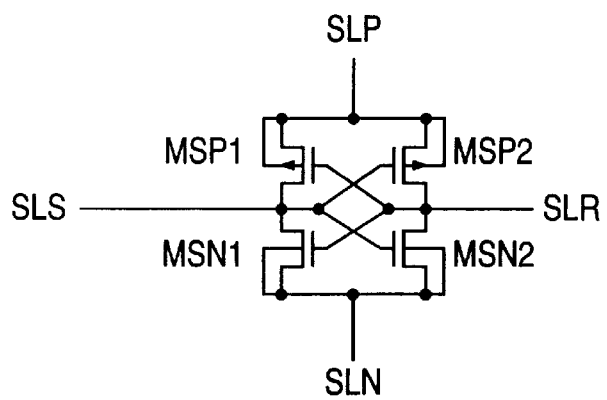
FIG. 10 is a circuit diagram for explaining an example of a sense amplifier used in the preferred embodiments of the invention.

As a sense amplifier SL to retain verify results, a cross latch circuit shown in FIG. 10 is used in Embodiment 1. The verify result signals are low voltage under 1 V and this voltage is amplified to fix the verify results retained on the node SLS. The sense amplifier SL consists of PMOS transistors MSP1 and MSP2 and NMOS transistors MSN1 and MSN2. The voltages of power supplies SLP and SLN are set nearly a half of the power supply VCC to the memory device before amplification, and amplification, when occurring, sets the power supply SLP at VCC and the power supply SLN at 0 V. Thereby, the voltage of the node SLS is amplified to about 3 V and the verify results are fixed thereon. To a node SLR, voltage of opposite polarity to the voltage supplied to the node SLS is output.

After the '11' verify action, the sense amplifier SL operates to amplify the supply voltage and executes sensing the memory data. Then, if the nodes SLS for all programming bit lines retain the HI states as the verify results, the sense amplifier SL judges the programming complete. However, if the LO state of at least one verify result exists on any of the nodes SLS, this indicates that the memory cell that placed the node SLS in the LO state is insufficiently programmed. Then, programming action that follows causes the program bias controller 5 to selectively apply programming bias to this memory cell. At this time, the program bias controller 5 does not apply programming bias to the memory cells for which the completion of programming has been verified.

Upon the completion of programming into all memory cells to be programmed, for any memory cell, a node SLR shown in FIG. 10 that has the output of the voltage of opposite polarity to the voltage supplied to the node SLS is placed in the LO state. When all LO states are detected on the SLR node, in the flowchart shown in FIG. 6, the process goes from "Is programming of all cells complete?" to YES and the execution of the programming instruction terminates.

Figure 11:
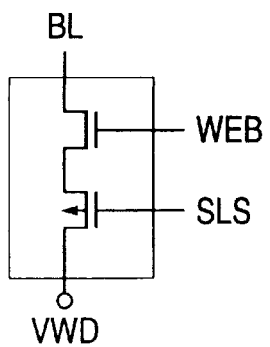
FIG. 11 is a circuit diagram for explaining an example of a program bias controller used in the preferred embodiments of the invention.

FIG. 11 shows an example of the program bias controller 5 in FIG. 7. If any LO state is sensed on the node SLS, the PMOS transistor of the program bias controller 5 is turned on and a programming control signal WEB rises, thereby turning the NMOS transistor ON and applying programming bias VWB to the bit line BL. If all HI states are sensed on the node SLS, on the other hand, the PMOS transistor is OFF even with the rise of the programming control signal WEB, and consequently programming bias is not applied to the bit line BL.

As explained above, memory cells to be programmed on a threshold voltage level are selected, depending on the programming data retrieved in accordance with the timing set for the level and the word line voltage which increases stepwise is applied to these memory cells in accordance with the corresponding timing. To verify whether programming is complete in each of the threshold voltage states of the memory cells, discrete timing can be set, depending on the programming data, and thus the multilevel verify actions can be performed serially before the next programming action.

Because static steady current does not flow across the memory cells in the scheme of Embodiment 1, simultaneous programming verification for a great number of memory cells can be performed, thus making it possible to increase the programming throughput.

Figure 12:
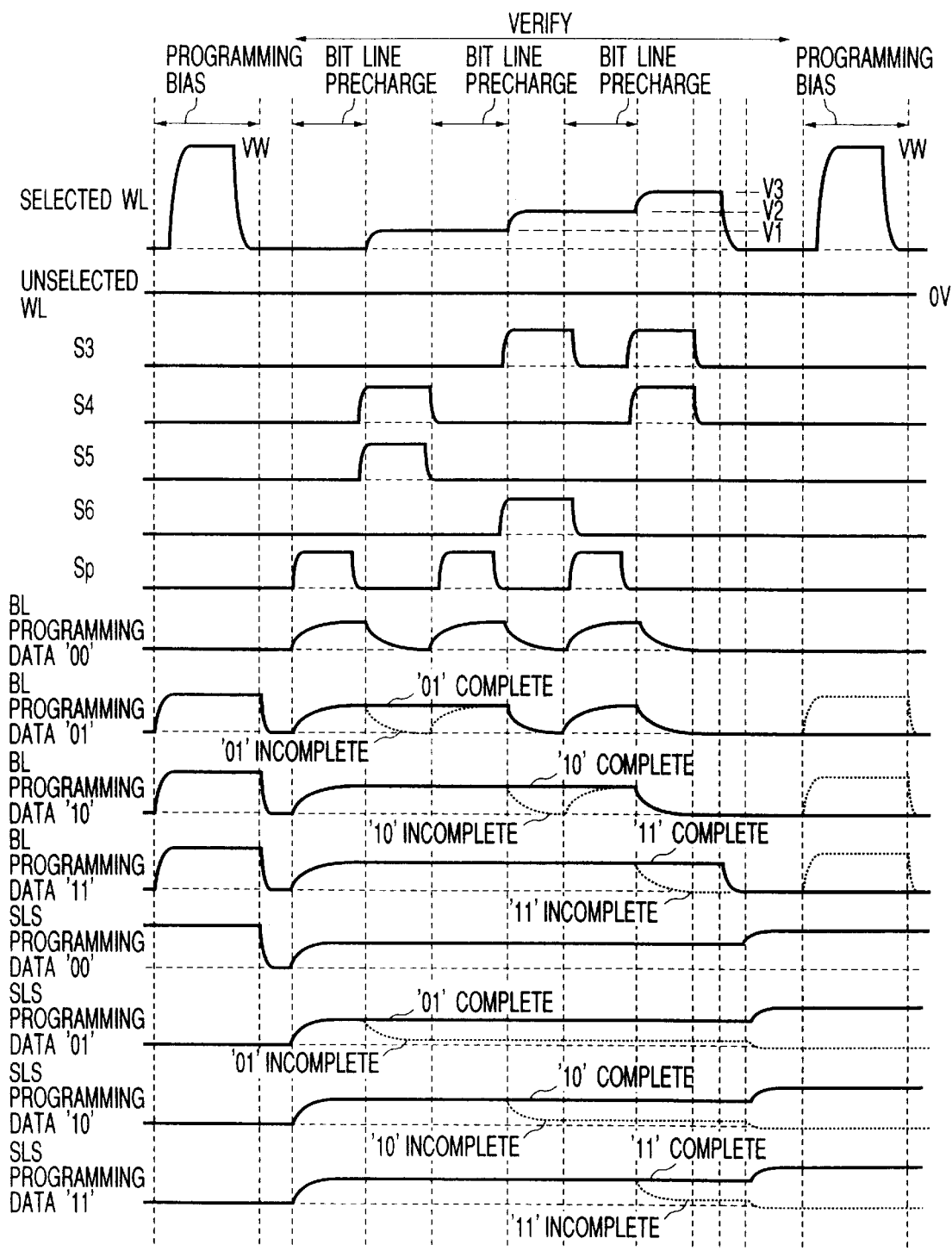
FIG. 12 is a timing chart for explaining another manner of programming and verification performed in Embodiment 1.

In Embodiment 1, precharging the bit lines is performed only at the start of verification and then the verify actions for three threshold voltage states of memory cells are serially performed while the word line voltage increases stepwise for the states. Alternatively, as shown in FIG. 12, precharging the bit lines may be performed, immediately before every verify action for each state of threshold voltage. This method can maintain the bit lines at a desired level with less reduction during the verify action for each state of threshold voltage, producing an effect that higher level charge can be used for verification, though the time required for verification increases.

Embodiment 2

Using FIGS. 13 through 16, a preferred Embodiment 2 of the present invention will be explained below.

For multilevel memory cells, in general, the greater the threshold voltage difference between the erasure level ('00' level) and the highest '11' level shown in FIG. 8, the more time will be required for bias application, which may decrease the programming rate. In addition, because a greater electric field is exerted on tunnel oxide between the substrate and the floating gates of the memory cells, the charge retentivity of the memory cells may degrade.

To reduce the threshold voltage difference between the erasure level and the '11' level, it is reasonable to narrow the width of the distribution bands of intermediate '01' and '10' levels. For this purpose, it is desirable to control the threshold voltage with high precision by setting small threshold voltage change between programming pulses. On the other hand, the '11' level is only required that it is higher than a predetermined threshold voltage without strict restriction for its upper limit and therefore rough control of the threshold voltage is possible.

An advisable way in view hereof is carrying out '11' level programming and verification before '01' and '10' level programming and reducing the time per verify action for '01' and '10' level programming that must be verified many times, so that high-speed programming can be achieved.

Figure 13:
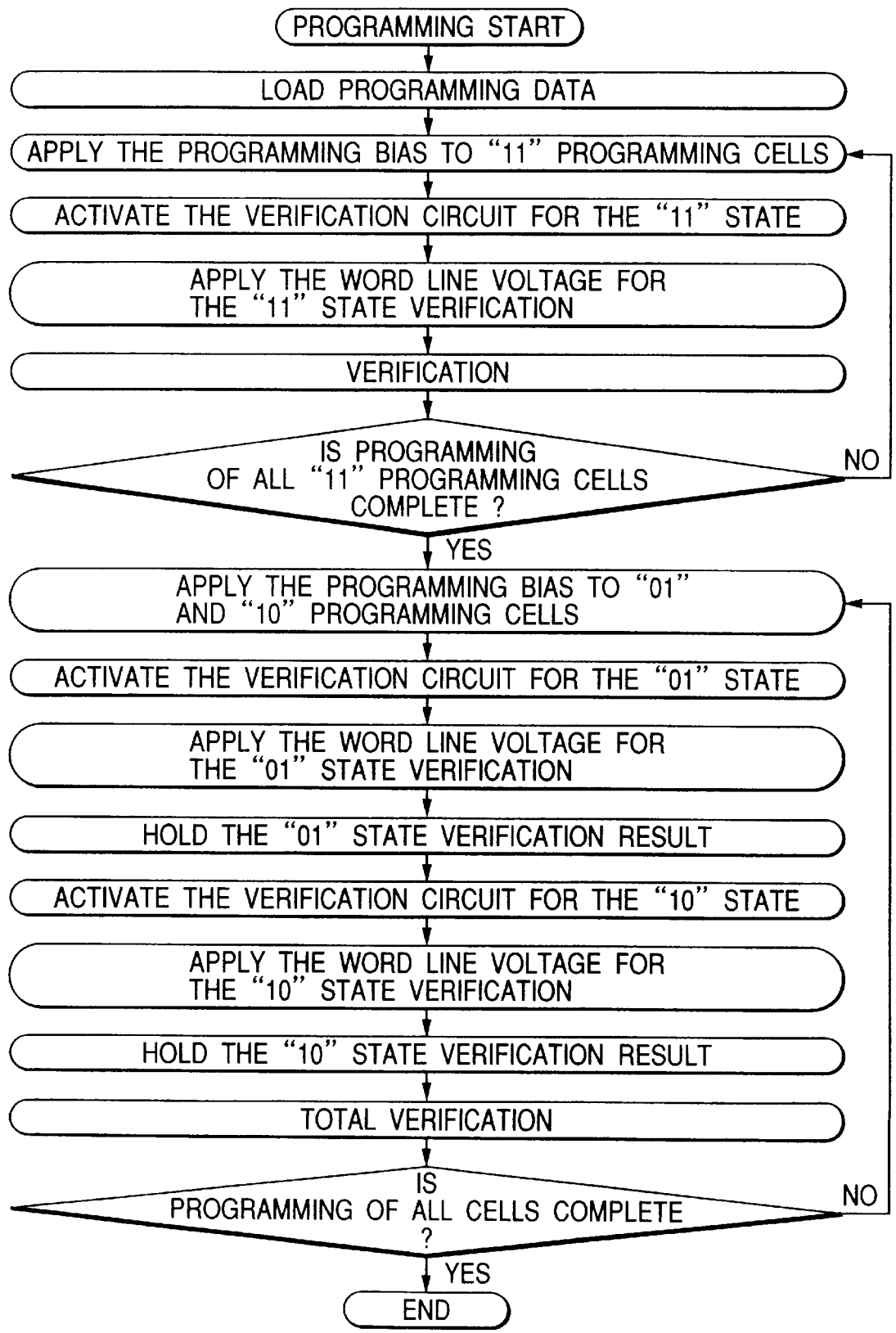
FIG. 13 is a flowchart for explaining a preferred Embodiment 2 of the present invention.

FIG. 13 shows a flowchart of programming and verification process of Embodiment 2, wherein '11' level programming is to be completed in the initial phase. In Embodiment 2, '11' level programming bias application action and verify action are repeated until '11' level programming has been completed. After the completion of '11' level programming, '01' and '10' programming and verify actions are performed, according to the method described in the section of Embodiment 1, thereby accomplishing multilevel programming. Using the circuit structure diagram of FIG. 7 and the timing charts shown in FIGS. 14 and 15, detailed operation of Embodiment 2 will be explained below.

With the input of a programming instruction, programming data is transferred to the circuitry shown in FIG. 7 from outside and the upper bit of 2-bit data is stored into the data latch circuit DL1 and the lower bit of the data is stored into the data latch circuit DL2. The states of the nodes DLS1 and DLS2 after 2-bit data is stored are as given in Table 3.

Figure 14:
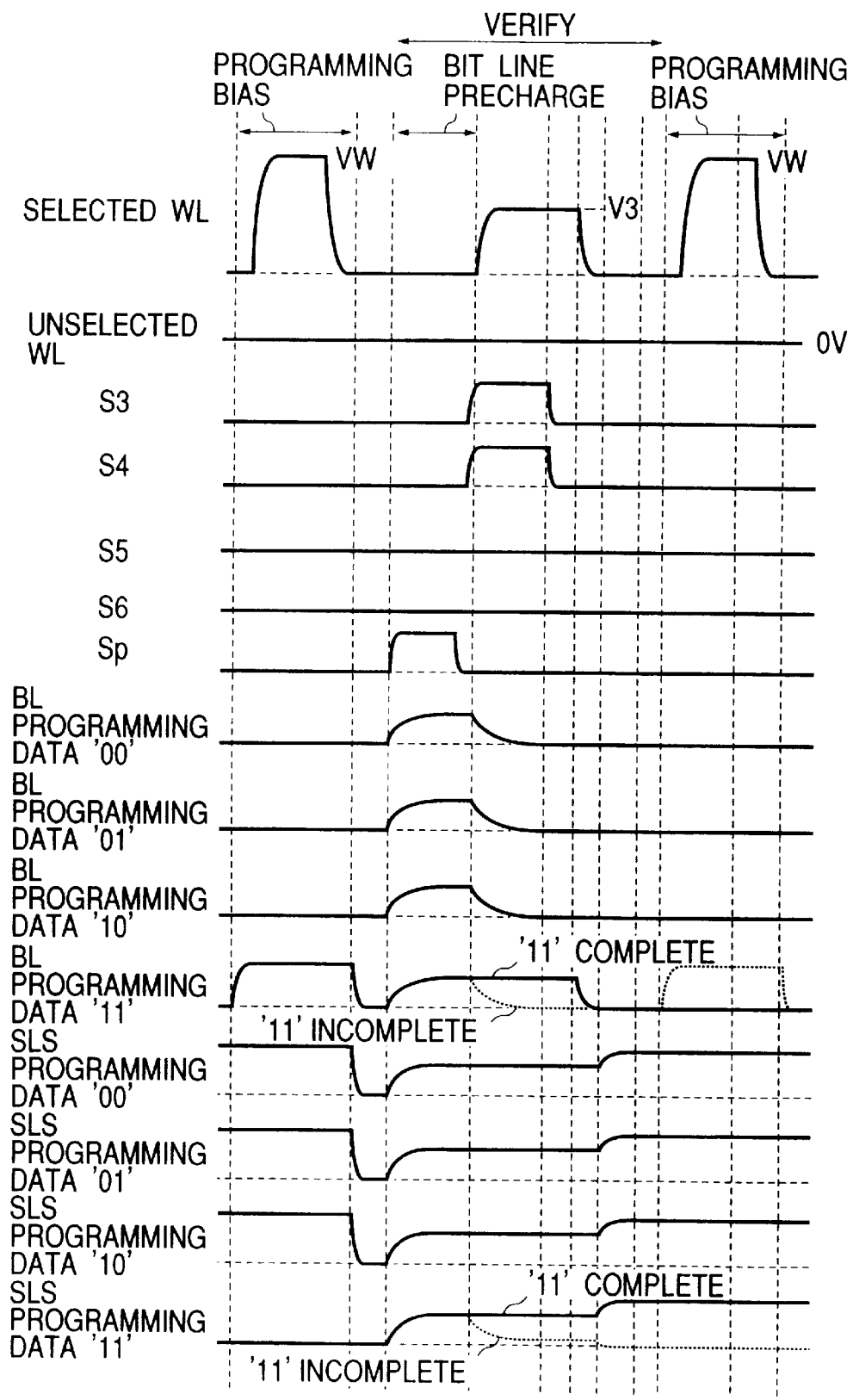
FIG. 14 is a first timing chart for explaining programming and verification to be performed in Embodiment 2.

Then, '11' level programming is initially performed. FIG. 14 is a timing chart explaining the '11' level programming. After programming bias is applied to memory cells into which '11' level programming data must be programmed, action of verifying the '11' level programming is performed. Initially, all bit lines BL are precharged at, for example, 1 V and then put floating. Timing signals S3 and S4 rise, thereby selectively turning the MOS transistors M1 and M2 ON only for the programming data with both upper and lower bits being '1,' that is, bits '11' and making the connection between bit line BL and sense amplifier SL.

Then, word lines WL for target memory cells are set at verify voltage V3 for '11' level (for example, 4 V) and '11' verify action is performed. The memory cells where the threshold voltage is lower than the verify voltage V3, that is, '11' level programming is incomplete become alive and the bit line is discharged through the memory cells to the common source line CS. On the other hand, the memory cells where the threshold voltage is equal to or higher than the V3, that is, '11' level programming is complete are dead and the bit line remains at 1 V. In consequence, in the group of the memory cells into which bits '11' must be programmed, for a memory cell where '11' level programming is complete, the node SLS at which its bit line terminates remains in the HI state, whereas, for a memory cell where the '11' level is not attained, the node SLS at which its bit line terminates is placed in the LO state.

Meanwhile, as concerns the bits '00,' '01,' and '10' of programming data, at least one of the MOS transistors M1 and M2 is turned OFF and the node SLS is placed in the HI state, regardless of the threshold voltage of the memory cells.

When the results of the verify action of '11' programming have placed all nodes SLS in the HI state, the '11' programming is then complete. However, if the LO state of at least one verify result exists on any of the nodes SLS, this indicates that the memory cell that placed the node SLS in the LO state is insufficiently programmed. Then, programming action that follows selectively applies programming bias to this memory cell. At this time, programming bias is not applied to the memory cells where programming is complete. Programming bias application action and verify action are repeated until the HI states of all verify results have been detected on all nodes SLS, thus completing the '11' level programming.

In this connection, because rough programming of '11' level is permitted as mentioned above, programming can be achieved by repeating programming bias application action and verify action by a small number of times.

Figure 15:
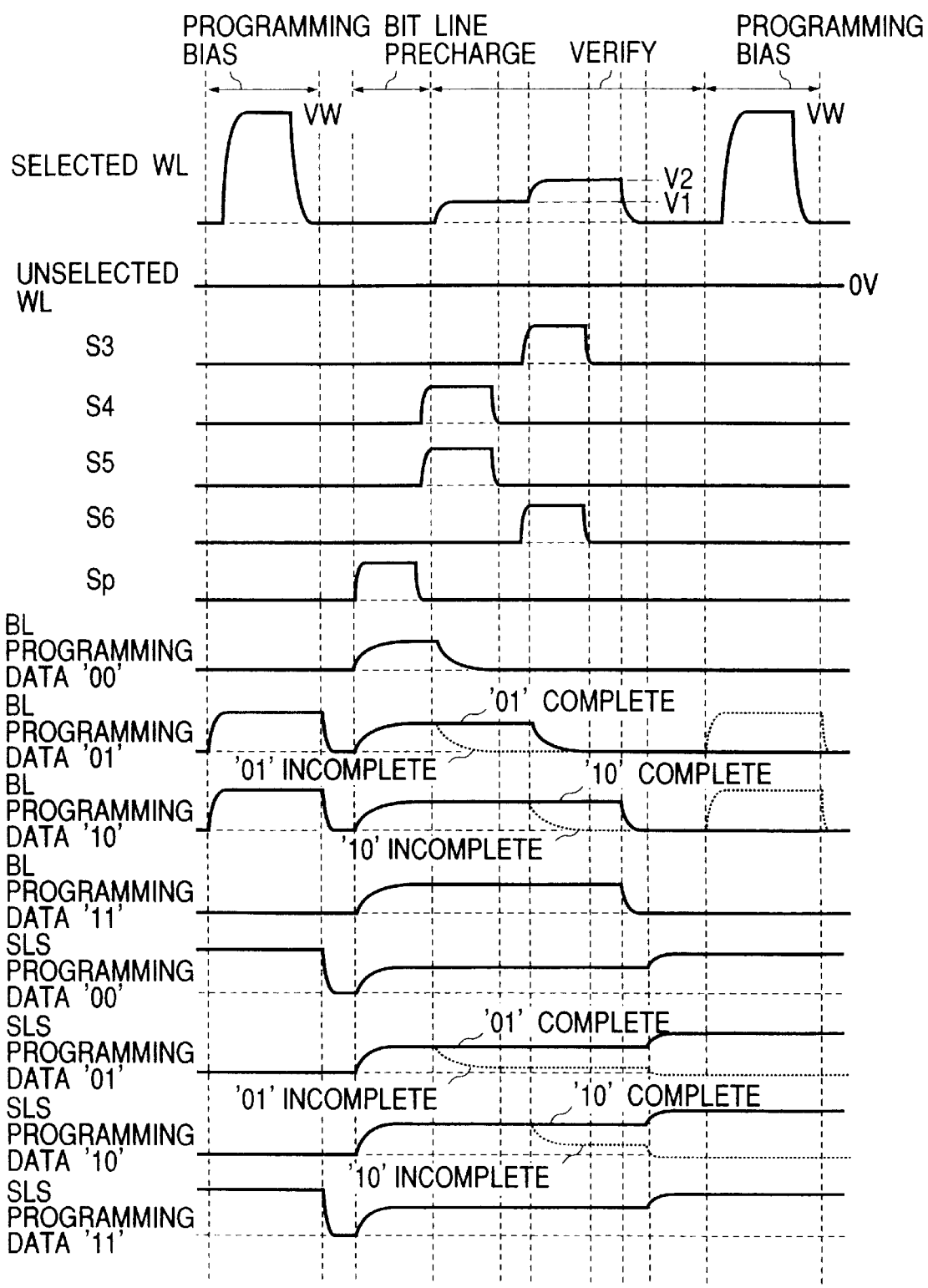
FIG. 15 is a first timing chart for explaining programming and verification to be performed in Embodiment 2.

After the completion of '11' level programming, '01' and '10' level programming process is carried out. FIG. 15 is a timing chart explaining the '01' and '10' level programming procedure. After the application of programming bias only to the memory cells into which '01' or '10' level data must be programmed, the operation of verifying the '01' and '10' level programming is carried out.

Initially, all bit lines BL are precharged at, for example, 1 V and then put floating. Timing signals S4 and S5 rise, thereby selectively turning the MOS transistors M1 and M2 ON only for the bits '01' and '11' of programming data and making the connection between bit line and sense amplifier SL. Then, the voltage on the word lines WL for target memory cells is set at verify voltage V1 for '01' level (for example, 2 V) and '01' verify action is performed. In consequence of this verify action, the memory cells where the threshold voltage is lower than the verify voltage V1 become alive and the bit line is discharged through the memory cells to the common source line CS. On the other hand, the memory cells where the threshold voltage is equal to or higher than the V1, that is, '01' level programming is complete are dead and the bit line remains charged. In consequence, for the programming data of level of bits '01', if '01' programming is complete, the node SLS at which its bit line terminates is placed in the HI state; if '01' programming is incomplete, the node SLS at which its bit line terminates is placed in the LO state. For the programming data of level of bits '11', the threshold voltage has already been set for '11' level by the preceding '11' programming action and the memory cells programmed of bits '11' are dead with the WL voltage of V1. Thus, the bit line is not discharged and the node SLS is certainly in the HI state.

After the timing signals S4 and S5 fall, timing signals S3 and S6 rise, thereby selectively turning the MOS transistors M1 and M2 ON only for the bits '10' and '11' of programming data and making the connection between bit line BL and sense amplifier SL. Then, the word line WL voltage is set at a verify voltage V2 for '10' level (for example, 3 V) and '10' verify action is performed. In consequence of this verify action, the memory cells where the threshold voltage is lower than the verify voltage level V2 become alive and the bit line is discharged through the memory cells to the common source line CS. On the other hand, the memory cells where the threshold voltage is equal to or higher than the V2 are dead and the bit line remains charged. In consequence, for the programming data of level of bits '10', if '10' programming is complete, the node SLS at which its bit line terminates is placed in the HI state; if '10' programming is incomplete, the node SLS at which its bit line terminates is placed in the LO state. For the programming data of level of bits '11', the threshold voltage has already been set for '11' level by the preceding '11' programming action and the memory cells programmed of bits '11' are dead with the WL voltage of V2. Thus, the bits line is not discharged and the node SLS is in the HI state.

Thereafter, the power supply from the sense amplifier SL is amplified and action of sensing the memory data is performed. As the result of the sensing, if the nodes SLS for all programming bits retain the HI states as the verify results, the sense amplifier SL judges the programming complete. However, if the LO state of at least one verify result of programming bits exists on any of the nodes SLS, this indicates that the memory cell that placed the node SLS in the LO state is insufficiently programmed, Then, programming action that follows selectively applies programming bias to this memory cell. At this time, programming bias is not applied to the memory cells judged programming complete.

As explained above, by completing the programming of '11' level with the highest threshold voltage before '01' and '10' programming and subsequently executing '01' and '10' programming that must be verified more times, Embodiment 2 can reduce the time required to verify programming per action of verifying '01' and '10' programming and achieve faster programming.

Figure 16:
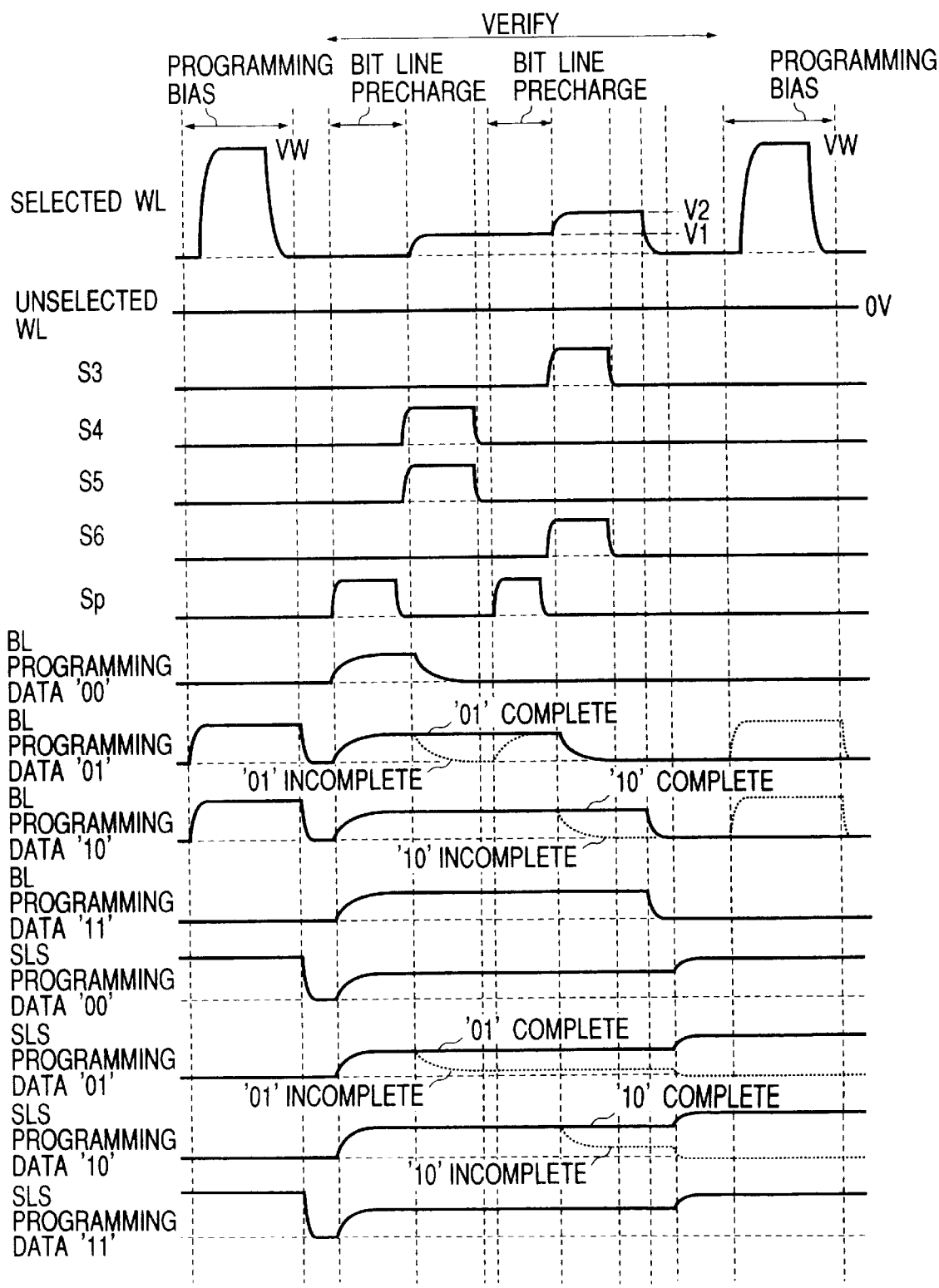
FIG. 16 is a timing chart for explaining another manner of programming and verification to be performed in Embodiment 2.

The above-mentioned method of precharging the bit lines immediately before every verify action for each state of threshold voltage may also apply to Embodiment 2, as shown in FIG. 16. This method can maintain the bit lines at a desired level with less reduction during the verify action for each state of threshold voltage, producing an effect that higher level charge can be used for verification, though the time required for verification increases.

Embodiment 3

Figure 17:
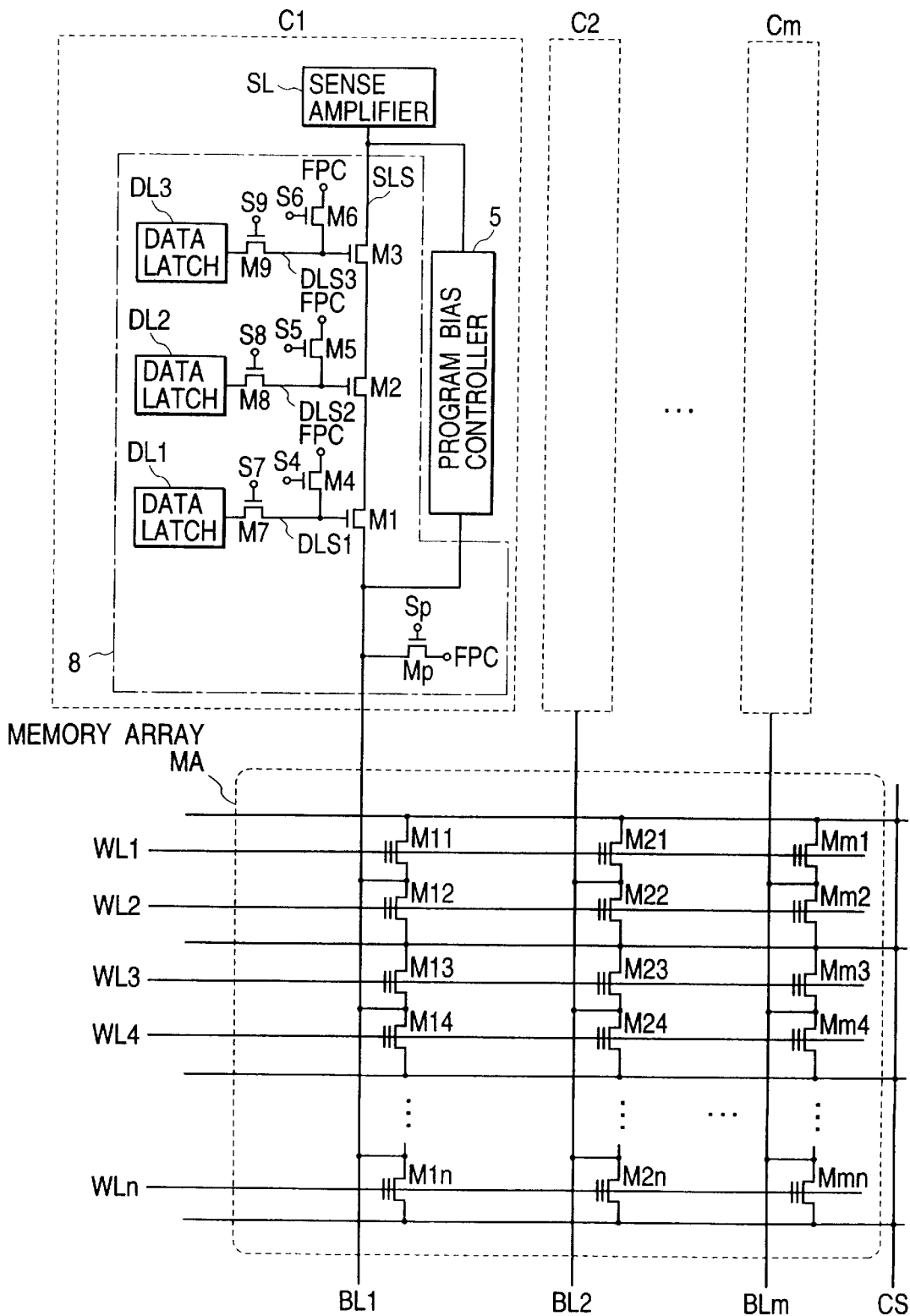
FIG. 17 is a circuit structure diagram for explaining a preferred Embodiment 3 of the present invention.

Using FIGS. 17, 18, and 19, a preferred Embodiment 3 of the present invention will be explained below. FIG. 17 shows a circuit structure enabling the simultaneous verification of programming of 3-bit data into memory cells that are capable of storing data of three bits per cell, Here, M11 through Mm represent the memory cells capable of storing data of three bits per cell and a memory array MA has the same structure as the structure of the memory array MA of Embodiment 1 shown in FIG. 7.

Figure 18:
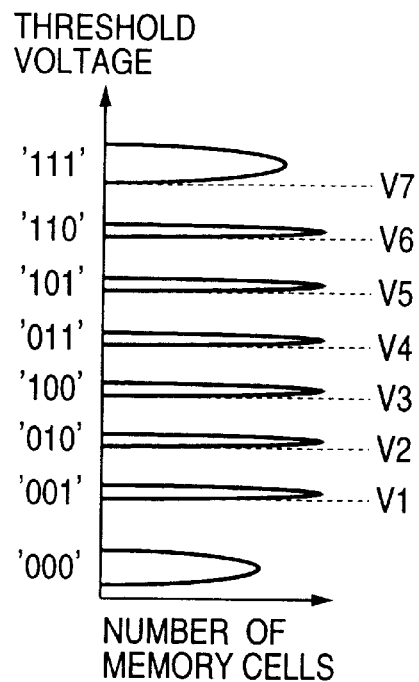
FIG. 18 is a diagram for explaining another example of distribution of threshold voltages of memory cells.
Figure 19:
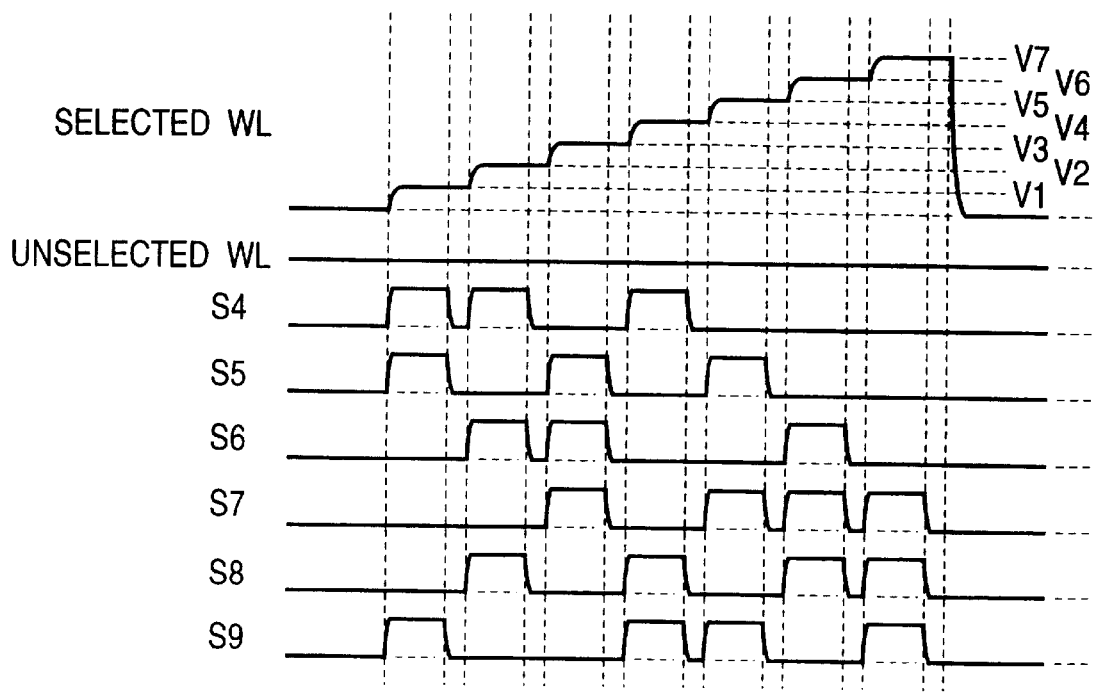
FIG. 19 is a timing chart for explaining verify actions in Embodiment 3.

FIG. 18 shows an example of distribution of threshold voltages associated with all patterns of 3-bit data to be programmed into the above memory cells. In FIG. 18, the erasure state is level '000' and programming into the memory cells is performed by increasing the threshold voltage to '001,' '010,' . . . , '111.' Programming into the memory cells is accomplished by injecting electrons into the floating gates thereof by means of hot electron HE injection and the voltage requirements (as an example) of programming bias to cause HE injection are as given in Table 2 in Embodiment 1.

In the following, programming/verification operation will be discussed, based on the distribution of the threshold voltages shown in FIG. 18. However, this operation can be performed even with the threshold voltages set in different order from the order shown in FIG. 18, for example, order in which the threshold voltage will become lower as the level goes higher.

With the input of a programming instruction, programming data is transferred to the circuitry shown in FIG. 17 from outside and 3-bit data is set in data latch circuits, DL1, DL2, and DL3. The states of the nodes DLS1, DLS2, and DLS3 of the data latch circuits after programming data is set are tabulated in Table 4.

TABLE 4

|       | DLS1 | DLS2 | DLS3 |
|-------|------|------|------|
| '000' | 0 V  | 0 V  | 0 V  |
| '001' | 0 V  | 0 V  | VDL  |
| '010' | 0 V  | VDL  | 0 V  |
| '100' | VDL  | 0 V  | 0 V  |
| '011' | 0 V  | VDL  | VDL  |
| '101' | VDL  | 0 V  | VDL  |
| '110' | VDL  | VDL  | 0 V  |
| '111' | VDL  | VDL  | VDL  |

Based on the set programming data, programming into the memory cells that need to be programmed is performed, and verification is executed as follows.

Initially, all bit lines BL0 through BLm are precharged at, for example, 1 V and then put floating. Then, timing signals S4, S5, and S9 rise, thereby turning the MOS transistors M1, M2, and M3 ON only for the programming data with the least significant bit being '1,' that is, bits '001,' '011,' '101,' and '111' and making the connection between bit line BL and sense amplifier SL. Next, word lines WL for target memory cells are turned on and set at a verify voltage V1 for '001.' At this time, the memory cells where the threshold voltage is lower than the verify voltage V1 become alive and the bit line is discharged to the common source line CS. On the other hand, the memory cells where the threshold voltage is equal to or higher than the V1 are dead and the bit line remains at 1 V without being discharged. In consequence, for a memory cell where '001' programming is complete, the node SLS at which its bit line terminates remains in the HI state, whereas, for a memory cell where the '001' level is not attained, the node SLS at which its bit line terminates is placed in the LO state.

After the timing signals S4, S5, and S9 fall, timing signals S4, S6, and S8 rise, thereby turning the MOS transistors M1, M2, and M3 ON only for the programming data with the second least significant bit being '1,' that is, bits '010,' '110,'0 '011,' and '111' and making the connection between bit line BL and sense amplifier SL. Next, word lines WL for target memory cells are set at a verify voltage V2 for '010.' At this time, the memory cells where the threshold voltage is lower than the verify voltage V2 become alive and the bit line is discharged to the common source line CS. On the other hand, the memory cells where the threshold voltage is equal to or higher than the V2 are dead and the bit line remains at 1 V without being discharged. In consequence, for a memory cell where '010' programming is complete, the node SLS at which its bit line terminates remains in the HI state, whereas, for a memory cells where the '010' level is not attained, the node SLS at which its bit line terminates is placed in the LO state. At this time, because the memory cells having '001' programming data are certainly live, the bit line is discharged. However, because the MOS transistor M2 is OFF, the information on the bit line is not reflected in the sense amplifier SL and the '001' verify results set on the node SLS are not destroyed.

After the timing signals S4, S6, and S8 fall, timing signals S5, S6, and S7 rise, thereby turning the MOS transistors M1, M2, and M3 ON only for the programming data with the most significant bit being '1,' that is, bits '100,' '110,' '101,' and '111' and making the connection between bit line BL and sense amplifier SL. Next, word lines WL for target memory cells are set at a verify voltage V3 for '100.' At this time, the memory cells where the threshold voltage is lower than the verify voltage V3 become alive and the bit line is discharged to the common source line CS. On the other hand, the memory cells where the threshold voltage is equal to or higher than the V3 are dead and the bit line remains at 1 V without being discharged. In consequence, for a memory cell where '100' programming is complete, the node SLS at which its bit line terminates remains in the HI state, whereas, for a memory cell where the '100' level is not attained, the node SLS at which its bit line terminates is placed in the LO state. At this time, because the memory cells having '001' or '010' programming data are certainly live and the bit line is discharged. However, because the MOS transistor M1 is OFF, the information on the bit line is not reflected in the sense amplifier SL and the '001' and '010' verify results set on the node SLS are not destroyed.

After the timing signals S5, S6, and S7 fall, timing signals S4, S8, and S9 rise, thereby turning the MOS transistors M1, M2, and M3 ON only for the programming data with the least significant bit and the second least significant bit being '1,' that is, bits '011' and '111' and making the connection between bit line BL and sense amplifier SL. Next, word lines WL for target memory cells are set at a verify voltage V4 for '011.' At this time, the memory cells where the threshold voltage is lower than the verify voltage V4 become alive and the bit line is discharged to the common source line CS. On the other hand, the memory cells where the threshold voltage is equal to or higher than the V4 are dead and the bit line remains at 1 V without being discharged. In consequence, for a memory cell where '011' programming is complete, the node SLS at which its bit line terminates remains in the HI state, whereas, for a memory cell where the '011' level is not attained, the node SLS at which its bit line terminates is placed in the LO state. At this time, because the memory cells having '001,' '010,' or '100' programming data are certainly live and the bit line is discharged. However, because at least one of the MOS transistors M2 and M3 is OFF, the information on the bit line is not reflected in the sense amplifier SL and the '001,' '010,' and '100' verify results set on the node SLS are not destroyed.

By increasing stepwise the word line WL voltage to a verify voltage from V1 to V7 in this way to discharge the bit line through live memory cells and by turning the MOS transistors M1, M2, and M3 ON/OFF, depending on the programming data, 3-bit data programming can be verified.

After verifying the programming for all levels, the sense amplifier SL amplifies the supply voltage to the nodes SLS. Then, if the nodes SLS retain the HI states as the verify results for all bits, the sense amplifier SL judges the programming complete. However, if the LO state of at least one verify result of bits exists on any the nodes SLS, this indicates incomplete programming of the bits into the memory cell. Then, programming bias application action that follows selectively applies programming bias to this memory cell.

As described above, programming and verification can be performed at a high speed for the memory cells capable of storing data of three bits per cell. Specifically, by setting timing to verify whether specific data has been programmed in each of the threshold voltage states of the memory cells, depending on the programming data, a series of multilevel verify actions can be completed before the next programming action. In addition, because static steady current does not flow across the memory cells, simultaneous programming verification for a great number of memory cells can be performed. A nonvolatile semiconductor memory device with a high programming throughput can be realized.

As noted in the section of Embodiment 1, precharging the bit lines may be performed, immediately before every verify action for each state of threshold voltage. This method can maintain the bit lines at a desired level with less reduction during the verify action for each state of threshold voltage, producing an effect that higher level charge can be used for verification, though the time required for verification will be longer.

As described in the section of Embodiment 2, it is advisable to complete only the programming of the data of the highest threshold voltage level in the initial phase, so that the required time per verify action can be reduced and faster programming can be achieved.

Furthermore, it is obvious that programming and verification for memory cells that are capable of storing data of N bits per cell can be implemented by modifying the circuitry within the scope that is easily presumable from the present Embodiment.

Embodiment 4

Using FIG. 20, a preferred Embodiment 4 of the present invention will be explained below.

Figure 20:
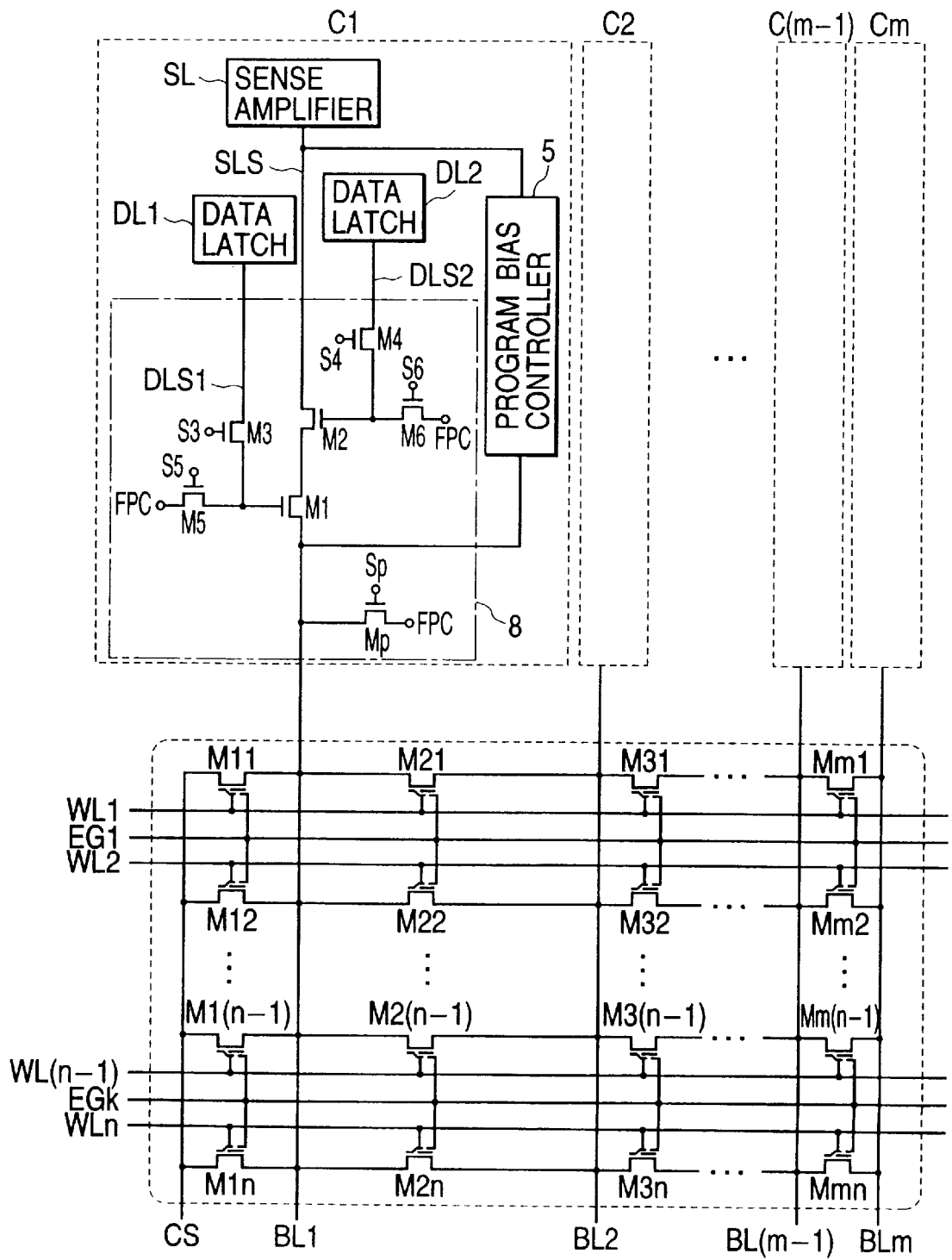
FIG. 20 is a circuit structure diagram for explaining a preferred Embodiment 4 of the present invention.

A memory array shown in FIG. 20 is, for example, an equivalent to the electrically rewritable memory array made known at the meeting of the academic society in the United States, the 1995 INTERNATIONAL SOLID-STATE CIRCUITS CONFERENCE, Session 7, Paper TA 7.4, pp. 126–127 in the collection of papers. Memory cells M11 through Mmn are arrayed in a matrix, constituting a virtual ground memory array with the drain terminal of each memory cell being connected to the source terminal of a neighboring memory cell. The drain or source terminals are connected to any of the bit lines BL1 through BL,m and the control gates are connected to any of the word lines WL1 through WLn, and the memory array is thereby structured. In addition, erase gates EG1 through EGk are placed in parallel with the word lines WL to simultaneously erase the memory cells connected to two adjacent word lines by discharging the electrons accumulated at the floating gates to the erase gates.

The above memory cells are capable of storing information of two bits per cell and can be placed in four states of threshold voltages as shown in FIG. 8 where the erasure state is level '00' and programming into the memory cells is performed by increasing the threshold voltage to '01,' '10,' and '11.' Programming into the memory cells is accomplished by injecting electrons into the floating gates thereof by means of HE injection. The voltage requirements (as an example) of programming bias to cause HE injection are as given in Table 2.

The programming/verification controllers C1 through Cm in FIG. 20 correspond to the programming/verification controllers C1 through Cm of Embodiment 1 shown in FIG. 7. Programming bias can be applied to the memory cells, according to the same requirements as in Embodiment 1. Thus, the memory array configured in Embodiment 4 executes programming and verification in the same way as in Embodiment 1.

Moreover, the programming and verification schemes described in the sections of Embodiments 2 and 3 can apply to Embodiment 4 in the same manner.

Even for virtual ground memory arrays, Embodiment 4 enables a series of multilevel verify actions to be completed before the next programming action by setting timing to verify whether specific data has been programmed in each of the threshold voltage states of the memory cells, depending on the programming data. In addition, because static steady current does not flow across the memory cells, simultaneous programming verification for a great number of memory cells can be performed. A nonvolatile semiconductor memory device with a high programming throughput can be realized.

Embodiment 5

Using FIG. 21, a preferred Embodiment 5 will be explained below.

Figure 21:
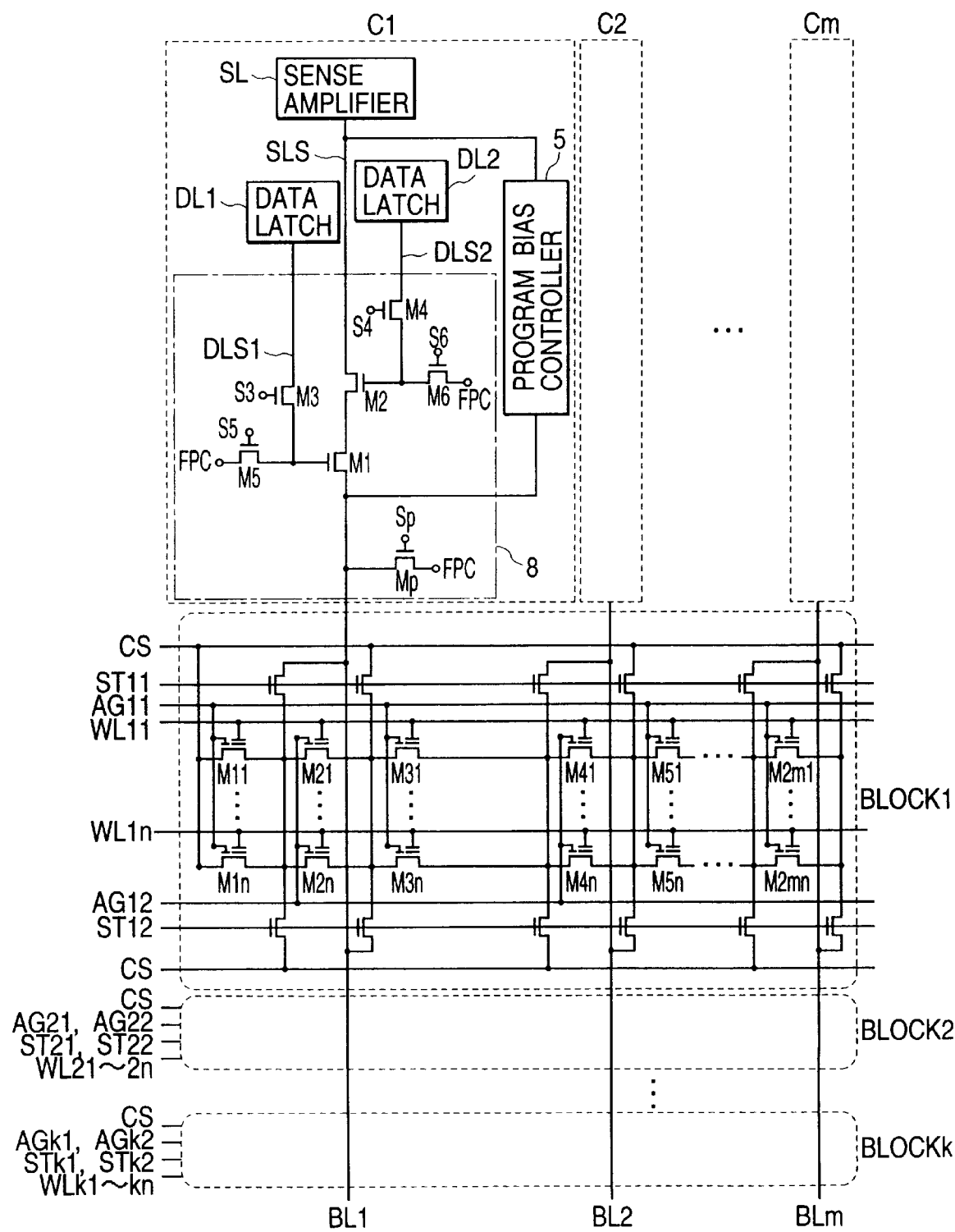
FIG. 21 is a circuit structure diagram for explaining a preferred Embodiment 5 of the present invention.

FIG. 21 shows a concrete circuit structure diagram of Embodiment 5. A memory array shown in FIG. 21 comprises blocks BLOCK1 through BLOCKk where memory cells are arrayed in a matrix, constituting a virtual ground memory array with the drain terminal of each memory cell being connected to the source terminal of a neighboring memory cell. A block BLOCK1 comprises memory cells M11 through M2mn.

The control gates of the memory cells in BLOCKj (j=1, 2, . . . , k) are connected to any of the word lines WLj1 through WLjn and the selected gates thereof are connected to either AGj1 or AGj2. The drain or source terminals thereof are connected via a select transistor to any of the bit lines BL1 through BLm or a common source line CS.

Here, the above memory cells are capable of storing information of two bits per cell and can be placed in four states of threshold voltages as shown in FIG. 8 where the erasure state is level '00' and programming into the memory cells is performed by increasing the threshold voltage to '01,' '10,' and '11.'

Programming into the memory cells is accomplished by injecting electrons into the floating gates thereof by means of Source-Side Injection (hereinafter referred to as SSI). The voltage requirements (as an example) of programming bias to cause SSI injection are tabulated in Table 5.

TABLE 5

| Node | Voltage |
|---|---|
| Word line voltage | 12 V |
| Selected gate voltage | 2 V |
| Drain voltage | 5 V |
| Source line voltage | 0 V |
| Well voltage | 0 V |

A feature of the SSI is as follows. By applying a voltage corresponding to the required threshold voltage, for example, about 2 V, to the selected gate provided adjacent to the floating gate of a memory cell, a vertically and horizontally extended electric field is generated in the channel under the boundary between the selected gate and the floating gate. Thereby, increased quantity of hot electrons is generated and the efficiency of injection is enhanced, so that high-speed programming with small channel current can be achieved.

For the memory array according to Embodiment 5, by setting the voltage of AGji or AGj2 at 0 V to which the selected gates are connected, the memory cells in the connection with AGji or AGj2 can be placed in the inactive state. If, for example, AGj1 is set at 0 V, the memory cells in the odd rows are placed in the inactive state, while the memory cells in the even rows can be read and programmed without being affected by the memory cells in the odd rows. Alternatively, if AGj2 is set at 0 V, the memory cells in the even rows are placed in the inactive state, while the memory cells in the odd rows can be read and programmed without being affected by the memory cells in the even rows. By controlling the selected gates in this way, programming and reading can be performed exclusively for the memory cells in the odd places or the even places in the rows of the memory cells connected to one word line.

Figure 22:
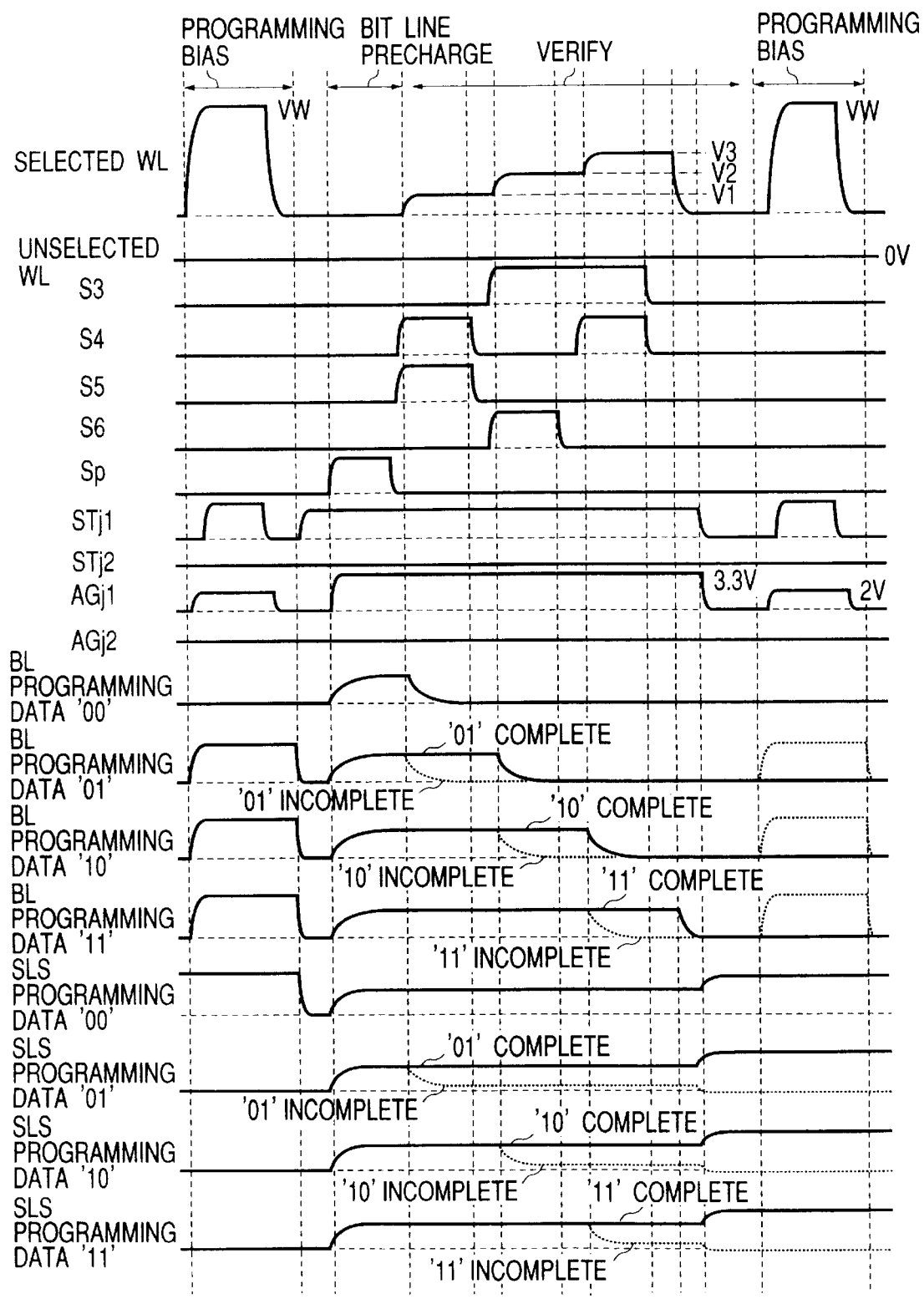
FIG. 22 is a timing chart for explaining programming and verification to be performed in Embodiment 5.

Using the timing chart shown in FIG. 22, Embodiment 5 will be detailed below. In the following, operation will be described, concerning a case where the memory cells in the odd places of the rows in BLOCKj are selected. However, the same operation can be implemented for a case where the memory cells in the even places of the rows are selected.

With the input of a programming instruction, programming data is transferred to the circuitry shown in FIG. 21 from outside and the upper bit of 2-bit data is stored into the data latch circuit DL1 and the lower bit of the data is stored into the data latch circuit DL2. The states of nodes DLS1 and DLS2 after 2-bit data is stored are as given in Table 3. To program data of bits '01,' '10,' and '11' into the memory cells, programming bias is then applied. The voltage requirements for programming bias are as given in Table 5.

After the application of programming bias, programming verify action is performed. Initially, a control signal STj1 rises, thereby turning the select transistors ON and increasing the selected gate voltage AGji to, for example, 4.5 V. Then, the memory cells in the odd rows are activated among the memory cells connected to selected word lines.

Subsequently, all bit lines BL are precharged at, for example, 1 V and then put floating. Timing signals S4 and S5 rise, thereby selectively turning the MOS transistors M1 and M2 ON only for the programming data with the lower bit of '1,' that is, bits '01' and '11' and making the connection between bit line BL and sense amplifier SL. Next, selected word lines WL for target memory cells are set at a verify voltage V1 for '01" level (for example, 2 V) and verify action for '01' is performed. The memory cells where the threshold voltage is lower than the verify voltage V1, that is, '01' level programming is incomplete become alive and the bit line is discharged through the memory cells to the common source line CS. On the other hand, the memory cells where the threshold voltage is equal to or higher than the V1, that is, '01' level programming is complete are dead and the bit line remains at 1 V. In consequence, in the group of the memory cells into which bits '01' or '11' must be programmed, for a memory cell where '01' level programming is complete, the node SLS at which its bit line terminates remains in the HI state, whereas, for a memory cell where the '01' level is not attained, the node SLS at which its bit line terminates is placed in the LO state. Meanwhile, as concerns the bits '00' and '10' of programming data, the MOS transistor M2 is turned OFF and the node SLS is placed in the HI state, regardless of the threshold voltage of the memory cells. For example, for a memory cell placed at erasure level '00,' its bit line is discharged due to the verify action for '01', but the node SLS remains in the HI state because the bit line BL is not connected to the sense amplifier SL.

After the timing signals S4 and S5 fall, timing signals S3 and S6 rise, thereby selectively turning the MOS transistors M1 and M2 ON only for the programming data with the upper bit of '1,' that is, bits '10' and '11' and making the connection between bit line BL and sense amplifier SL. Subsequently, the word line WL voltage is set at a verify voltage V2 for '10' level (for example, 3 V) and verify action for '10' is performed. In consequence of this verify action, the memory cells where the threshold voltage is lower than the verify voltage V2 become alive and the bit line is discharged through the memory cells to the common source line CS. On the other hand, the memory cells where the threshold voltage is equal to or higher than the V2, that is, '10' level programming is complete are dead and the bit line remains charged. In consequence, in the group of the memory cells into which bits '10' or '11' must be programmed, for a memory cell where '10' level programming is complete, the node SLS at which its bit line terminates remains in the HI state, whereas for a memory cell where the '10' level is not attained, the node SLS at which its bit line terminates is placed in the LO state. Meanwhile, as concerns the memory cells into which bits '00' or '01' must be programmed, the MOS transistor M1 is turned OFF and the bit line BL is not connected to the sense amplifier SL, and therefore the '01' verify results retained on the node SLS in the preceding verify action are not destroyed.

After the timing signals S3 and S6 fall, timing signals S3 and S4 rise, thereby selectively turning the MOS transistors M1 and M2 ON only for the bits '11' of programming data and making the connection between bit line BL and sense amplifier SL. Subsequently, the selected word line WL voltage is set at a verify voltage V3 for '11' level (for example, 4 V) and verify action for '11' is performed. In consequence of this verify action, the memory cells where the threshold voltage is lower than the verify voltage V3 become alive and the bit line is discharged through the memory cells to the common source line CS. On the other hand, the memory cells where the threshold voltage is equal to or higher than the V3, that is, '11' level programming is complete are dead and the bit line remains charged. In consequence, in the group of the memory cells into which bits '11' must be programmed, for a memory cell where programming of bits '11' is complete, the node SLS at which its bit line terminates remains in the HI state, whereas, for a memory cell where the '11' level is not attained, the node SLS at which its bit line terminates is placed in the LO state. Meanwhile, as concerns the memory cells into which bits '00, '01,' or '10' must be programmed, at least one of the MOS transistors M1 and M2 is turned OFF and the bit line BL is not connected to the sense amplifier SL. Therefore, the '01' and '10' verify results retained on the node SLS as the result of the verify actions performed before the '11' verify action are not destroyed.

For the memory cells into which bits '00' must be programmed, the bit line is discharged during the '01,' '10,' and '11' verify actions, while the bit line BL is not connected to the sense amplifier SL, and consequently the sense amplifier judges that programming of the bits is complete.

Thereafter, the sense amplifier SL amplifies the supply voltage and executes sensing the memory data. Then, if the nodes SLS for all programming bit lines retain the HI states as the verify results, the sense amplifier SL judges the programming complete. However, if the LO state of at least one verify result exists on any of the nodes SLS, this indicates that the memory cell that placed the node SLS in the LO state is insufficiently programmed. Then, programming action that follows selectively applies programming bias to this memory cell. At this time, programming bias is not applied to the memory cells for which the completion of programming has been verified.

Even for virtual ground memory arrays provided with selected gates, Embodiment 5 enables a series of multilevel verify actions to be completed before the next programming action by setting timing to verify whether specific data has been programmed in each threshold voltage state of the memory cells, depending on the programming data. In addition, because static steady current does not flow across the memory cells, simultaneous programming verification for a great number of memory cells can be performed. A nonvolatile semiconductor memory device with a high programming throughput can be realized.

Precharging the bit lines may be performed, immediately before every verify action for each state of threshold voltage. This method can maintain the bit lines at a desired level with less reduction during the verify action for each state of threshold voltage, producing an effect that higher level charge can be used for verification, though the time required for verification increases.

It is advisable to complete only the programming of the data of the highest threshold voltage level in the initial phase, so that the required time per verify action can be reduced and faster programming can be achieved.

Furthermore, as noted in the section of Embodiment 3, it is obvious that programming and verification for memory cells that are capable of storing data of three bits or more per cell can be implemented by modifying the circuitry within the scope that is easily presumable from the present Embodiment.

Embodiment 6

Using FIG. 23, a preferred Embodiment 6 will be explained below.

Figure 23:
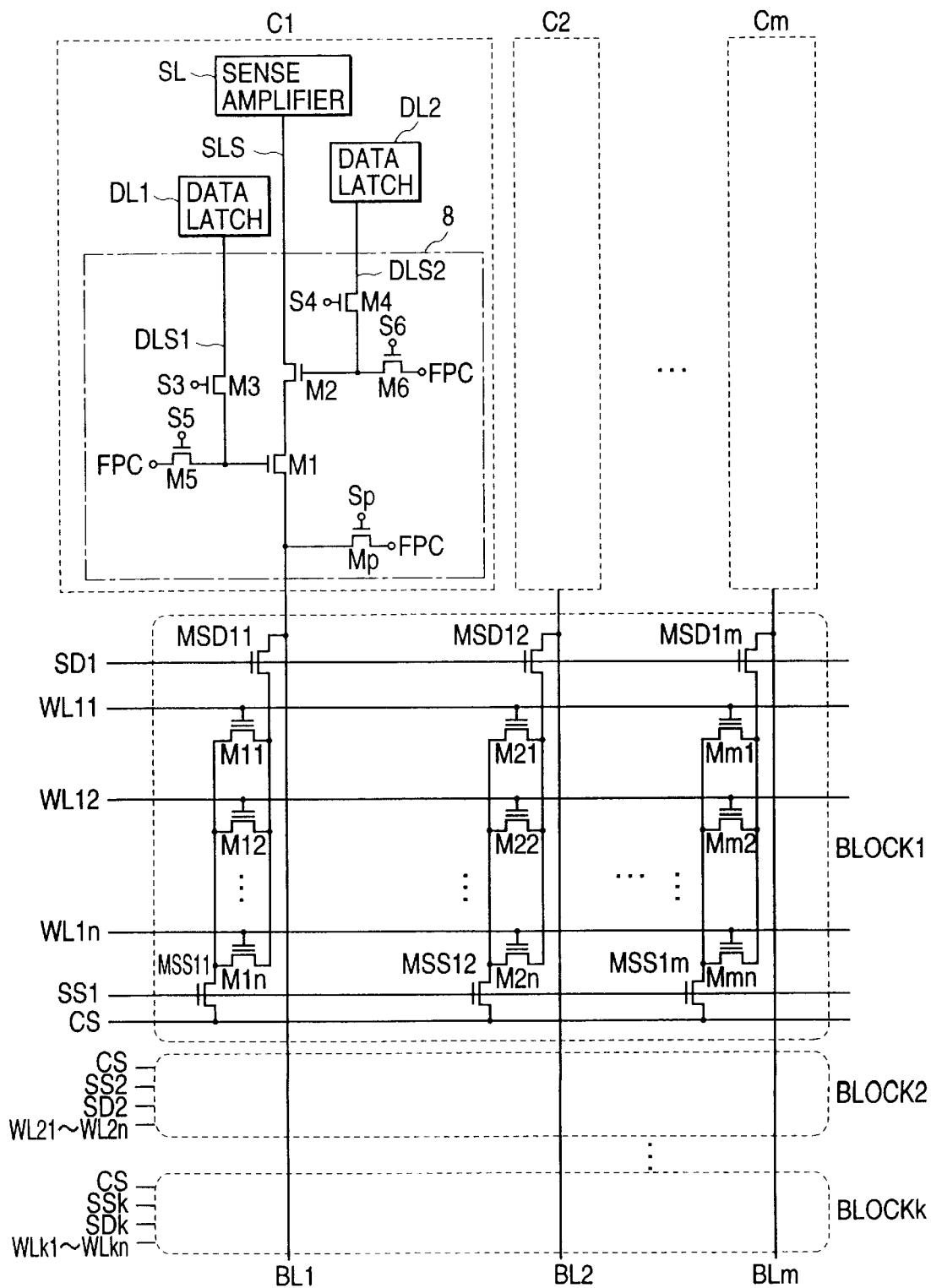
FIG. 23 is a circuit structure diagram for explaining a preferred Embodiment 6 of the present invention.

FIG. 23 shows a concrete circuit structure diagram of Embodiment 6. A memory array shown in FIG. 23 is, for example, an equivalent to the electrically rewritable NOR-type nonvolatile semiconductor memory array described in Japanese Patent Prepublication No. Hei 8-279566. The memory array comprises blocks BLOCK1 through BLOCKk where memory cells M11 through Mmn are arrayed in a matrix.

Each BLOCKj (j=1, 2, . . . , k) memory array has structure wherein the drain terminals of the memory cells are connected in parallel to any of the sub-bit lines that are connected to the bit lines via select transistors MSDj1 through MSDjm, the source terminals thereof are connected in parallel to any of the sub-source lines that are connected to a common source line CS via select transistors MSSj1 through MSSjm, and the control gates thereof are connected to any of the word lines WLj1 through WLjn. The sub-bit lines and sub-source lines in the block are electrically insulated from each other.

Here, the above memory cells are capable of storing information of two bits per cell and can be placed in four states of threshold voltages as shown in FIG. 8 where the erasure state is level '00' and programming into the memory cells is performed by increasing the threshold voltage to '01,' '10,' and '11.' Programming into the memory cells is accomplished by injecting electrons into the floating gates thereof by means of FN tunneling current. The voltage requirements (as an example) of programming bias to cause the above electron injection are tabulated in Table 6.

TABLE 6

| Node | Voltage |
| --- | --- |
| Word line voltage | 18 V |
| Drain voltage | 0 V |
| Source line voltage | 0 V |
| Well voltage | 0 V |

Figure 24:
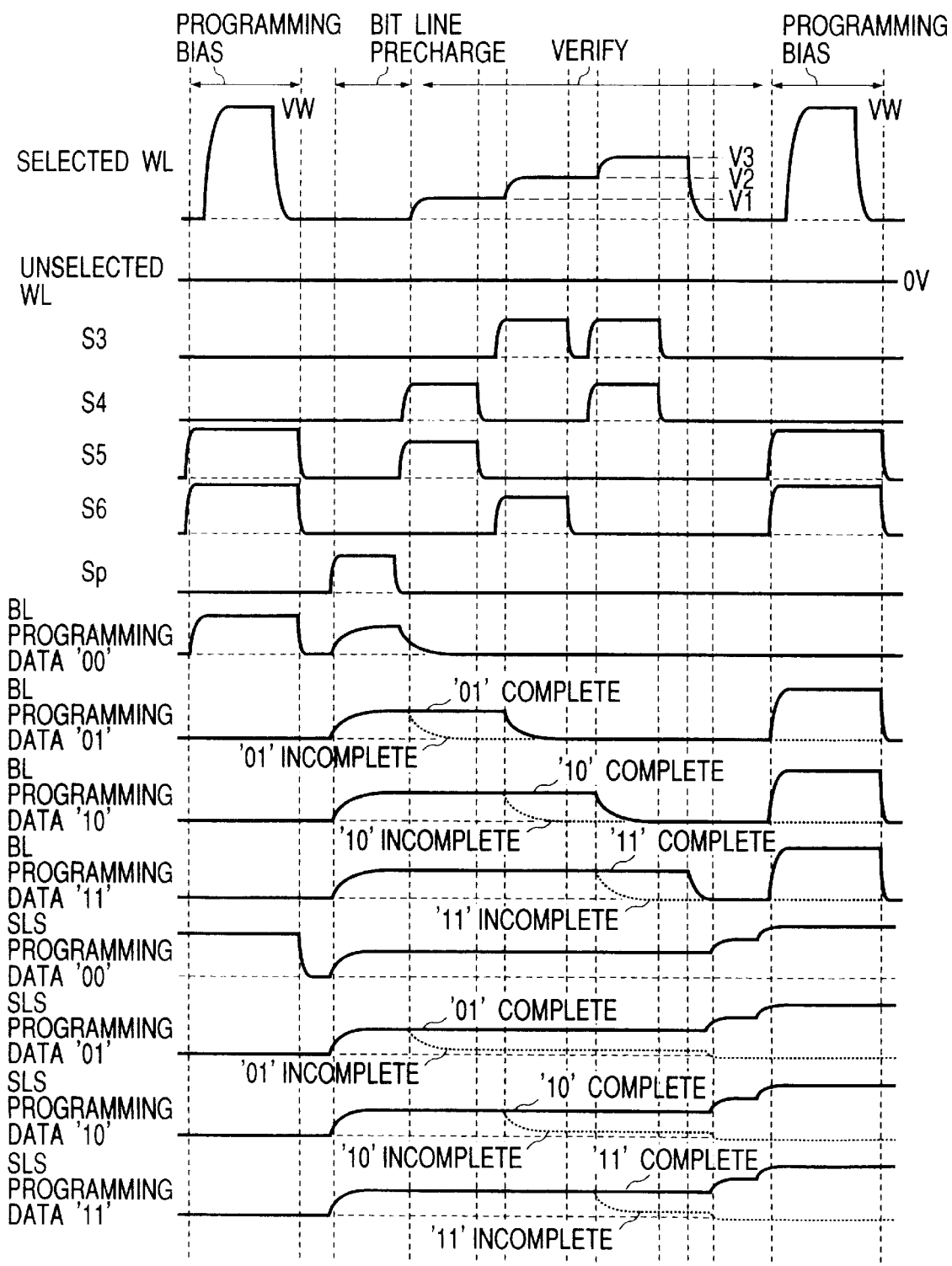
FIG. 24 is a timing chart for explaining programming and verification to be performed in Embodiment 6.

Using the timing chart shown in FIG. 24 together with FIGS. 23 and 8, programming and verification to be performed in Embodiment 6 will be explained below.

With the input of a programming instruction, programming data is transferred to the circuitry shown in FIG. 23 from outside and the upperbit of 2-bit data is stored into the data latch circuit DL1 and the lower bit of the data is stored into the data latch circuit DL2. The states of nodes DLS1 and DLS2 after 2-bit data is stored are as given in Table 3. To program data of bits '01,' '10,' and '11' into the memory cells, programming bias is then applied. The voltage requirements for programming bias are as given in Table 6.

After the application of programming bias, programming verify action is performed. Initially, all bit lines BL1 through BLm are precharged at, for example, 1 V and then put floating. Timing signals S4 and S5 rise, thereby selectively turning the MOS transistors M1 and M2 ON only for the programming data with the lower bit of '1,' that is, bits '01' and '11' and making the connection between bit line BL and sense amplifier SL. Next, selected word lines WL for target memory cells are set at a verify voltage V1 for '01" level (for example, 2 V) and verify action for '01' is performed. The memory cells where the threshold voltage is lower than the verify voltage V1, that is, '01' level programming is incomplete become alive and the bit line is discharged through the memory cells to the common source line CS. On the other hand, the memory cells where the threshold voltage is equal to or higher than the V1, that is, '01' level programming is complete are dead and the bit line remains at 1 V. In consequence, in the group of the memory cells into which bits '01' or '11' must be programmed, for a memory cell where '01' level programming is complete, the node SLS at which its bit line terminates remains in the HI state, whereas, for a memory cell where the '01' level is not attained, the node SLS at which its bit line terminates is placed in the LO state. Meanwhile, as concerns the bits '00' and '10' of programming data, the MOS transistor M2 is turned OFF and the node SLS is placed in the HI state, regardless of the threshold voltage of the memory cells.

After the timing signals S4 and S5 fall, timing signals S3 and S6 rise, thereby selectively turning the MOS transistors M1 and M2 ON only for the programming data with the upper bit of '1,' that is, bits '10' and '11' and making the connection between bit line BL and sense amplifier SL. Subsequently, the word line WL voltage is set at a verify voltage V2 for '10' level, for example, 3 V, and verify action for '10' is performed. In consequence of this verify action, the memory cells where the threshold voltage is lower than the verify voltage V2 become alive and the bit line is discharged through the memory cells to the common source line CS. On the other hand, the memory cells where the threshold voltage is equal to or higher than the V2, that is, '10' level programming is complete are dead and the bit line remains charged. In consequence, in the group of the memory cells into which bits '10' or '11' must be programmed, for a memory cell where '10' level programming is complete, the node SLS at which its bit line terminates remains in the HI state, whereas, for a memory cell where the '10' level is not attained, the node SLS at which its bit line terminates is placed in the LO state. Meanwhile, as concerns the memory cells into which bits '00' or '01' must be programmed, the MOS transistor M1 is turned OFF and the bit line BL is not connected to the sense amplifier SL, and therefore the '01' verify results retained on the node SLS in the preceding verify action are not destroyed.

After the timing signals S3 and S6 fall, timing signals S3 and S4 rise, thereby selectively turning the MOS transistors M1 and M2 ON only for the bits '11' of programming data and making the connection between bit line BL and sense amplifier SL. Subsequently, the selected word line WL voltage is set at a verify voltage V3 for '11' level, for example, 4 V, and verify action for '11' is performed. In consequence of this verify action, the memory cells where the threshold voltage is lower than the verify voltage V3 become alive and the bit line is discharged through the memory cells to the common source line CS. On the other hand, the memory cells where the threshold voltage is equal to or higher than the V3, that is, '11' level programming is complete are dead and the bit line remains charged. In consequence, in the group of the memory cells into which bits '11' must be programmed, for a memory cell where programming of bits '11' is complete, the node SLS at which its bit line terminates remains in the HI state, whereas, for a memory cell where the '11' level is not attained, the node SLS at which its bit line terminates is placed in the LO state. Meanwhile, as concerns the memory cells into which bits '00, '01,' or '10' must be programmed, at least one of the MOS transistors M1 and M2 is turned OFF and the bit line BL is not connected to the sense amplifier SL. Therefore, the '01' and '10' verify results retained on the node SLS as the result of the verify actions performed before the '11' verify action are not destroyed.

Thereafter, the sense amplifier SL amplifies the supply voltage and executes sensing the memory data. Then, if the nodes SLS for all programming bit lines retain the HI states as the verify results, the sense amplifier SL judges the programming complete. However, if the LO state of at least one verify result of bits exists on any of the nodes SLS, this indicates that the memory cell that placed the node SLS in the LO state is insufficiently programmed. Then, programming action that follows selectively applies programming bias to this memory cell. At this time, programming bias is not applied to the memory cells for which the completion of programming has been verified.

Now, the programming action following verification in the case of Embodiment 6 will be detailed below. After sensing the memory data is executed as described above, if the LO state of at least one verify result exists on any of the nodes SLS, the power supply SLP voltage of the PMOS transistor of the sense amplifier SL (see FIG. 10) is set at VWD and the power supply SLN voltage of the NMOS transistor thereof is set at 0 V and then timing signals S5 and S6 rise for programming action. Depending on the verify result state per memory cell on the node SLS, the bit line is thereby charged as follows. For the LO state of the verify result of bits on the node SLS, indicating that the programming of the bits into the memory cell is incomplete, the bit line for the memory cell is charged at 0 V. For the HI state of the verify result of bits on the node SLS, indicating that the programming of the bits into the memory cell is complete, the bit line for the memory cell is charged at VWD. In this way, in Embodiment 6, the sense amplifier SL and the MOS transistors M1 and M2, in combination, provide a means to apply programming bias for programming action, instead of using the program bias controller 5 that is used in Embodiments 1 to 5.

Thereafter, control signals SDj to control the select transistors MSDj rise, the drain and source terminals of the memory cells M11 through Mnm are charged at VWD or 0 V and the word line voltage is set at VW and thereby programming starts. Charging both drain and source terminals is due to that the select transistors MSSj are de-energized. When both drain and source terminals are charged, the channels are also charged at the same voltage as the voltage at the drain and source terminals. Because the FN tunneling current to flow through a memory cell being programmed is very small, programming is possible when the select transistor MSSj connecting with the memory cell is in the de-energized (OFF) state.

For a memory cell where programming is complete, its drain and source terminals are charged at voltage VWD and this weakens the electric field applied to the tunnel film (oxide) between its floating gate and channel, and consequently programming does not take place. For a memory cell where programming is incomplete, on the other hand, its drain and source terminals and channel are 0 V. Thus, the word line voltage VW, for example, 17 V causes the application of a strong electric field to the tunnel film (oxide), by which FN injection into the floating gate takes place and programming is performed.

Even for memory cells that use FN tunneling current for programming, Embodiment 6 enables a series of multilevel verify actions to be completed before the next programming action by setting timing to verify whether specific data has been programmed in each threshold voltage state of the memory cells, depending on the programming data. In addition, because static steady current does not flow across the memory cells, simultaneous programming verification for a great number of memory cells can be performed. A nonvolatile semiconductor memory device with a high programming throughput can be realized.

Figure 25:
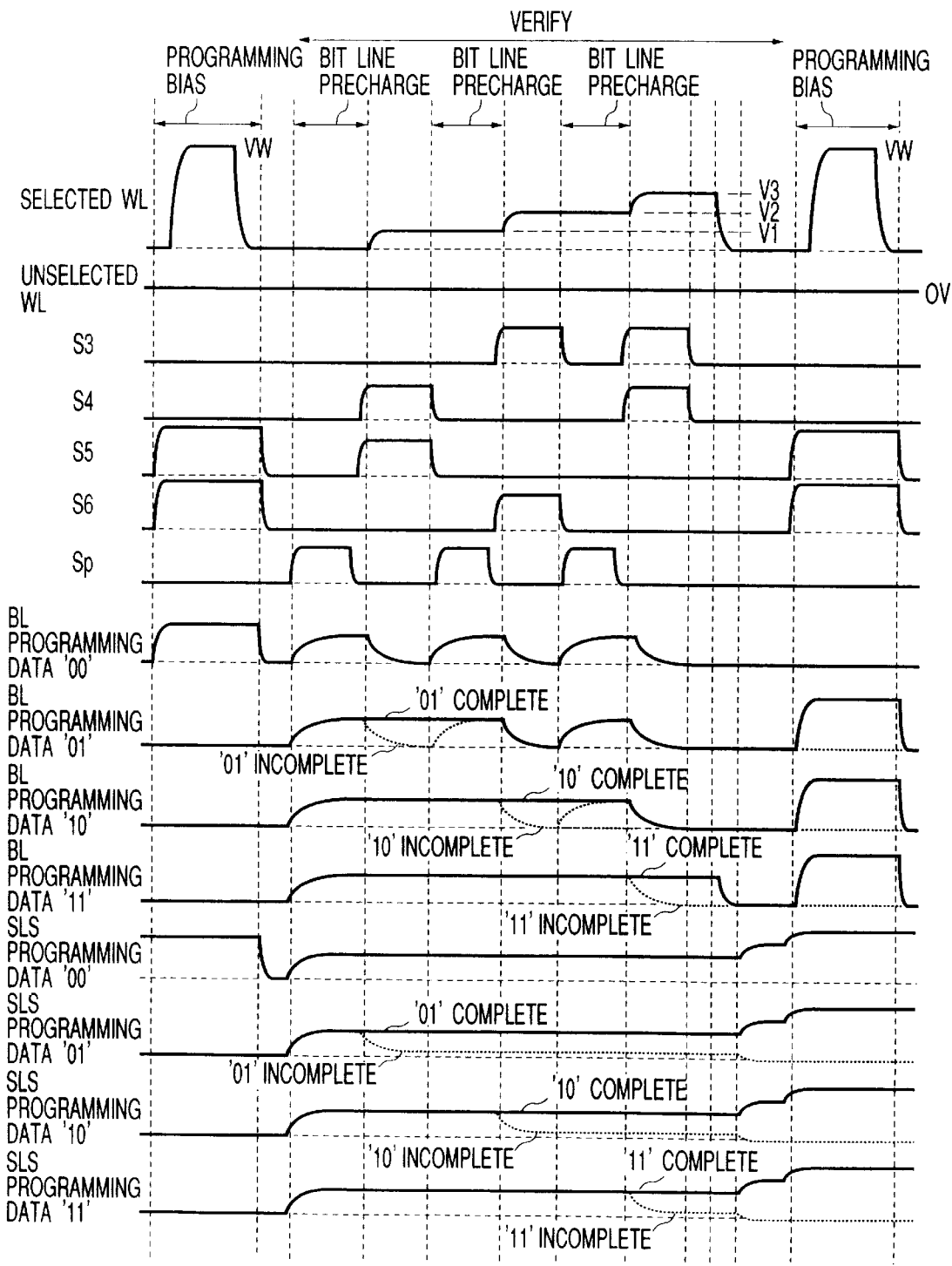
FIG. 25 is a timing chart for explaining another manner of programming and verification to be performed in Embodiment 6.

As shown in FIG. 25, precharging the bit lines may be performed, immediately before every verify action for each state of threshold voltage. This method can maintain the bit lines at a desired level with less reduction during the verify action for each state of threshold voltage, producing an effect that higher level charge can be used for verification, though the time required for verification increases.

As described in the section of Embodiment 2, it is advisable to complete only the programming of the data of the highest threshold voltage level in the initial phase, so that the required time per verify action can be reduced and faster programming can be achieved.

Furthermore, as noted in the section of Embodiment 3, it is obvious that programming and verification for memory cells that are capable of storing data of three bits or more per cell can be implemented by modifying the circuitry within the scope that is easily presumable from the present Embodiment.

Embodiment 7

Using FIG. 26, a preferred Embodiment 7 of the present invention will be explained below.

Figure 26:
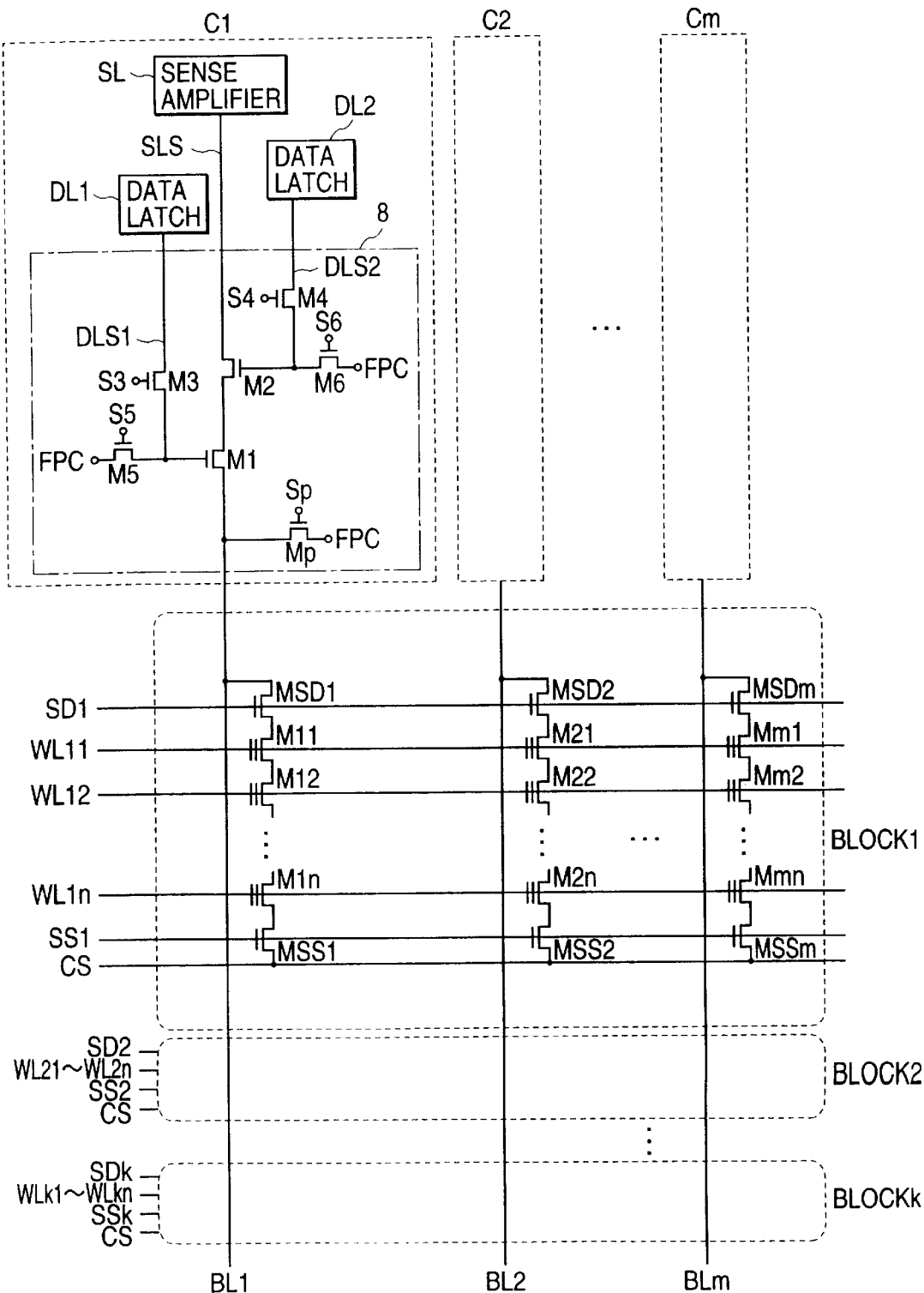
FIG. 26 is a circuit structure diagram for explaining a preferred Embodiment 7 of the present invention.

FIG. 26 shows a concrete circuit structure diagram of Embodiment 7. A memory array shown in FIG. 26 is, for example, an equivalent to the electrically rewritable NAND-type nonvolatile semiconductor memory array described in Japanese Patent Prepublication No. Hei 7-37393. The memory array comprises blocks BLOCK1 through BLOCKk where memory cells M11 through Mmn are arrayed in a matrix. Each BLOCKj memory array comprises rows of memory cells, each row comprising n pieces of memory cells connected in series. Each BLOCKj memory array has structure wherein the memory cell rows are, on one end, connected to the bit lines via select transistors MSD1 through MSDm and, on the other end, connected to a common source line CS via select transistors WLj1 through WLjn and the control gates of the memory cells are connected to any of the word lines WLj1 through WLjn. The memory cell rows in the block are electrically insulated from each other.

Here, the above memory cells are capable of storing information of two bits per cell and can be placed in four states of threshold voltages as shown in FIG. 8 where the erasure state is level '00' and programming into the memory cells is performed by increasing the threshold voltage to '01,' '10,' and '11.' Programming into the memory cells is accomplished by injecting electrons into the floating gates thereof by means of FN tunneling current. The voltage requirements (as an example) of programming bias to cause the above electron injection are as given in Table 6.

Figure 27:
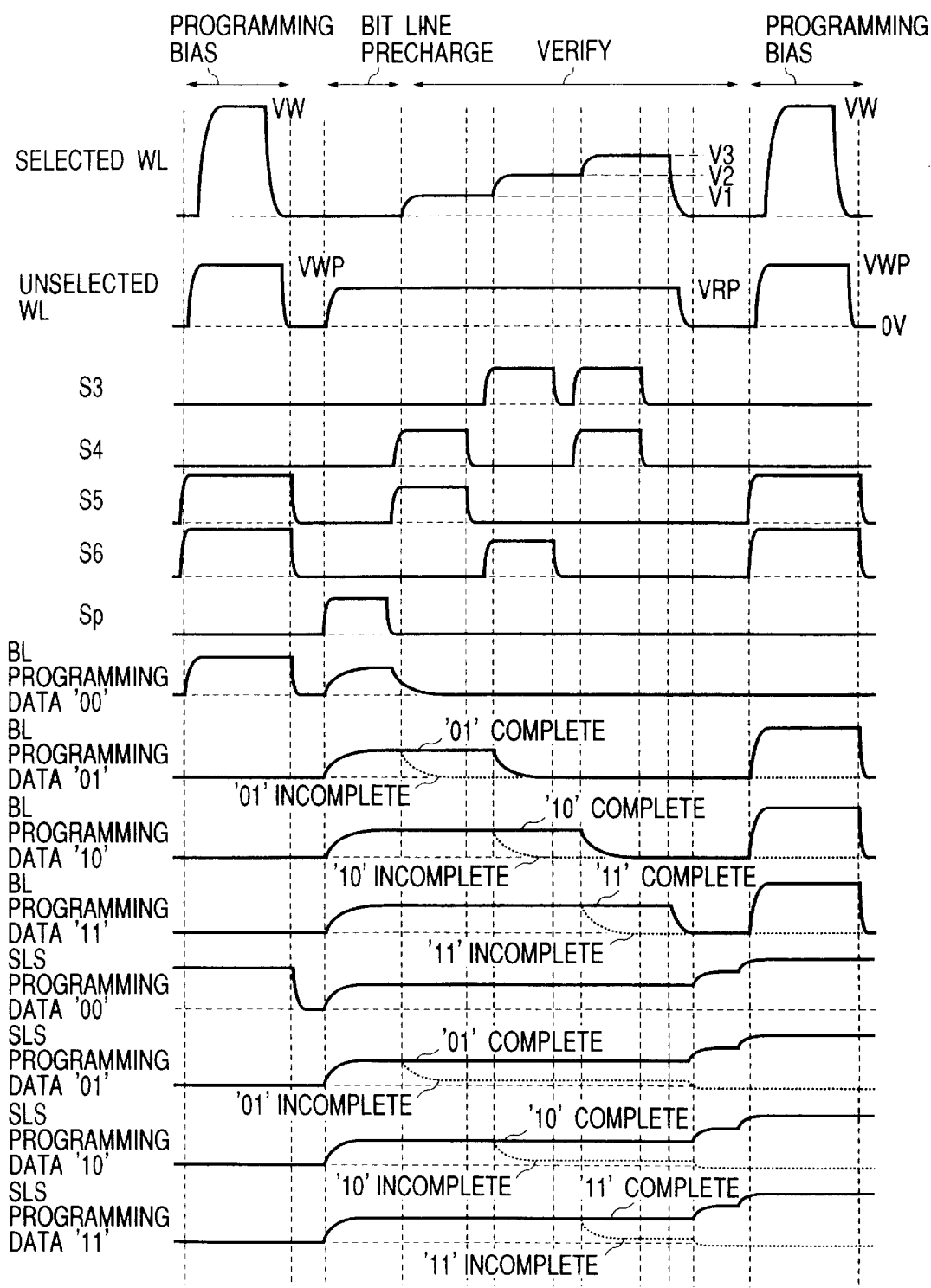
FIG. 27 is a timing chart for explaining programming and verification to be performed in Embodiment 7.

Using the timing chart shown in FIG. 27 together with FIGS. 8 and 26, programming and verification to be performed in Embodiment 7 will be explained below.

With the input of a programming instruction, programming data is transferred to the circuitry shown in FIG. 26 from outside and the upper bit of 2-bit data is stored into the data latch circuit DL1 and the lower bit of the data is stored into the data latch circuit DL2. The states of nodes DLS1 and DLS2 after 2-bit data is stored are as given in Table 3. To program data of bits '01,' '10,' and '11' into the memory cells, programming bias is then applied. The voltage requirements for programming bias are as given in Table 6.

After the application of programming bias, programming verify action is performed. Initially, the voltage VRP of unselected word lines in a selected block is increased to, for example, about 5 V, so that even the memory cells programmed in the highest threshold voltage state will be energized.

Next, all bit lines BL1 through BLm are precharged at, for example, 1 V and then put floating. Timing signals S4 and S5 rise, thereby selectively turning the MOS transistors M1 and M2 ON only for the programming data with the lower bit of '1,' that is, bits '01' and '11' and making the connection between bit line BL and sense amplifier SL. Then, selected word lines WL for target memory cells are set at a verify voltage V1 for '01" level (for example, 2 V) and verify action for '01' is performed. The memory cells where the threshold voltage is lower than the verify voltage V1, that is, '01' level programming is incomplete become alive and the bit line is discharged through the memory cells to the common source line CS. On the other hand, the memory cells where the threshold voltage is equal to or higher than the V1, that is, '01' level programming is complete are dead and the bit line remains at 1 V. In consequence, in the group of the memory cells into which bits '01' or '11' must be programmed, for a memory cell where '01' level programming is complete, the node SLS at which its bit line terminates remains in the HI state, whereas, for a memory cell where the '01' level is not attained, the node SLS at which its bit line terminates is placed in the LO state. Meanwhile, as concerns the bits '00' and '10' of programming data, the MOS transistor M2 is turned OFF and the node SLS is placed in the HI state, regardless of the threshold voltage of the memory cells.

After the timing signals S4 and S5 fall, timing signals S3 and S6 rise, thereby selectively turning the MOS transistors M1 and M2 ON only for the programming data with the upper bit of '1,' that is, bits '10' and '11' and making the connection between bit line BL and sense amplifier SL. Subsequently, the word line WL voltage is set at a verify voltage V2 for '10' level (for example, 3 V) and verify action for '10' is performed. In consequence of this verify action, the memory cells where the threshold voltage is lower than the verify voltage V2 become alive and the bit line is discharged through the memory cells to the common source line CS. On the other hand, the memory cells where the threshold voltage is equal to or higher than the V2, that is, '10' level programming is complete are dead and the bit line remains charged. In consequence, in the group of the memory cells into which bits '10' or '11' must be programmed, for a memory cell where '10' level programming is complete, the node SLS at which its bit line terminates remains in the HI state, whereas, for a memory cell where the '10' level is not attained, the node SLS at which its bit line terminates is placed in the LO state. Meanwhile, as concerns the memory cells into which bits '00' or '01' must be programmed, the MOS transistor M1 is turned OFF and the bit line BL is not connected to the sense amplifier SL, and therefore the '01' verify results retained on the node SLS in the preceding verify action are not destroyed.

After the timing signals S3 and S6 fall, timing signals S3 and S4 rise, thereby selectively turning the MOS transistors M1 and M2 ON only for the bits '11' of programming data and making the connection between bit line BL and sense amplifier SL. Subsequently, the selected word line WL voltage is set at a verify voltage V3 for '11' level (for example, 4 V) and verify action for '11' is performed. In consequence of this verify action, the memory cells where the threshold voltage is lower than the verify voltage V3 become alive and the bit line is discharged through the memory cells to the common source line CS. On the other hand, the memory cells where the threshold voltage is equal to or higher than the V3, that is, '11' level programming is complete are dead and the bit line remains charged. In consequence, in the group of the memory cells into which bits '11' must be programmed, for a memory cell where programming of bits '11' is complete, the node SLS at which its bit line terminates remains in the HI state, whereas, a memory cell where the '11' level is not attained, the node SLS at which its bit line terminates is placed in the LO state. Meanwhile, as concerns the memory cells into which bits '00, '01,' or '10' must be programmed, at least one of the MOS transistors M1 and M2 is turned OFF and the bit line BL is not connected to the sense amplifier SL. Therefore, the '01' or '10' verify results retained on the node SLS as the result of the verify actions performed before the '11' verify action are not destroyed.

For the memory cells into which bits '00' must be programmed, the bit line is discharged during the '01' and '10' verify actions, but the bit line BL is not connected to the sense amplifier SL during the '01,' '10,' and '11' verify actions, and consequently the sense amplifier judges that programming of the bits is complete.

Thereafter, the sense amplifier SL amplifies the supply voltage and executes sensing the memory data. After the sensing, if the nodes SLS for all programming bit lines retain the HI states as the verify results, the sense amplifier SL judges the programming complete. However, if the LO state of at least one verify result exists on any of the nodes SLS, this indicates that the memory cell that placed the node SLS in the LO state is insufficiently programmed. Then, programming action that follows selectively applies programming bias to this memory cell. At this time, programming bias is not applied to the memory cells for which the completion of programming has been verified.

Now, the programming action following verification will be detailed below. After sensing the memory data is executed as described above, if the LO state of at least one verify result exists on any of the nodes SLS, the power supply SLP voltage of the PMOS transistor of the sense amplifier SL (see FIG. 10) is set at VWD and the power supply SLN voltage of the NMOS transistor thereof is set at 0 V. Then, switches S5 and S6 are turned on, thereby charging the bit line, depending on the verify result state per memory cell on node SLS. For the LO state of the verify result of bits on the node SLS, indicating that the programming of the bits into the memory cell is incomplete, the bit line for the memory cell is charged at 0 V. For the HI state of the verify result of bits on the node SLS, indicating that the programming of the bits into the memory cell is complete, the bit line for the memory cell is charged at VWD.

Thereafter, control signals SDj to control the select transistors MSD rise, the drain terminals of the memory cells are charged at VWD or 0 V, and then the control signals SDj fall. Thereby, the diffused layer (drain and source) of each memory cell connected in series are put floating, resulting in that the channel of each memory cell is also charged at the same voltage as the voltage of the diffused layer.

Subsequently, unselected word lines WL in a selected block are increased to voltage VWP. As a result, for the channel of a memory cell charged at VWD, its voltage is increased above the VWD by capacity coupling, which makes the electric field in the oxide (tunnel film) so weak that programming does not take place even if the word line voltage is set at voltage VW. On the other hand, for a memory cell where programming is incomplete, its diffused layer and channel are set at 0 V and therefore the application of the word line voltage VW, for example, 17 V causes the application of a strong electric field to the tunnel film (oxide), by which FN injection into the floating gate takes place.

Even for memory cells connected in series that use FN tunneling current for programming, Embodiment 7 enables a series of multilevel verify actions to be completed before the next programming action by setting timing to verify whether specific data has been programmed in each threshold voltage state of the memory cells, depending on the programming data. In addition, because static steady current does not flow across the memory cells, simultaneous programming verification for a great number of memory cells can be performed. A nonvolatile semiconductor memory device with a high programming throughput can be realized.

Figure 28:
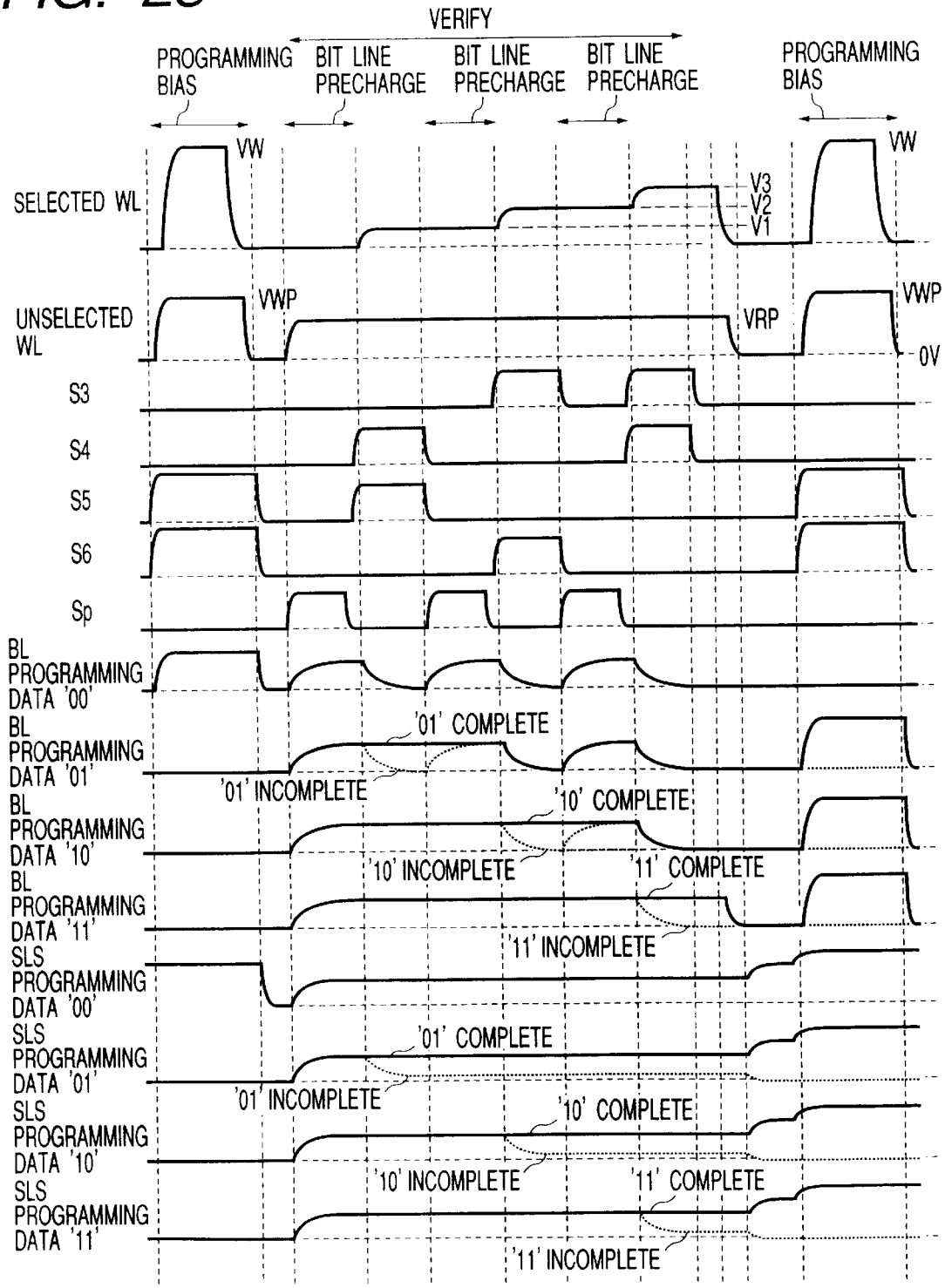
FIG. 28 is a timing chart for explaining another manner of programming and verification to be performed in Embodiment 7.

As shown in FIG. 28, precharging the bit lines may be performed, immediately before every verify action for each state of threshold voltage. This method can maintain the bit lines at a desired level with less reduction during the verify action for each state of threshold voltage, producing an effect that higher level charge can be used for verification, though the time required for verification increases.

It is advisable to complete only the programming of the data of the highest threshold voltage level in the initial phase, so that the required time per verify action can be reduced and faster programming can be achieved.

Furthermore, it is obvious that programming and verification for memory cells that are capable of storing data of three bits or more per cell can be implemented by modifying the circuitry within the scope that is easily presumable from the present Embodiment.

Embodiment 8

Using FIG. 29, a preferred Embodiment 8 of the present invention will be explained below.

Figure 29:
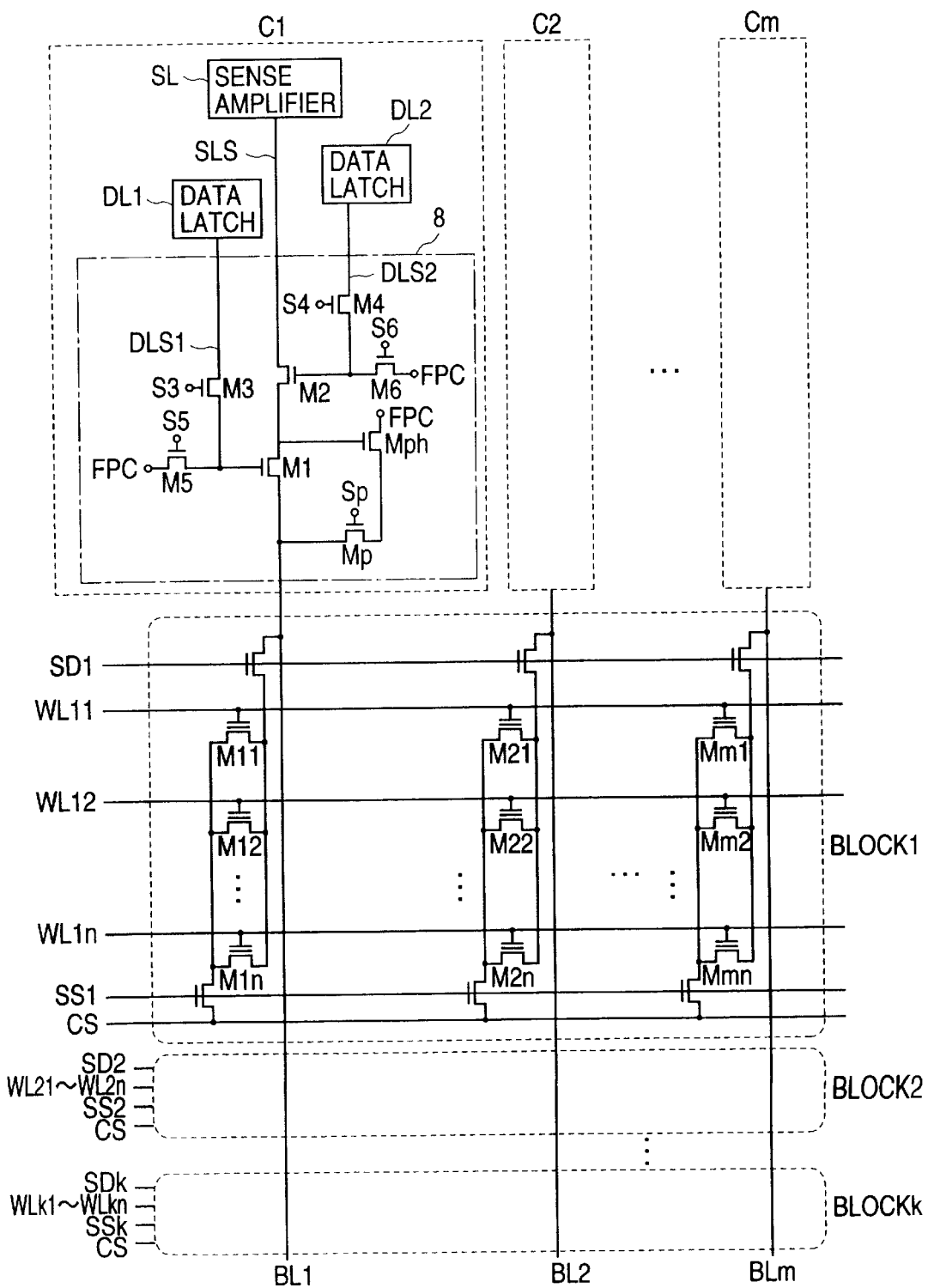
FIG. 29 is a circuit structure diagram for explaining a preferred Embodiment 8 of the present invention.

FIG. 29 shows a concrete circuit structure diagram of Embodiment 8. A memory array shown in FIG. 29 is, for example, an equivalent to the electrically rewritable NOR-type nonvolatile semiconductor memory array described in Japanese Patent Prepublication No. Hei 6-77437. The memory array comprises blocks BLOCK1 through BLOCKk where memory cells M11 through Mmn are arrayed in a matrix. Each BLOCKj memory array has structure wherein the drain terminals of the memory cells are connected in parallel to any of the sub-bit lines that are connected to the bit lines via select transistors MSD1 through MSDm, the source terminals thereof are connected in parallel to any of the sub-source lines that are connected to a common source line CS via select transistors MSS1 through MSSm, and the control gates thereof are connected to any of the word lines WLj1 through WLjn. The sub-bit lines and sub-source lines in the block are electrically insulated from each other.

Figure 30:
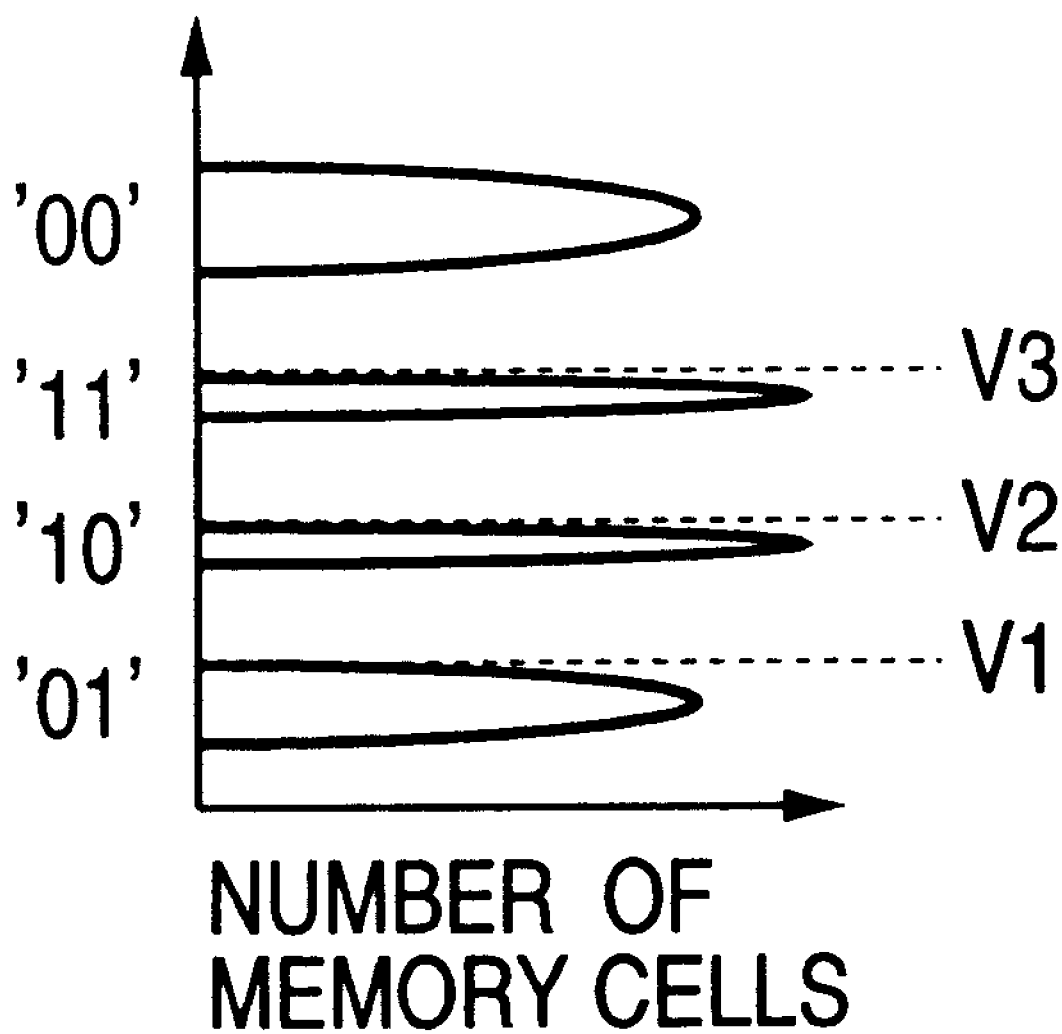
FIG. 30 is another example of distribution of threshold voltages of memory cells.

Here, the above memory cells are capable of storing information of two bits per cell and can be placed in four states of threshold voltages which are shown in FIG. 30. In FIG. 30, the erasure state is level '00' that is the highest threshold voltage and programming into the memory cells is performed by decreasing the threshold voltage to '11,' '10,' and '01.' Programming into the memory cells is accomplished by discharging the electrons from the floating gates thereof to the drain terminals thereof by means of FN tunneling current. The voltage requirements (as an example) of programming bias to cause this electron discharge are tabulated in Table 7.

TABLE 7

| Node | Voltage |
| --- | --- |
| Word line voltage | −9 V |
| Drain voltage | 4 V |
| Source line voltage | 0 V |
| Well voltage | 0 V |

Figure 31:
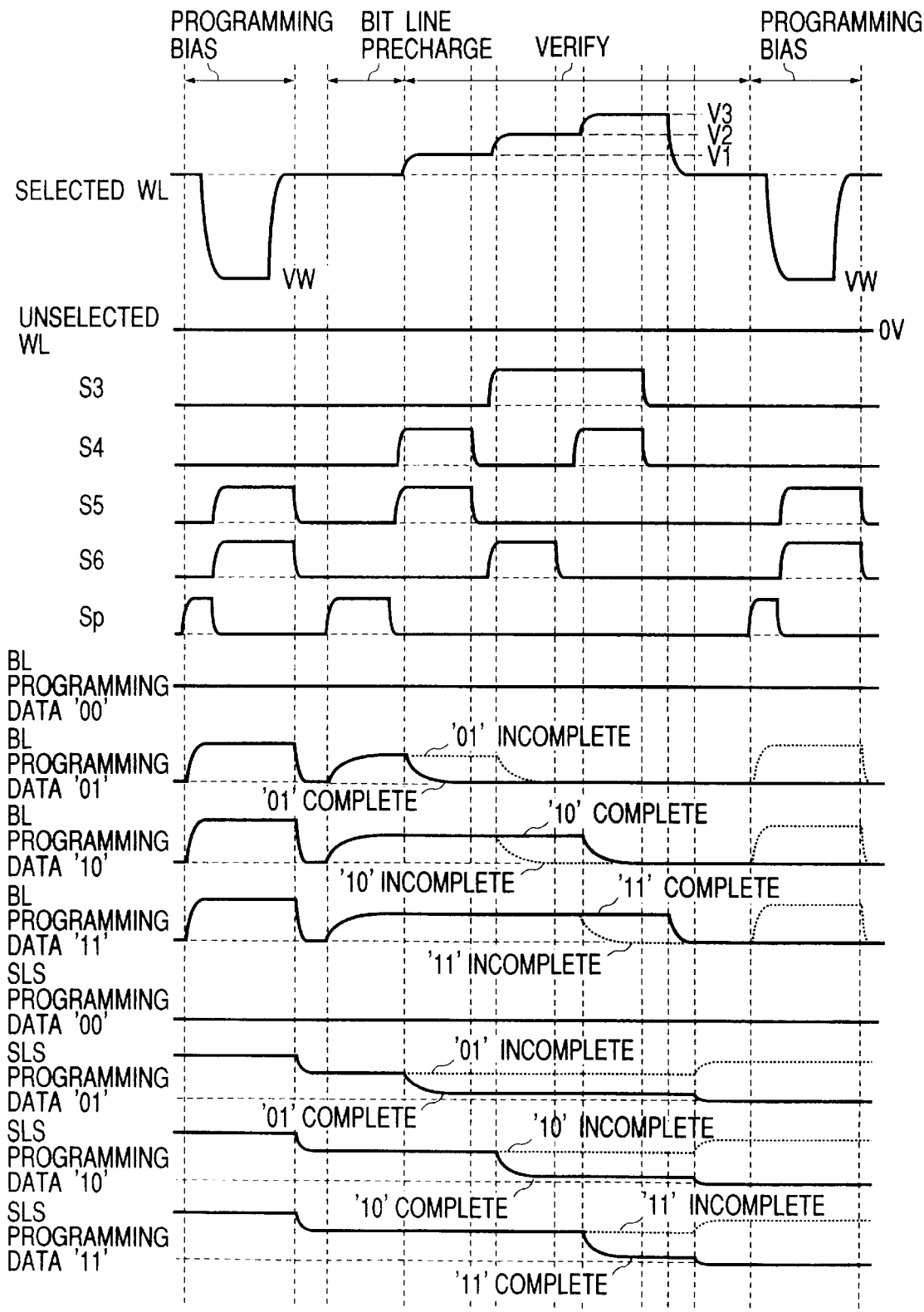
FIG. 31 is a timing chart for explaining programming and verification to be performed in Embodiment 8.

Using the timing chart shown in FIG. 31 together with FIGS. 29 and 30, programming and verification to be performed in Embodiment 8 will be explained below.

With the input of a programming instruction, programming data is transferred to the circuitry shown in FIG. 29 from outside and the upper bit of 2-bit data is stored into the data latch circuit DL1 and the lower bit of the data is stored into the data latch circuit DL2. The states of nodes DLS1 and DLS2 after 2-bit data is stored are as given in Table 3. To program data of bits '01,' '10,' and '11' into the memory cells, programming bias is then applied. The voltage requirements for programming bias are as given in Table 7. At this time, for the memory cells for which programming is to be executed, that is, those into which bits '01,' '10,' or '11' must be programmed, the nodes SLS for them are set at a drain voltage VWD for programming. For the memory cells for which programming is not to be executed, that is, those to have programming data of bits '00,' the nodes SLS for them are set a drain voltage 0 V to deselect programming.

After the application of programming bias, programming verify action is performed. Initially, a timing signal Sp rises, when only the bit lines for the memory cells into which data has been programming, placing the node SLS in the HI state, are selectively precharged up to, for example, 1 V and then put floating. This selective precharging is performed by the operation of a MOS transistor Mph connected in series with a MOS transistor Mp.

Subsequently, timing signals S4 and S5 rise, thereby selectively turning the MOS transistors M1 and M2 ON only for the programming data with the lower bit of '1,' that is, bits '01' and '11' and making the connection between bit line BL and sense amplifier SL. Next, selected word lines WL for target memory cells are set at a verify voltage V1 for '01" level (for example, 2 V) and verify action for '01' is performed. The memory cells where the threshold voltage is lower than the verify voltage V1, that is, '01' level programming is complete become alive and the bit line is discharged through the memory cells to the common source line CS. On the other hand, the memory cells where the threshold voltage is equal to or higher than the V1, that is, '01' level programming is incomplete are dead and the bit line remains at 1 V. In consequence, in the group of the memory cells into which bits '01' or '11' must be programmed, for a memory cell where '01' level programming is complete, the node SLS at which its bit line terminates is placed in the LO state, whereas, for a memory cell where the '01' level is not attained, the node SLS at which its bit line terminates remains in the HI state.

After the timing signals S4 and S5 fall, timing signals S3 and S6 rise, thereby selectively turning the MOS transistors M1 and M2 ON only for the programming data with the upper bit of '1,' that is, bits '10' and '11' and making the connection between bit line BL and sense amplifier SL. Subsequently, the WL voltage is set at a verify voltage V2 for '10' level (for example, 3 V) and verify action for '10' is performed. In consequence of this verify action, the memory cells where the threshold voltage is lower than the verify voltage V2 become alive and the bit line is discharged through the memory cells to the common source line CS. On the other hand, the memory cells where the threshold voltage is equal to or higher than the V2, that is, '10' level programming is incomplete are dead and the bit line remains charged. In consequence, in the group of the memory cells into which bits '10' or '11' must be programmed, for a memory cell where '10' level programming is complete, the node SLS at which its bit line terminates is placed in the LO state, whereas, for a memory cell where the '10' level is not attained, the node SLS at which its bit line terminates remains in the HI state. Meanwhile, as concerns the memory cells into which bits '01' must be programmed, the MOS transistor M1 is turned OFF and the bit line BL is not connected to the sense amplifier SL, and therefore the '01' verify results retained on the node SLS in the preceding verify action are not destroyed.

After the timing signals S3 and S6 fall, timing signals S3 and S4 rise, thereby selectively turning the MOS transistors M1 and M2 ON only for the bits '11' of programming data and making the connection between bit line BL and sense amplifier SL. Subsequently, the selected word line WL voltage is set at a verify voltage V3 for '11' level (for example, 4 V) and verify action for '11' is performed. In consequence of this verify action, the memory cells where the threshold voltage is lower than the verify voltage V3 become alive and the bit line is discharged through the memory cells to the common source line CS. On the other hand, the memory cells where the threshold voltage is equal to or higher than the V3, that is, '11' level programming is incomplete are dead and the bit line remains charged. In consequence, in the group of the memory cells into which bits '11' must be programmed, for a memory cell where programming of bits '11' is complete, the node SLS at which its bit line terminates is placed in the LO state, whereas, for a memory cell where the '11' level is not attained, the node SLS at which its bit line terminates remains in the HI state. Meanwhile, as concerns the memory cells into which bits '00, '01,' or '10' must be programmed, at least one of the MOS transistors M1 and M2 is turned OFF and the bit line BL is not connected to the sense amplifier SL. Therefore, the '01' and '10' verify results retained on the node SLS as the result of the verify actions performed before the '11' verify action are not destroyed.

Thereafter, the sense amplifier SL amplifies the supply voltage and executes sensing the memory data. Then, if the nodes SLS for all programming bit lines retain the LO states as the verify results, the sense amplifier SL judges the programming complete. However, if the HI state of at least one verify result of bits exists on any of the nodes SLS, this indicates that the memory cell that placed the node SLS in the LO state is insufficiently programmed. Then, programming action that follows selectively applies programming bias to this memory cell. At this time, programming bias is not applied to the memory cells for which the completion of programming has been verified.

Now, the programming action following verification will be detailed below. After sensing the memory data is executed as described above, if the HI state of at least one verify result of bits exists on any of the nodes SLS, the power supply voltage of the PMOS of the sense amplifier SL is set at VWD and the power supply voltage of the NMOS thereof is set at 0 V and then timing signals S5 and S6 rise. Thereby, the sense amplifier SL is connected to the bit line BL and then the bit line is charged, depending on the verify result state per memory cell on the SLS. For the HI state of the verify result of bits on the node SLS, indicating that the programming of the bits into the memory cell is incomplete, the bit line for the memory cell is charged at VWD. For the LO state of the verify result of bits on the node SLS, indicating that the programming of the bits into the memory cell is complete, the bit line for the memory cell is charged at 0 V.

Thereafter, control signals SDj rise, the drain terminals of the memory cells are charged at VWD or 0 V, and the word line voltage is set at VW, for example, −9 V. Thereby, programming starts. For a memory cell where programming is complete, its drain terminal is charged at 0 V and this weakens the electric field applied to the tunnel film (oxide), and consequently programming does not take place. For a memory cell where programming is incomplete, on the other hand, its drain is at VWD, for example, 4 V. Thus, the word line voltage VW, for example, −9 V causes the application of a strong electric field to the tunnel film (oxide), by which FN discharge from the floating gate to the drain terminal takes place.

Even for memory cells that use FN tunneling current to collect at the drain, Embodiment 8 enables a series of multilevel verify actions to be completed before the next programming action by setting timing to verify whether specific data has been programmed in each threshold voltage state of the memory cells, depending on the programming data. In addition, because static steady current does not flow across the memory cells, simultaneous programming verification for a great number of memory cells can be performed. A nonvolatile semiconductor memory device with a high programming throughput can be realized.

It is advisable to program, verify, and complete only the bits '11' data of the highest threshold voltage level in the initial phase, so that the required time per verify action can be reduced and faster programming can be achieved.

Furthermore, it is obvious that programming and verification for memory cells that are capable of storing data of three bits or more per cell can be implemented by modifying the circuitry within the scope that is easily presumable from the present Embodiment.

Embodiment 9

Figure 32A:
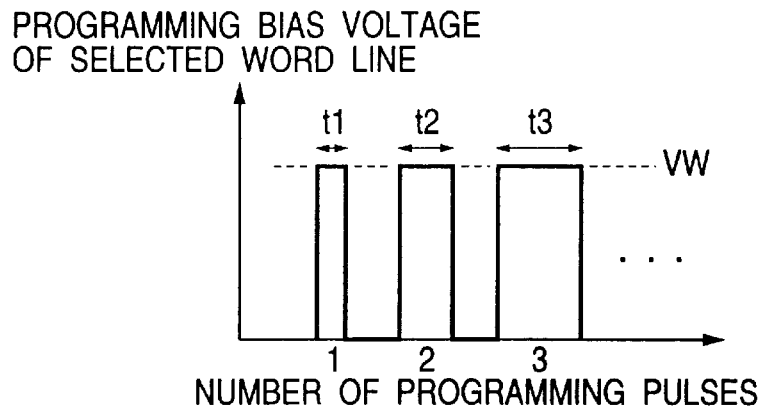
FIG. 32A is an illustration of waveforms for explaining a first example of the word line voltage for programming in Embodiment 9 and FIG. 32B is an illustration of waveforms for explaining a first example of the bit line voltage for programming in Embodiment 9.
Figure 32B:
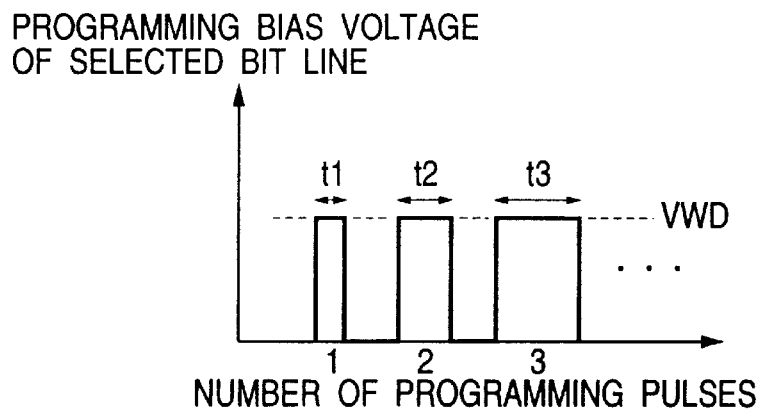

Using FIGS. 32 through 36, a preferred Embodiment 9 of the present invention will be explained below. The circuit structure of Embodiment 9 is the same as that of Embodiment 1 as shown in FIG. 7 and that of Embodiment 4 as shown in FIG. 20, but Embodiment 9 makes alteration to the action of applying programming bias for programming the memory cells. For the method of applying programming bias in Embodiment 9, as shown in FIG. 32A and FIG. 32B, the duration of application of programming bias that is a word line voltage VW and/or a bit line voltage VWD increases as the number of programming pulses increases. In other words, the pulse width of the pulse waveform of the word line voltage and/or bit line voltage increases. Increasing the duration of bias application in this way is implemented by modifying the structure of the timing controller 7.

Figure 33:
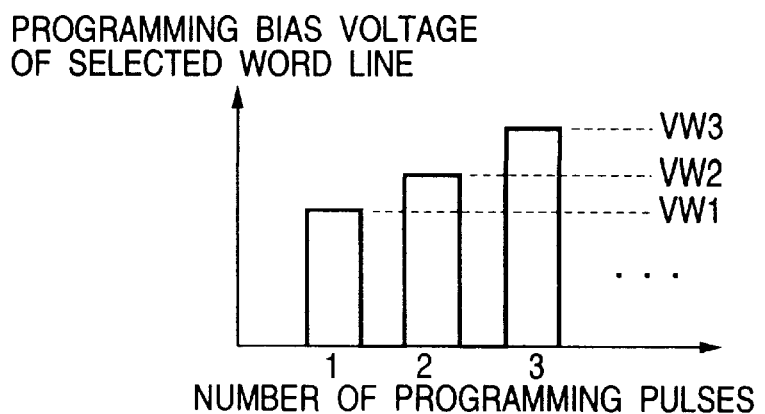
FIG. 33 is an illustration of waveforms for explaining a second example of the word line voltage for programming in Embodiment 9.
Figure 34:
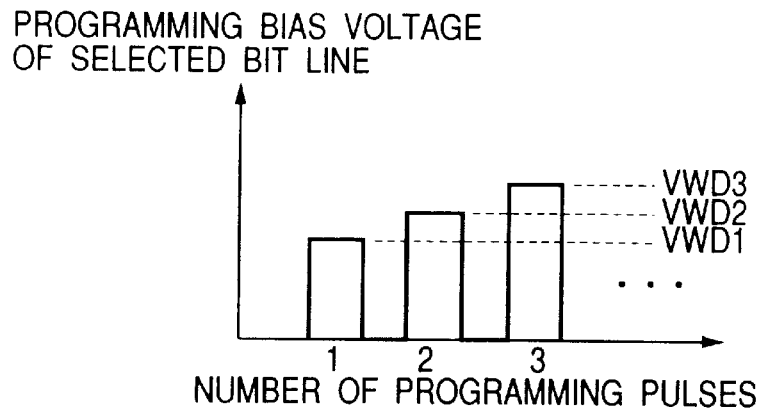
FIG. 34 is an illustration of waveforms for explaining a second example of the bit line voltage for programming in Embodiment 9.

In addition to the above method, several methods of applying programming bias can be used. A method as shown in FIG. 33 may be used in which the programming bias voltage of selected word line increases in order of VW1, VW2, . . . , as the number of times programming is verified increases. Another method as shown in FIG. 34 may be used in which the programming bias voltage of selected bit line increases in order of VWD1, VWD2, . . . , as the number of times programming is verified increases. For these methods, the pulse height of the pulse waveform of the word line voltage and/or bit line voltage increases.

Figure 35:
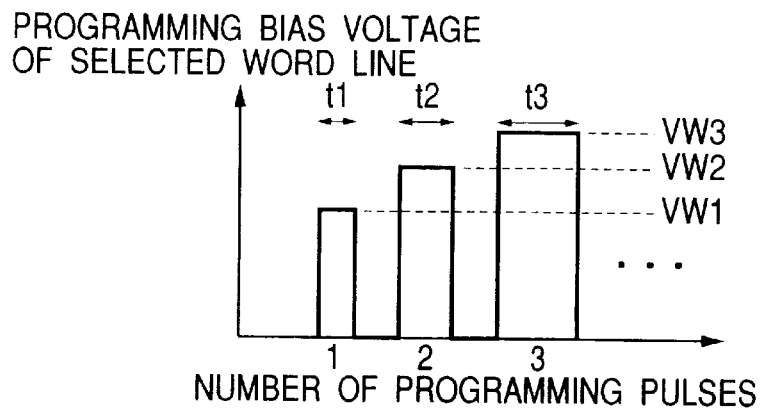
FIG. 35 is an illustration of waveforms for explaining a third example of the word line voltage for programming in Embodiment 9.
Figure 36:
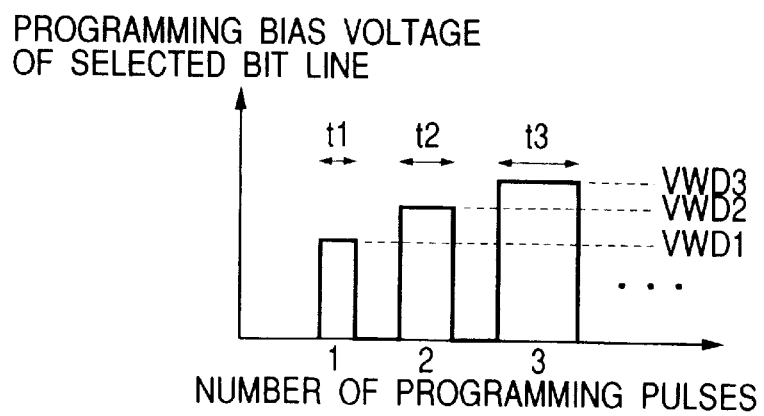
FIG. 36 is an illustration of waveforms for explaining a third example of the bit line voltage for programming in Embodiment 9.

Furthermore, it is possible to use a method as shown in FIG. 35, which is combination of the one shown in FIGS. 32A and (b) and the one shown in FIG. 33, and a method as shown in FIG. 36, which is combination of the one shown in FIGS. 32A and (b) and the one shown in FIG. 34.

The above methods of applying programming bias step up the threshold voltage and/or increase the pulse width in virtually constant steps from one programming pulse to the next and make it possible to restrain the entire programming from delaying due to the existence of partial memory cells that are low programming rates.

Similarly, the above methods of applying programming bias as shown in FIGS. 32 through 34 can apply to the circuit structure of Embodiment 5 as shown in FIG. 21 to produce the same effect.

Figure 37:
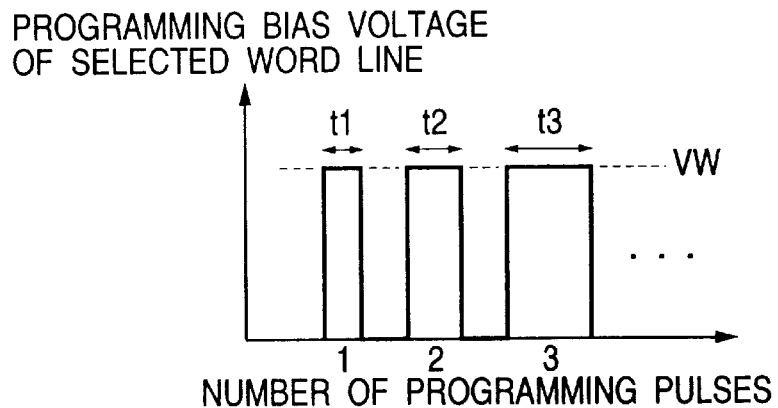
FIG. 37 is an illustration of waveforms for explaining a fourth example of the word line voltage for programming in Embodiment 9.
Figure 38:
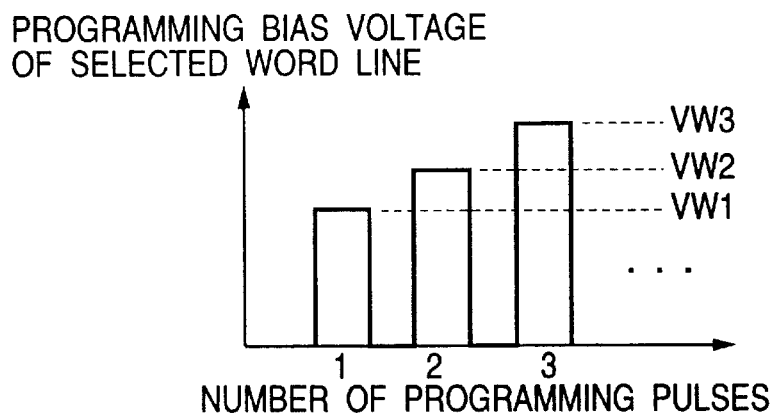
FIG. 38 is an illustration of waveforms for explaining a fifth example of the word line voltage for programming in Embodiment 9.
Figure 39:
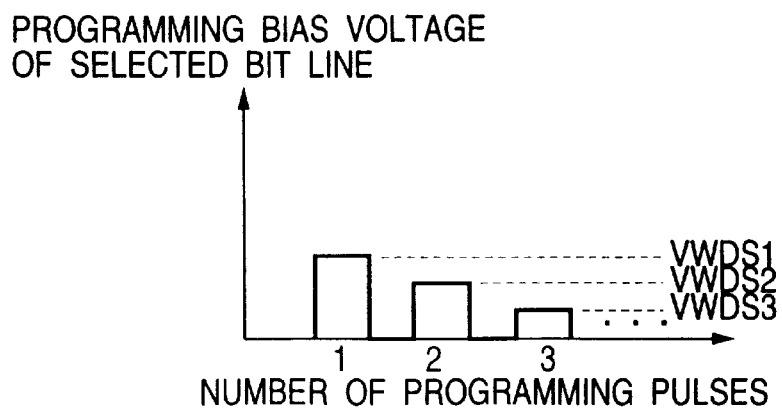
FIG. 39 is an illustration of waveforms for explaining a fourth example of the bit line voltage for programming in Embodiment 9.
Figure 40:
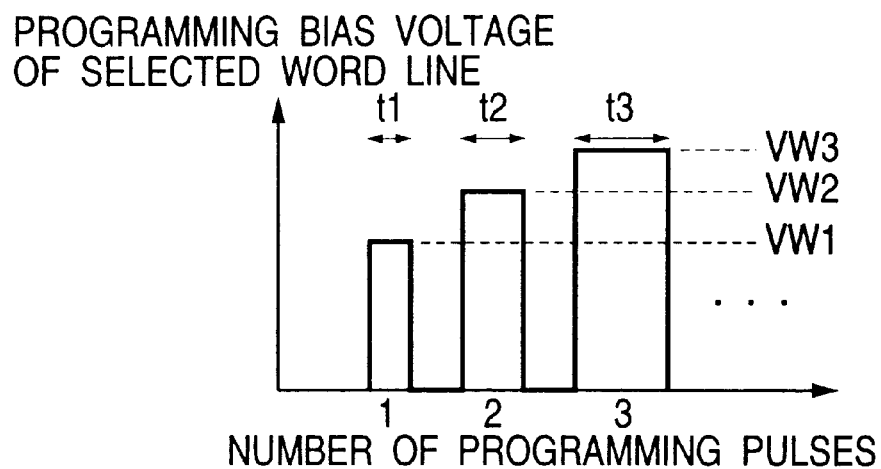
FIG. 40 is an illustration of waveforms for explaining a sixth example of the word line voltage for programming in Embodiment 9.
Figure 41:
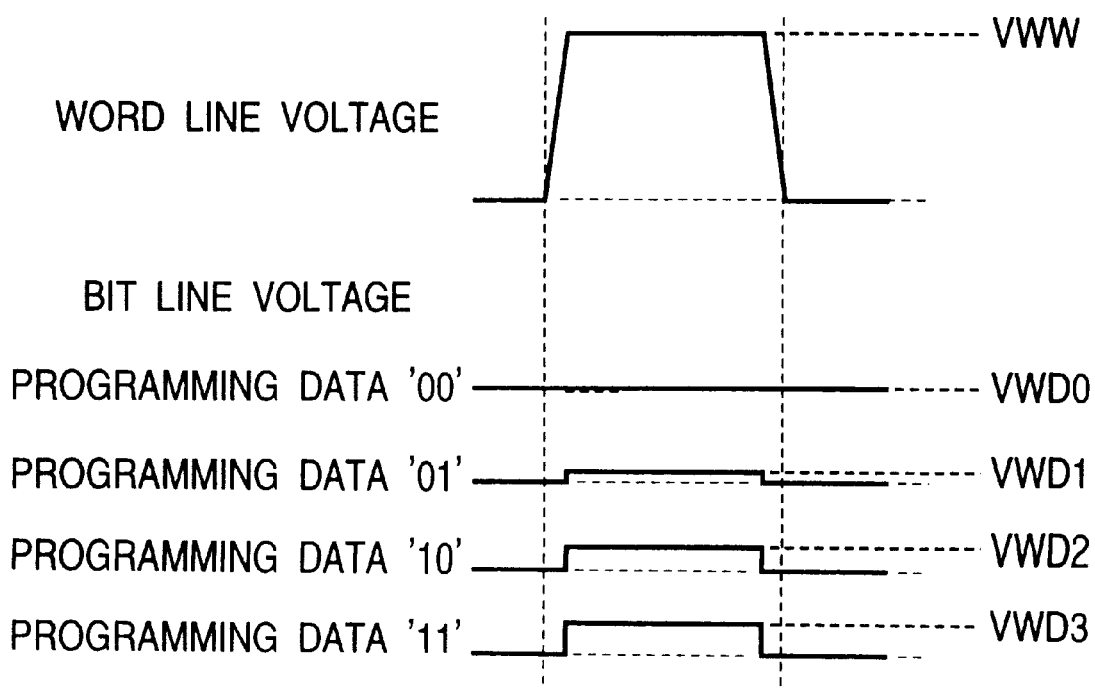
FIG. 41 is an illustration of waveforms for explaining examples of the word line voltage and the bit line voltage for programming in a preferred Embodiment 10 of the present invention.

For the circuit structure diagram of Embodiment 6 as shown in FIG. 23 and the circuit structure diagram of Embodiment 7 as shown in FIG. 26, a method as shown in FIG. 37 can be used in which the duration of programming bias application increases as the number of times programming is verified increases. Moreover, it is possible to use a method as shown in FIG. 38 in which the programming bias voltage of selected word line increases in order of VW1, VW2, . . . , as the number of times programming is verified increases and a method as shown in FIG. 39 in which the programming bias voltage of selected bit line decreases in order of VWDS1, VWDS2, . . . , as the number of times programming is verified increases. It is also possible to use a method as shown in FIG. 40 in which the duration of programming bias application increases and the voltage of selected word line increases as the number of times programming is verified increases. Application of any of these programming bias application methods can produce the same effect as described above.

Embodiment 10

Using FIGS. 41 through 44, a preferred Embodiment 10 of the present invention will be explained below. The circuit structure of Embodiment 10 is the same as that of Embodiment 1 as shown in FIG. 7, but Embodiment 10 makes alteration to the action of applying programming bias for programming the memory cells. In the case of Embodiment 1, by applying bias of same amplitude for same duration, the application of programming bias is executed simultaneously for a plurality of threshold voltages. In this case, because the quantity of charge per programming action is constant, regardless of the threshold voltage level, it takes longer to apply programming bias for programming in the state of higher threshold voltage.

In Embodiment 10, when carrying out programming by HE injection for all programming levels corresponding to the threshold voltage states shown in FIG. 8, the word line voltage is constant at VWW, while the bit line voltage, that is, bias voltage steps up from VWD0 to VWD3 for the lowest to highest threshold voltage levels of programming. Thereby, the duration of programming bias application will be virtually the same for all programming levels and this reduces the programming time in total.

Figure 42:
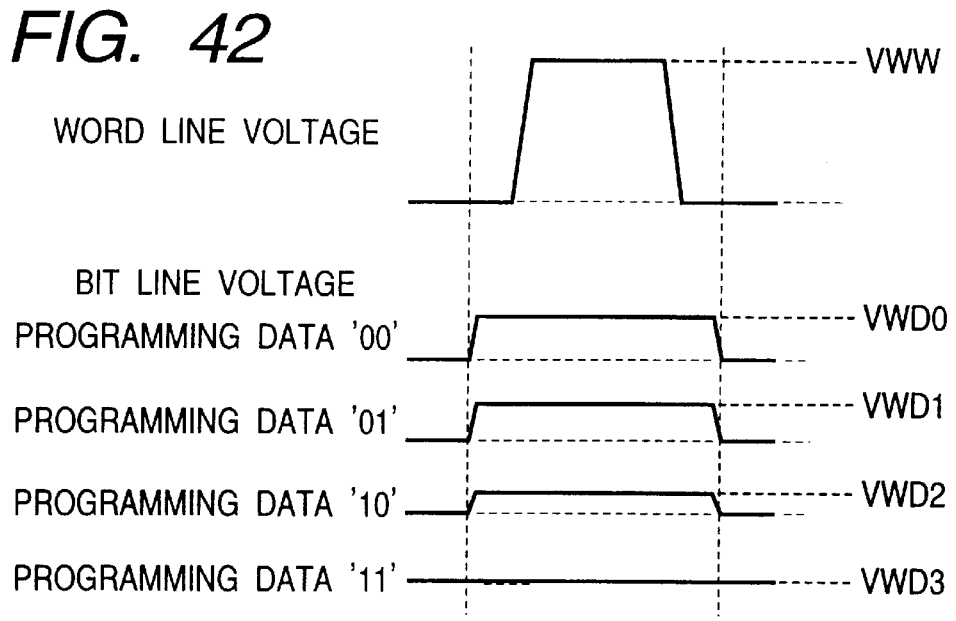
FIG. 42 is an illustration of waveforms for explaining second examples of the word line voltage and the bit line voltage for programming in Embodiment 10.

The same programming bias application method can apply to another circuitry, for example, the circuit structure of Embodiment 6 where programming is executed by injecting electrons with FN tunneling current. For programming on the programming levels corresponding to the threshold voltage states shown in FIG. 8, as shown in FIG. 42, the voltage difference between the bit line voltage and the word line voltage will be greater as the level of threshold voltage for programming goes higher. Specifically, such a method is used that the word line voltage is set constant at VWW, while the bit line voltage for each level is set to step down from VWD0 to VWD3.

Figure 43:
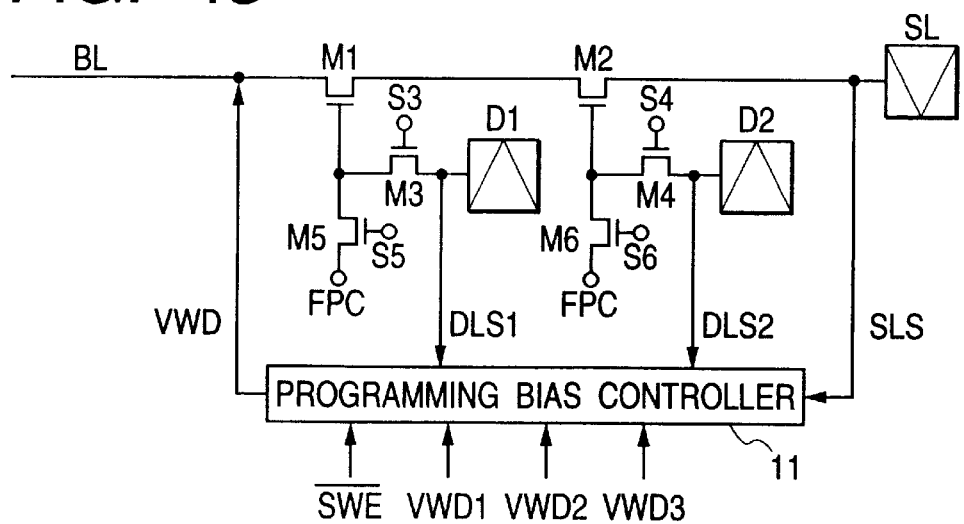
FIG. 43 is a circuit structure diagram for explaining how programming bias is applied in Embodiment 10.

Programming bias whose voltage changes, depending on the programming data can be produced by using a circuit scheme such as, for example, the one shown in FIG. 43. This circuit scheme is provided with a programming bias controller 11 per bit line instead of the program bias controller 5. The programming bias controller 11 that provides the means to apply programming bias selects programming bias from VWD1, VWD2, and VWD3, according to the voltage of the nodes DLS1 and DLS2 of the programming data latch circuits DL1 and DL2 and the node SLS of the sense amplifier, and outputs the appropriate programming bias to the bit line BL by using a programming control signal SME.

Figure 44:
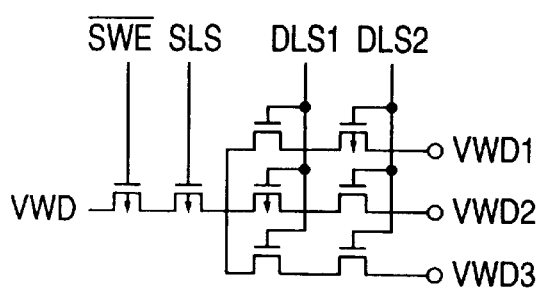
FIG. 44 is a circuit diagram for explaining an example of a programming bias controller used in Embodiment 10.

FIG. 44 shows an example of the concrete structure of the programming bias controller 11. Programming bias is selected by an NMOS transistor with a gate to which the node DLS1 is connected and a PMOS transistor with a gate to which the node DLS2 is connected. An insufficiently programmed memory cell is selected by a PMOS transistor with a gate to which the node SLS is connected. Programming time is set by a PMOS transistor with a gate to which the programming control signal SME is input.

Embodiment 11

Using FIGS. 45 and 46, a preferred Embodiment 11 of the present invention will be explained below. Although the programming bias controller 11 is used per bit line in Embodiment 10, on the other hand, in Embodiment 11, different programming phases are first assigned to different programming levels during a programming period and the circuitry for programming is simplified by setting phase and programming bias per programming level.

Figure 45:
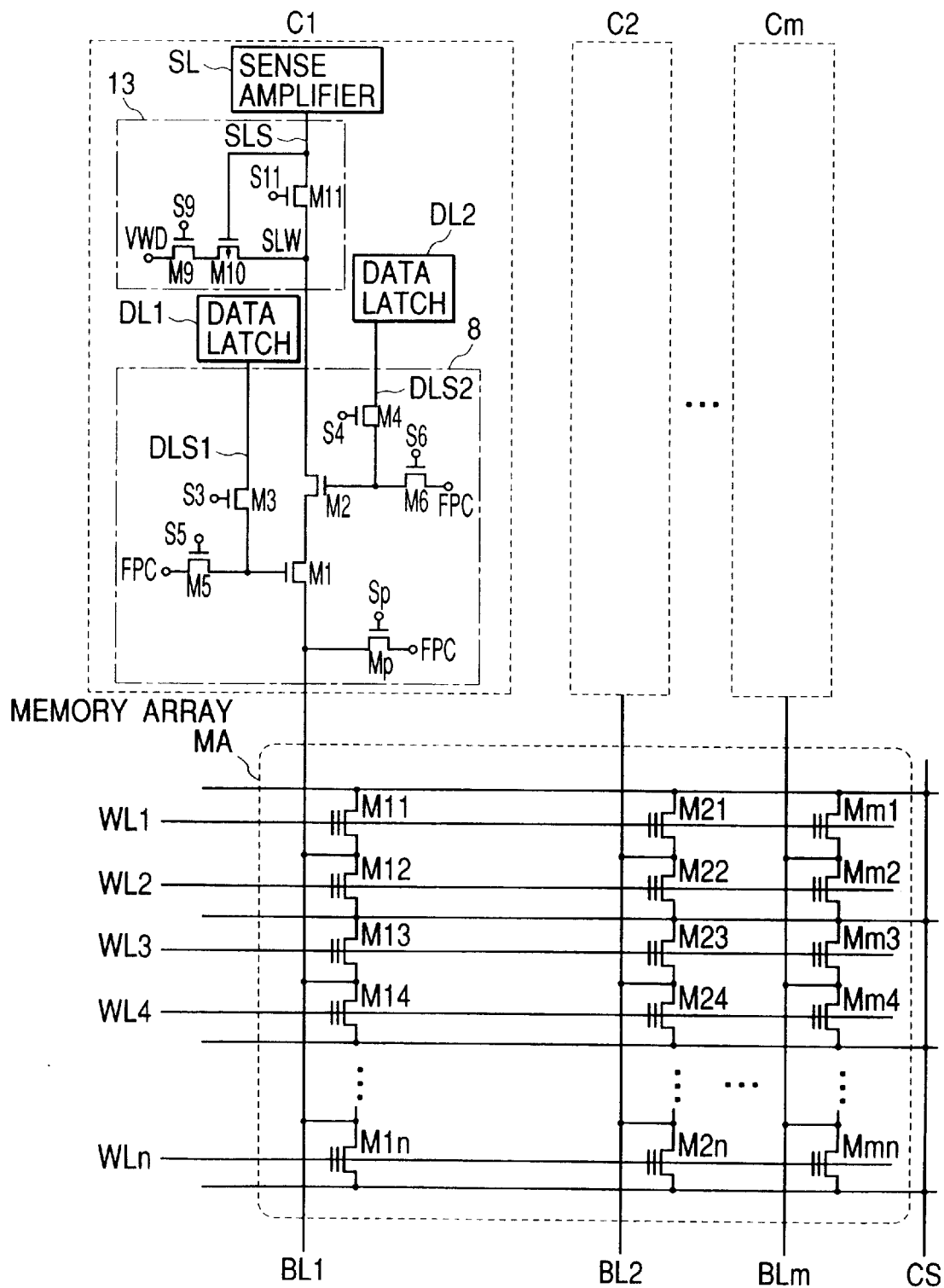
FIG. 45 is a circuit structure diagram for explaining a preferred Embodiment 11 of the present invention.
Figure 46:
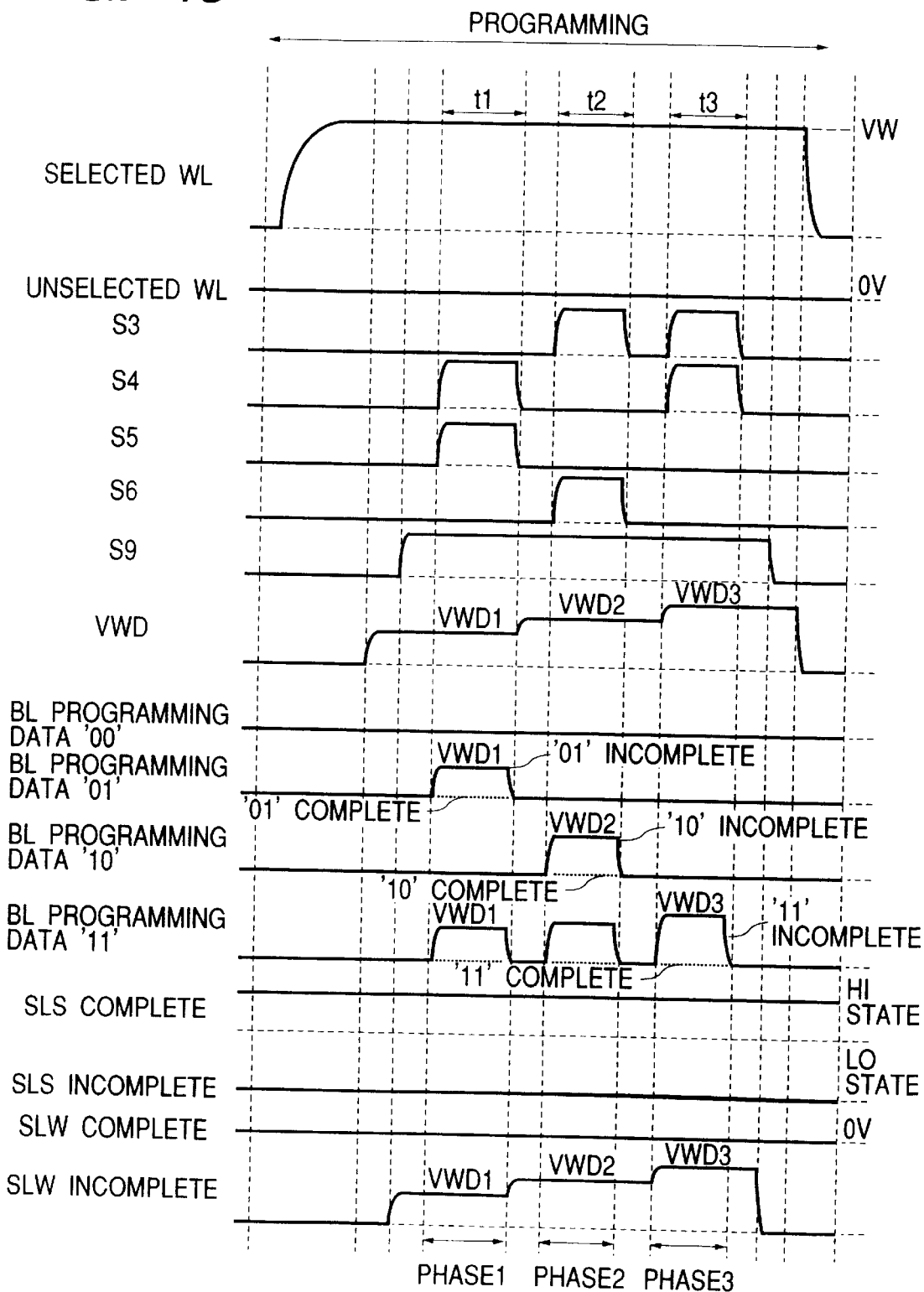
FIG. 46 is a timing chart for explaining programming to be performed in Embodiment 11.

The circuit structure of Embodiment 11, shown in FIG. 45, is substantially the same as that of Embodiment 1 shown in FIG. 7, except that a bias control circuit 13 to control the node SLS is installed between the sense amplifier SL and the MOS transistor M2. The bias control circuit 13 to control the node SLS comprises NMOS transistors M9 and M11 that receive timing signals S9 and S11 respectively and a PMOS transistor M10 controlled by the voltage of the node SLS. In addition, a node SLW is provided between the circuit 13 and the MOS transistor M2. As timing signals S3 through S6, control pulses are applied to establish timing during the programming period. Verification is performed in the same way as in Embodiment 1.

As the result of verification, if incompletely programmed memory cell exist, the node SLS retains the LO states as the verify results of these memory cells. Then, programming bias application action is performed, following the verify action. In Embodiment 11, bias application is executed in the phases in which specific data is programmed, as noted above, in order to apply different programming bias for different programming data. Using the timing chart shown in FIG. 46, how programming bias is applied in Embodiment 11 will be explained.

Initially, the programming bias voltage on selected word lines WL for programming is set at VW (for example, 12 V).

In phase 1, a programming drain bias VWD that is applied to the transistor M9 is set at VWD1 (for example, 3 V) and a timing signal S9 rises to a sufficiently higher voltage than 3 V, thereby charging the node SLW at 3 V, providing the node is to make the connection to the bit line that has put the node SLS in the LO state. Subsequently, timing signals S4 and S5 rise, thereby turning the MOS transistors M1 and M2 ON only for the programming data of bits '01' and '11' and making the connection between bit line BL and node SLW. Then, in the group of the memory cells into which bits '01' or '11' must be programmed, for a memory cell judged programming incomplete by the preceding verify action, a programming bias of 3 V is applied to the bit line to it, and HE injection thereby takes place to program the data into it. When the timing signals S4 and S5 fall, the phase 1 terminates, then phase 2 programming follows.

In phase 2, the programming drain bias VWD is set at VWD2 (for example, 4 V) and the timing signal S9 rises to a sufficiently higher voltage than 4 V, thereby charging the node SLW at 4 V, providing the node is to make the connection to the bit line that has put the node SLS in the LO state. Subsequently, timing signals S3 and S6 rise, thereby turning the MOS transistors M1 and M2 ON only for the programming data of bits '10' and '11' and making the connection between bit line BL and node SLW. Then, in the group of the memory cells into which bits '10' or '11' must be programmed, for a memory cell judged programming incomplete by the preceding verify action, a programming bias of 4 V is applied to the bit line to it, and HE injection thereby takes place in it. The programming bias applied to the memory cell to cause HE injection in phase 2 is higher than that in phase 1. Thus, the higher programming voltage is applied for '10' level programming for which a higher threshold voltage than '01' level is set and this enables the programming to finish in a time equal to the time required for '01' programming. When the timing signals S3 and S6 fall, the phase 2 terminates, then phase 3 programming follows.

In phase 3, the programming drain bias VWD is set at VWD3 (for example, 5 V) and the timing signal S9 rises to a sufficiently higher voltage than 5 V, thereby charging the node SLW at 5 V, providing the node is to make the connection to the bit line that has put the node SLS in the LO state. Subsequently, timing signals S3 and S4 rise, thereby turning the MOS transistors M1 and M2 ON only for the programming data of bits '11' and making the connection between bit line BL and node SLW. Then, in the group of the memory cells into which bits '11' must be programmed, for a memory cell judged programming incomplete by the preceding verify action, a programming bias of 5 V is applied to the bit line to it, and HE injection thereby takes place to program the data into it. The programming bias applied to the memory cell to cause HE injection in phase 3 is higher than that in phase 1 and phase 2. That is, the greatest programming bias is applied for '11' level programming for which the highest threshold voltage is set and this enables the '11' programming to finish in a time equal to the time required for '01' and '10' programming. When the timing signals S3 and S4 fall, the phase 3 terminates, and subsequently the verification procedure starts to verify whether programming is complete.

The above-mentioned word line voltage for the phases and the bit line voltages for the programming levels in Embodiment 11 are tabulated in Table 8.

TABLE 8

|  | Phase 1 | Phase 2 | Phase 3 |
|---|---|---|---|
| Word line voltage | 13 V | 13 V | 13 V |
| '01' | 3 V | 0 V | 0 V |
| '10' | 0 V | 4 V | 0 V |
| '11' | 3 V | 4 V | 5 V |

The transistors M1 through M6 constitute the timing selecting circuit 8 when verification is performed and provide a means for selecting memory cells to be programmed when programming is performed.

The timing signals S3 through S6 to start the programming phases are easily generated by the timing controller 7 (see FIGS. 1, 4, and 5).

As described above, Embodiment 11 makes it possible to apply different programming bias for different level programming without installing the programming bias controller 11 shown in FIG. 44 per bit line. This reduces the programming time in total.

Embodiment 12

Figure 47:
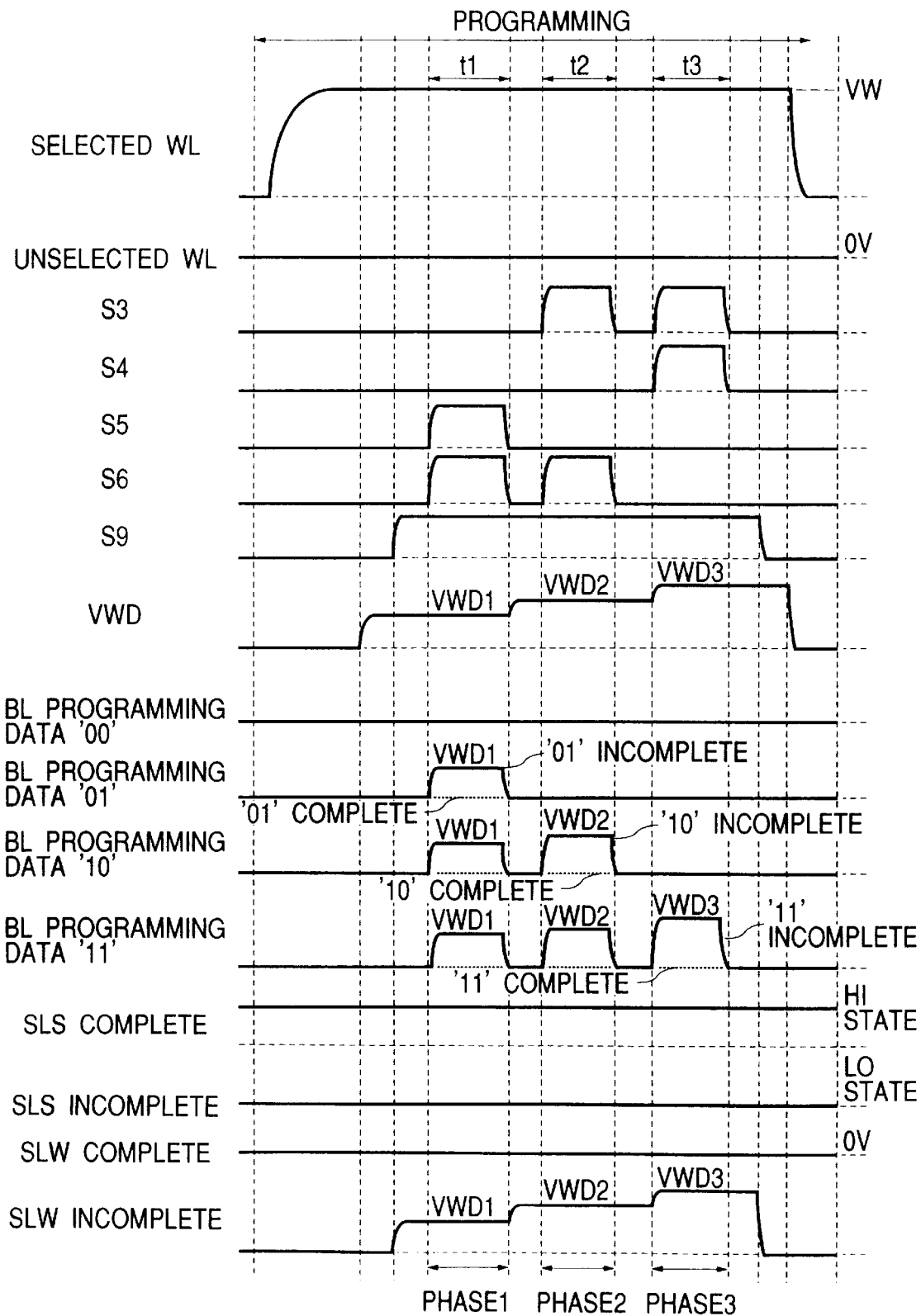
FIG. 47 is a timing chart for explaining programming to be performed in a preferred Embodiment 12 of the present invention.

Using FIG. 47, a preferred Embodiment 12 of the present invention will be explained below.

For Embodiment 11, as is obvious from Table 8, the VWD1 programming bias is not applied to the bit line to a memory cell into which bits '10' must be programmed in the phase 1.

Embodiment 12 allows the programming bias to be applied even to a memory cell into which bits '10' must be programmed even in the phase 1, thus implementing more efficient programming.

As the result of verification executed as in Embodiment 1, if incompletely programmed memory cells exist, the node SLS retains the LO states as the verify results of these memory cells. Then, programming bias application action is performed, following the verify action. In Embodiment 12, which is similar to Embodiment 11, bias application is executed in the phases in which specific data is programmed in order to apply different programming bias for different programming data. Using the timing chart shown in FIG. 47, how programming bias is applied in Embodiment 12 will be explained.

In phase 1, the programming bias voltage on selected word lines WL is set at VW, for example, 12 V. Then, a programming drain bias VWD is set at VWD1 (for example, 3 V) and a timing signal S9 rises to a sufficiently higher voltage than 3 V, thereby charging the node SLW at 3 V, providing the node is to make the connection to the bit line that has put the node SLS in the LO state. Subsequently, timing signals S5 and S6 rise, thereby turning the MOS transistors M1 and M2 ON for all programming data and making the connection between bit line BL and node SLW. Then, for a memory cell judged programming incomplete by the preceding verify action (including '10' level in addition to '01' and '11' levels), a programming bias of 3 V is applied to the bit line to it, and HE injection thereby takes place to program the data into it. When the timing signals S5 and S6 fall, the phase 1 terminates, then phase 2 programming follows.

In phase 2, the programming drain bias VWD is set at VWD2 (for example, 4 V) and the timing signal S9 rises to a sufficiently higher voltage than 4 V, thereby charging the node SLW at 4 V, providing the node is to make the connection to the bit line that has put the node SLS in the LO state. Subsequently, timing signals S3 and S6 rise, thereby turning the MOS transistors M1 and M2 ON for only the programming data of bits '10' and '11' and making the connection between bit line BL and node SLW. Then, in the group of the memory cells into which bits '10' or '11' must be programmed, for a memory cell judged programming incomplete by the preceding verify action, a programming bias of 4 V is applied to the bit line to it, and HE injection thereby takes place in it. The programming bias applied to the memory cell to cause HE injection in phase 2 is higher than that in phase 1. Thus, the higher programming voltage is applied for '10' level programming for which a higher threshold voltage than '01' level is set. To the memory cell into which bits '10' must be programmed, programming bias has been applied in the phase 1 as described above, and the application of the higher bias can increase the programming rate. Consequently, this enables the '10' programming to finish in a time equal to or shorter than the time required for '01' programming. When the timing signals S3 and S6 fall, the phase 2 terminates, then phase 3 programming follows.

In phase 3, the programming drain bias VWD is set at VWD3 (for example, 5 V) and the timing signal S9 rises to a sufficiently higher voltage than 5 V, thereby charging the node SLW at 5 V, providing the node is to make the connection to the bit line that has put the node SLS in the LO state. Subsequently, timing signals S3 and S4 rise, thereby turning the MOS transistors M1 and M2 ON only for the programming data of bits '11' and making the connection between bit line BL an node SLW. Then, in the group of the memory cells into which bits '11' must be programmed, for a memory cell judged programming incomplete by the preceding verify action, a programming bias of 5 V is applied to the bit line to it, and HE injection thereby takes place to program the data into it. The programming bias applied to the memory cell to cause HE injection in phase 3 is higher than that in phase 1 and phase 2.

To the memory cell into which bits '11' must be programmed, programming bias has been applied in the phases 1 and 2, and the application of the greatest programming bias enables the '11' programming to finish in a time equal to or shorter than the time required for '01' and '10' programming. When the timing signals S3 and S4 fall, the phase 3 terminates, and subsequently the verification procedure starts to verify whether programming is complete.

In Embodiment 12, as will be obvious from Table 9, because the VWD1 programming bias is applied even to the bit line a memory cell into which bits '10' must be programmed in the phase 1, this can implement efficient programming.

TABLE 9

|  | Phase 1 | Phase 2 | Phase 3 |
|---|---|---|---|
| Word line voltage | 13 V | 13 V | 13 V |
| '01' | 3 V | 0 V | 0 V |
| '10' | 3 V | 4 V | 0 V |
| '11' | 3 V | 4 V | 5 V |

Embodiment 13

Figure 48:
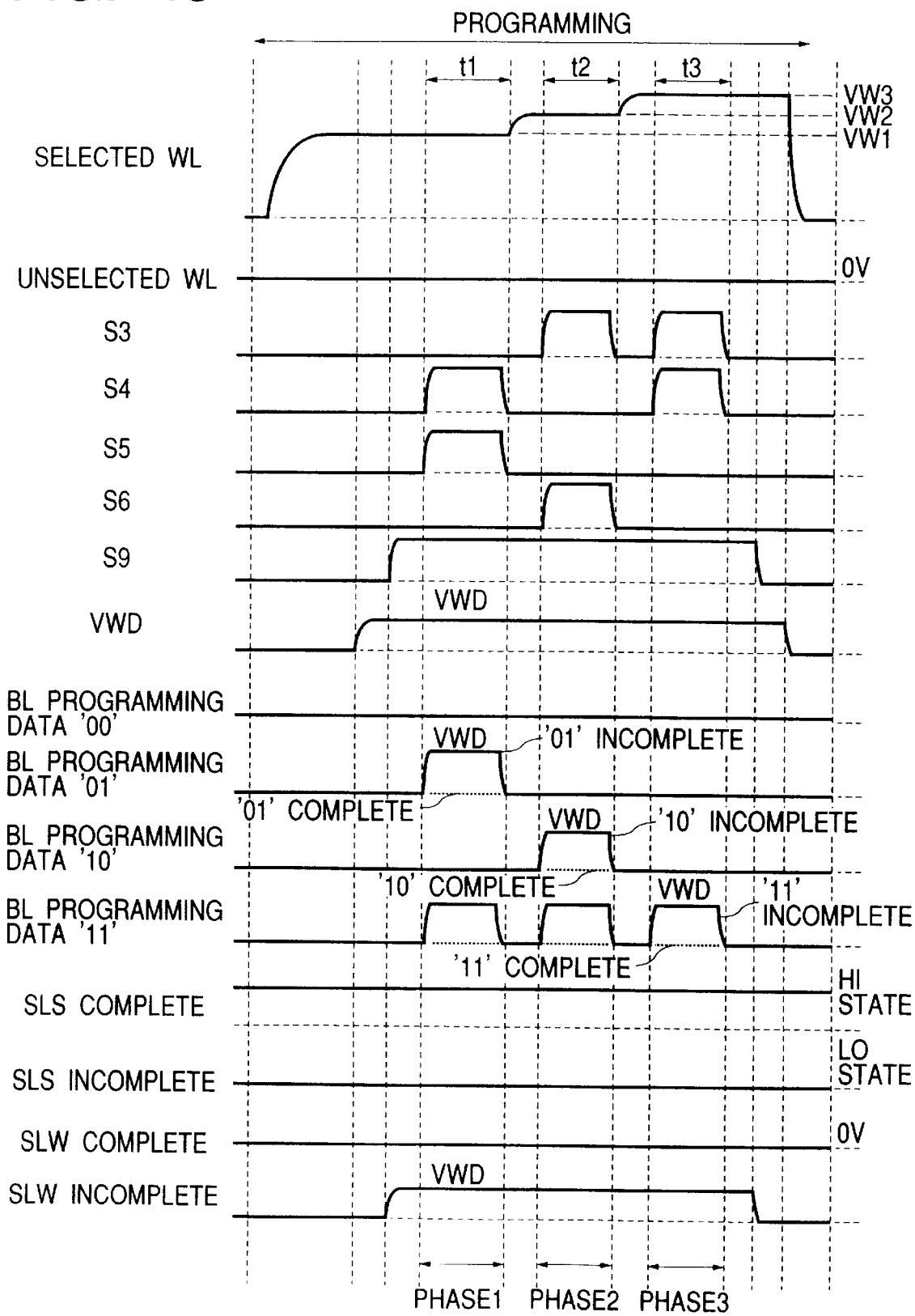
FIG. 48 is a timing chart for explaining programming to be performed in a preferred Embodiment 13 of the present invention.

Using FIG. 48, a preferred Embodiment 13 will be explained below.

For the purpose of applying different bias to program different programming data, Embodiments 11 and 12 take the steps of controlling the bit line voltage, or in other words, the drain voltage of a memory cell, whereas Embodiment 13 takes the steps of controlling the word line voltage, or in other words, the gate voltage of a memory cell.

The circuit structure of Embodiment 13 is the same as that of Embodiment 11 shown in FIG. 45.

As the result of verification executed as in Embodiment 1, if incompletely programmed memory cells exist, the node SLS retains the LO states as the verify results of these memory cells. Then, programming bias application action is performed, following the verify action. Using the timing chart shown in FIG. 48, how programming bias is applied in Embodiment 13 will be explained.

Initially, the voltage on the word lines WL for target memory cells into which data must be programmed is set at a first programming word line voltage VWW1 (for example, 12 V).

In phase 1, a timing signal S9 rises to a programming drain voltage VWD (a voltage that is sufficiently higher than 4 V, for example, 7 V), thereby charging the node SLW at 4 V, providing the node is connected to the bit line that has put the node SLS in the LO state. Subsequently, timing signals S4 and S5 rise, thereby turning the MOS transistors M1 and M2 ON only for the programming data of bits '01' and '11.' Then, for a memory cell judged programming incomplete by the preceding verify action, a programming bias of 4 V is applied to the bit line to it, and HE injection thereby takes place to program the data into it. When the timing signals S4 and S5 fall, the phase 1 terminates, then phase 2 programming follows.

In phase 2, the word line WL voltage is set at a second programming word line voltage VWW2 (for example, 13 V) and timing signals S3 and S6 rise, thereby turning the MOS transistors M1 and M2 ON only for the programming data of bits '10' and '11.' Then, for a memory cell judged programming incomplete by the preceding verify action, a programming bias of 4 V is applied to the bit line to it, and HE injection thereby takes place in the memory cell into which bits '10' or '11' must be programmed. When this HE injection is carried out, the programming bias higher than that for '01' programming is applied to the memory cell to cause HE injection. When the timing signals S3 and S6 fall, the phase 2 terminates, then phase 3 follows.

In phase 3, the word line WL voltage is set at a third voltage VWW3 (for example, 14 V) and timing signals S3 and S4 rise, thereby turning the MOS transistors M1 and M2 ON only for the programming data of bits '11.' Then, for a memory cell judged programming incomplete by the preceding verify action, a programming bias of 4 V is applied to the bit line to it, and HE injection thereby takes place to program the data into it. The programming bias applied to cause this HE injection is even higher than that for '01' and '10' programming, thus enabling more efficient programming of bits '11.' When the timing signals S3 and S4 fall, the phase 3 terminates, and subsequently the verification procedure starts to verify whether programming is complete.

Generating a word line WL voltage that is different per phase can easily be implemented by modifying the structure of the word line voltage driver 2 (see FIGS. 1, 4, and 5).

The above-mentioned word line voltages for the phases and the bit line voltage for the programming levels in Embodiment 13 are tabulated in Table 10.

TABLE 10

|  | Phase 1 | Phase 2 | Phase 3 |
|---|---|---|---|
| Word line voltage | 12 V | 13 V | 14 V |
| '01' | 4 V | 0 V | 0 V |
| '10' | 0 V | 4 V | 0 V |
| '11' | 4 V | 4V | 4 V |

As described above, by turning the MOS transistors ON, depending on the programming data, and taking control steps such that the programming drain voltage is applied to the target memory cells at desired timing of the rise of the word line voltage, Embodiment 13 enables the application of programming bias appropriate for data level and thus reduces the programming time in total.

Embodiment 14

Figure 49:
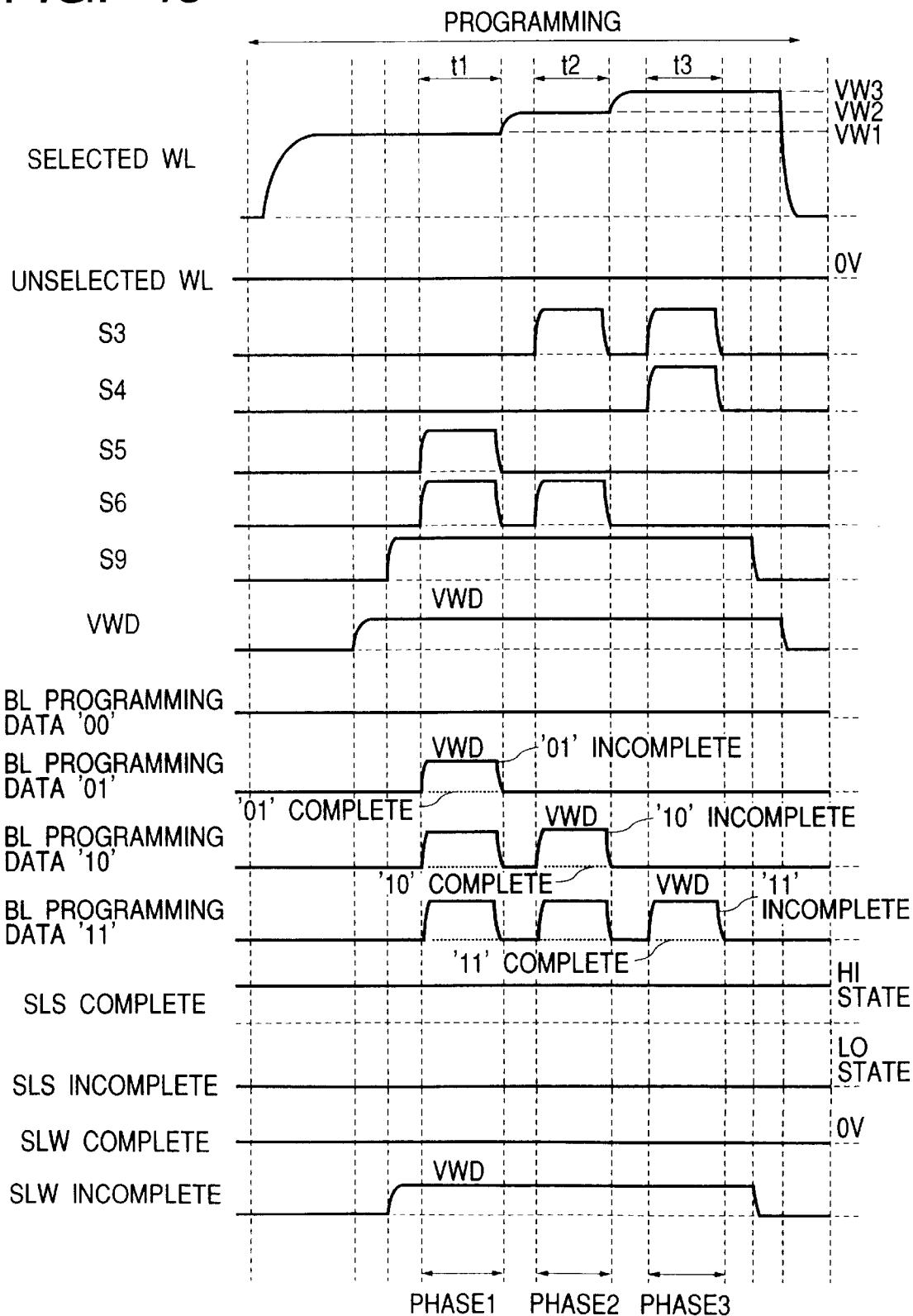
FIG. 49 is a timing chart for explaining programming to be performed in a preferred Embodiment 14 of the present invention.

Using FIG. 49, a preferred Embodiment 14 of the present invention will be explained below.

For Embodiment 13, as is obvious from Table 10, the programming bias is not applied to a memory cell into which bits '10' must be programmed in the phase 1.

Embodiment 14 allows the programming bias to be applied even to a memory cell into which bits '10' must be programmed even in the phase 1, thus implementing more efficient programming.

As the result of verification executed as in Embodiment 1, if incompletely programmed memory cells exist, the node SLS retains the LO states as the verify results of these memory cells. Then, programming bias application action is performed, following the verify action. Programming is executed in the phases in which specific data is programmed in order to apply different programming bias for different programming data.

In phase 1, the voltage on the word lines WL for target memory cells into which data must be programmed is set at a first word line voltage VWW1 (for example, 12 V). Then, a timing signal S9 rises to a programming drain voltage VWD (a voltage that is sufficiently higher than 4 V, for example, 7 V), thereby charging the node SLW at 4 V, providing the node is connected to the bit line that has put the node SLS in the LO state. Subsequently, timing signals S5 and S6 rise, thereby turning the MOS transistors M1 and M2 ON for all programming data. Then, for a memory cell judged programming incomplete by the preceding verify action (including '10' level in addition to '01' and '11' levels), a programming bias of 4 V is applied to the bit line to it, and HE injection thereby takes place to program the data into it. When the timing signals S5 and S6 fall, the phase 1 terminates, then phase 2 programming follows.

In phase 2, the word line WL voltage is set at a second programming word line voltage VWW2, for example, 13 V, and timing signals S3 and S6 rise, thereby turning the MOS transistors M1 and M2 ON only for the programming data of bits '10' and '11.' Then, for a memory cell judged programming incomplete by the preceding verify action, a programming bias of 4 V is applied to the bit line to it, and HE injection thereby takes place in the memory cell into which bits '10' or '11' must be programmed. When this HE injection is carried out, the programming bias higher than that for '01' programming is applied to the memory cell to cause HE injection. When the timing signals S3 and S6 fall, the phase 2 terminates, then phase 3 follows.

In phase 3, the word line WL voltage is set at a third voltage VWW3, for example, 14 V, and timing signals S3 and S4 rise, thereby turning the MOS transistors M1 and M2 ON only for the programming data of bits '11.' Then, for a memory cell judged programming incomplete by the preceding verify action, a programming bias of 4 V is applied to the bit line to it, and HE injection thereby takes place to program the data into it. The programming bias applied to cause this HE injection is higher than that for '01' and '10' programming, thus enabling more efficient programming of bits '11.' When the timing signals S3 and S4 fall, the phase 3 terminates, and subsequently the verification procedure starts to verify whether programming is complete.

In embodiment 14, as will be obvious from Table 11, the programming bias is applied even to a memory cell into which bits '10' must be programmed in the phase 1, and this implements efficient programming.

TABLE 11

|  | Phase 1 | Phase 2 | Phase 3 |
| --- | --- | --- | --- |
| Word line voltage | 12 V | 13 V | 14 V |
| '01' | 4 V | 0 V | 0 V |
| '10' | 4 V | 4 V | 0 V |
| '11' | 4 V | 4 V | 4 V |

Providing the condition of variation in the programming characteristics of the memory cells in use permits, it is possible to use a programming method in which both the word line voltage and the bit line voltage change when the phase changes in the combination of Embodiments 11 and 13. Furthermore, it is possible to combine Embodiments 12 and 14. Such combination enables efficient programming into memory cells that are low programming rates.

Embodiment 15

Using FIGS. 50 and 51, a preferred Embodiment 15 of the present invention will be explained below.

A feature of Embodiment 15 is that bias application is executed in the phases in which specific data is programmed in order to apply different programming bias for different programming data, which is implemented by using the circuit structure shown in FIG. 23. Using the timing chart shown in FIG. 50, how programming bias is applied in Embodiment 15 will be explained below.

As the result of verification executed as in Embodiment 6 using the circuit structure shown in FIG. 23, if incompletely programmed memory cells exist, the node SLS retains the LO states as the verify results of these memory cells. Then, programming bias application action is performed, following the verify action.

Initially, a voltage FPC that is applied to the transistor Mp is set at an unselected bit line voltage VWD (for example 6 V). A timing signal Sp is set at a sufficiently high voltage, and the bit lines are charged up to the voltage VWD and then put floating. Only the nodes SLS wherein the memory cells have been verified that programming is complete are charged at the voltage VWD by increasing the power supply SLP of their sense amplifier (see FIG. 10) to the voltage VWD. The voltage of selected word lines WL for programming is set at a programming word line voltage VW (for example, 17 V).

Thereafter, timing signals S3 and S4 rise, thereby the MOS transistors M1 and M1 only for the programming data of bits '11' and making the connection between bit line BL and node SLS. Then, in the group of the memory cells into which bits '11' must be programmed, for a memory cell verified that programming is complete by the preceding verify action, its bit line remains at 6 V, whereas, for a memory cell where programming is incomplete, its bit line is discharged to the node SLS and becomes 0 V. As a result, the selected word line voltage of 17 V and the channel voltage of 0 V are applied to the incompletely programmed memory cell and a strong electric field thereby takes place in the tunnel film (oxide), generating FN tunneling current. To the completely programmed memory cell, on the other hand, the word line voltage of 17 V and the channel voltage of 6 V are applied, but this does not apply a strong electric field to the tunnel film (oxide), and consequently NF tunneling current is not generated. As concerns the memory cells into which bits '01,' '10,' or '00' must be programmed, because of their bit line voltage of 6 V remaining, programming does not take place.

The timing signals S3 and S4 fall, then timing signals S3 and S6 rise, thereby selectively turning the MOS transistors M1 and M" only for the programming data with the upper bit of '1,' that is, bits '10' and '11' and making connection between bit line BL and sense amplifier SL. Then, in the group of the memory cells into which bits '10' or '11' must be programmed, for a memory cell verified that programming is complete by the preceding verify action, its bit line remains at 6 V, whereas, for a memory cell where programming is incomplete, its bit line is discharged to the node SLS and becomes 0 V. As a result, the selected word line voltage of 17 V and the channel voltage of 0 V are applied to the incompletely programmed memory cell and a strong electric field thereby takes place in the tunnel film (oxide), generating FN tunneling current. To the completely programmed memory cell, on the other hand, the word line voltage of 17 V and the channel voltage of 6 V are applied, but this does not apply a strong electric field to the tunnel film (oxide), and consequently NF tunneling current is not generated. As concerns the memory cells into which bits '01' or '00' must be programmed, because of their bit line voltage of 6 V remaining, programming does not take place.

The timing signals S3 and S6 fall, then timing signals S4 and S5 rise, thereby selectively turning the MOS transistors M1 and M" only for the programming data with the lower bit of '1,' that is, bits '01' and '11' and making connection between bit line BL and sense amplifier SL. Then, in the group of the memory cells into which bits '01' or '11' must be programmed, for a memory cell verified that programming is complete by the preceding verify action, its bit line remains at 6 V, whereas, for a memory cell where programming is incomplete, its bit line is discharged to the node SLS and becomes 0 V. As a result, the selected word line voltage of 17 V and the channel voltage of 0 V are applied to the incompletely programmed memory cell and a strong electric field thereby takes place in the tunnel film (oxide), generating FN tunneling current to cause programming. To the completely programmed memory cell, on the other hand, the word line voltage of 17 V and the channel voltage of 6 V are applied, but this does not apply a strong electric field to the tunnel film (oxide), and consequently NF tunneling current is not generated. As concerns the memory cells into which bits '10' must be programmed, their bit line voltage remains at 6 V if the programming thereto is complete or becomes 0 V during the preceding action if the programming thereto is incomplete. Therefore, programming also takes place in a memory cell where programming of bits '10' is not complete. As concerns the memory cells into which bits '00' must be programmed, their bit line voltage remains at 6V and thus programming does not take place.

Figure 50:
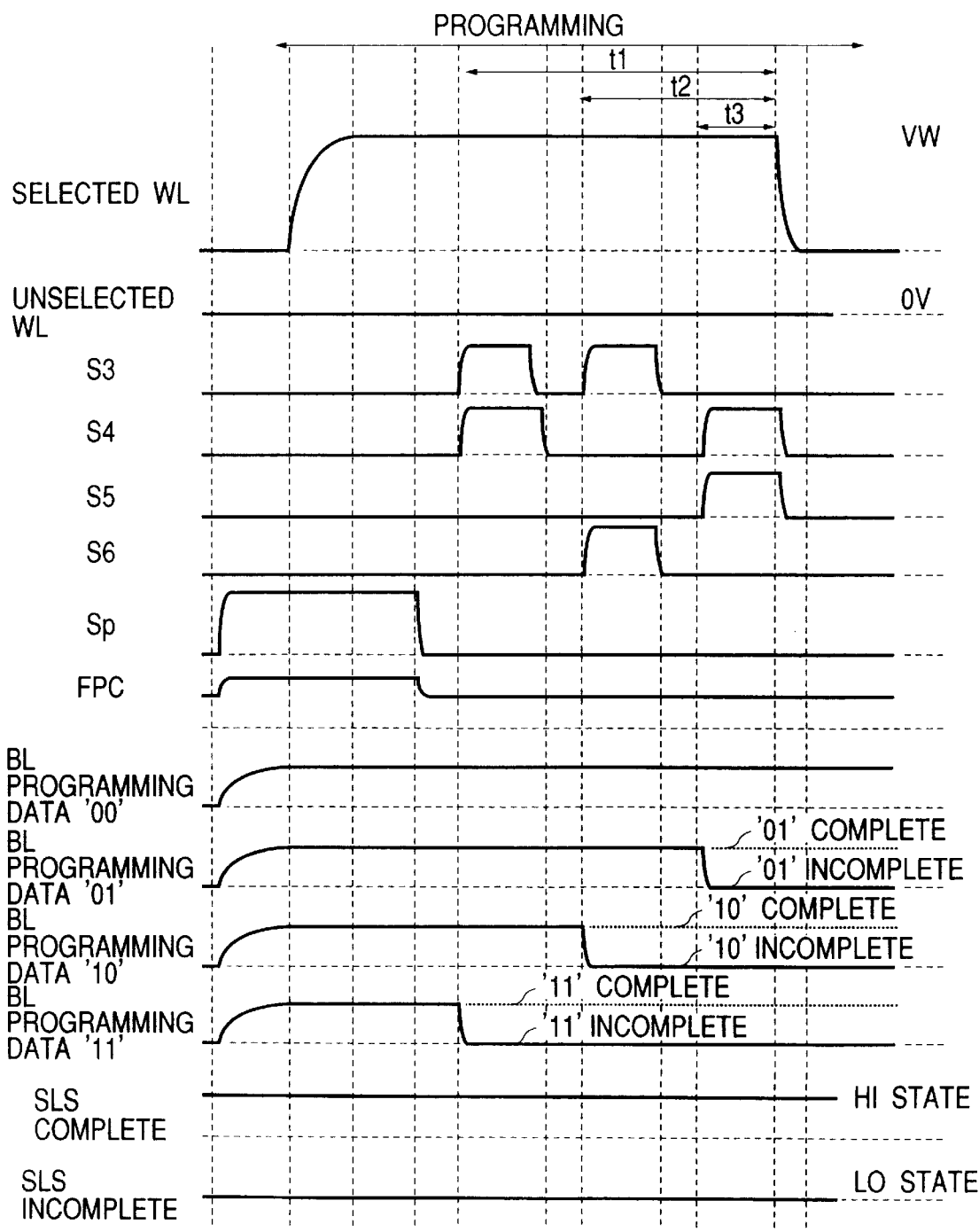
FIG. 50 is a timing chart for explaining programming to be performed in a preferred Embodiment 15 of the present invention.
Figure 51:
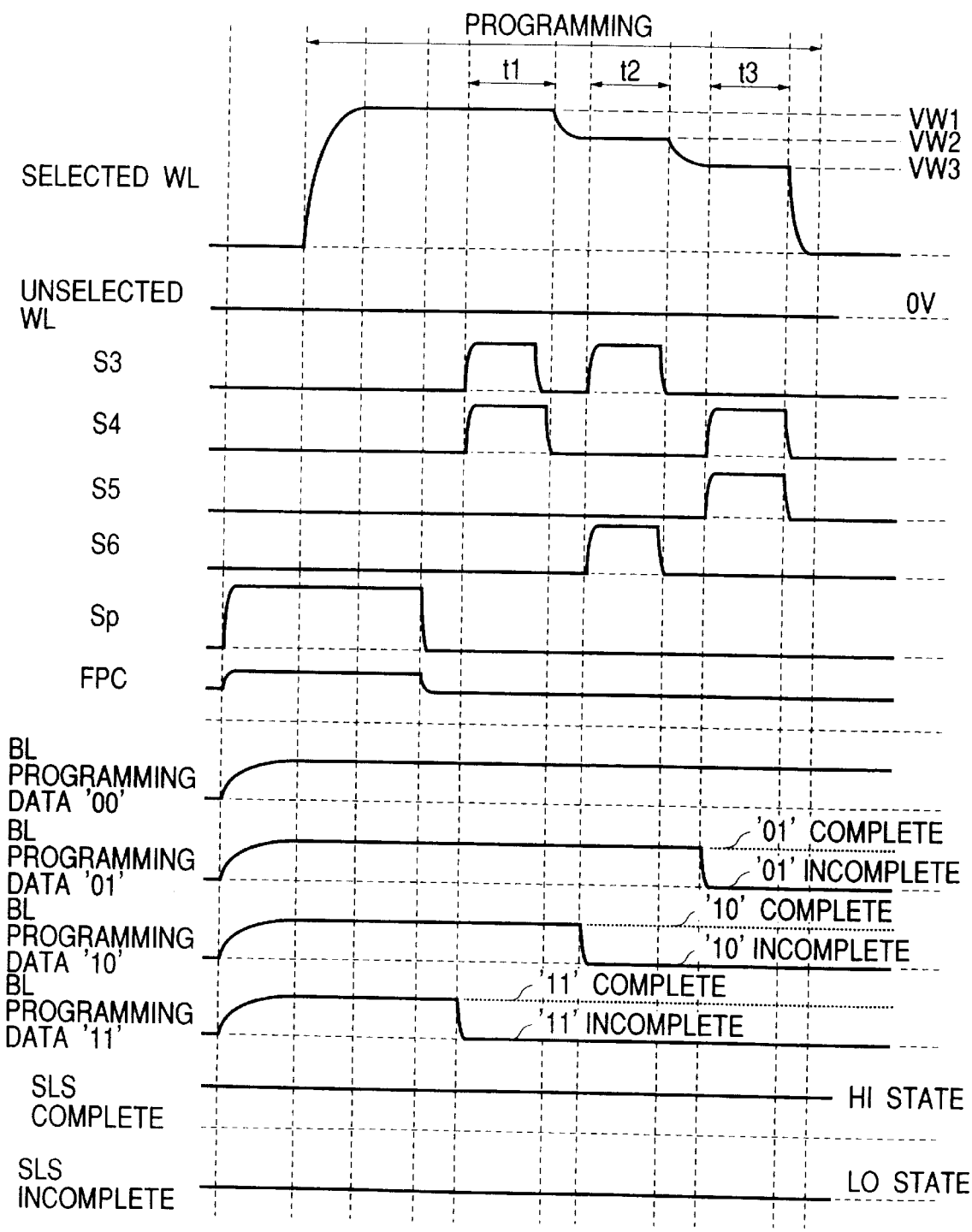
FIG. 51 is a timing chart for explaining another manner of programming to be performed in Embodiment 15.

Consequently, programming bias is applied to any selected memory cell for programming of bits '11' thereto during t1 shown at the top of FIG. 50, to any selected memory cell for programming of bits '10' thereto during t2 shown, and any selected any selected memory cell for programming of bits '01' thereto during t3 shown (t3<t2<t1).

By executing longer programming bias application for programming with a larger gap between the required threshold voltage level and the erasure level as noted above, the programming actions on a plurality of threshold voltage levels can finish almost synchronously and faster programming can be achieved.

Furthermore, on the assumption of being implemented by using the circuitry shown in FIG. 23, a programming method in which the higher programming bias voltage is used for programming on the higher threshold voltage level will be explained below, using FIG. 51. During the period of programming of bits '11' into the memory cells, the selected word line voltage shall be set at voltage VW1, for example, 18 V. During the period of programming of bits '11' and '10' into the memory cells, the selected word line voltage shall be set at voltage VW2, for example, 17 V. During the period of simultaneous programming of bits '11,' '10,' and '01' into the memory cells, the selected word line voltage shall be set at VW3, for example, 16 V.

According to this programming method, the programming of bits '11' for which a higher threshold voltage is set is executed during three periods: t1 when the selected word line voltage of 18 V is applied, t2 when the selected word line voltage of 17 V is applied, and t3 when the selected word line voltage of 16 V is applied. On the other hand, the programming of bits '01' for which a lower threshold voltage is set is executed only the period t3 when the selected word line voltage of 16 V is applied. By appropriately selecting the requirements of the voltages VW1 through VW3, according to the characteristics of the memory cells, the periods t1 through t3 can be reduced and the programming time can further be reduced.

Embodiment 16

Figure 52:
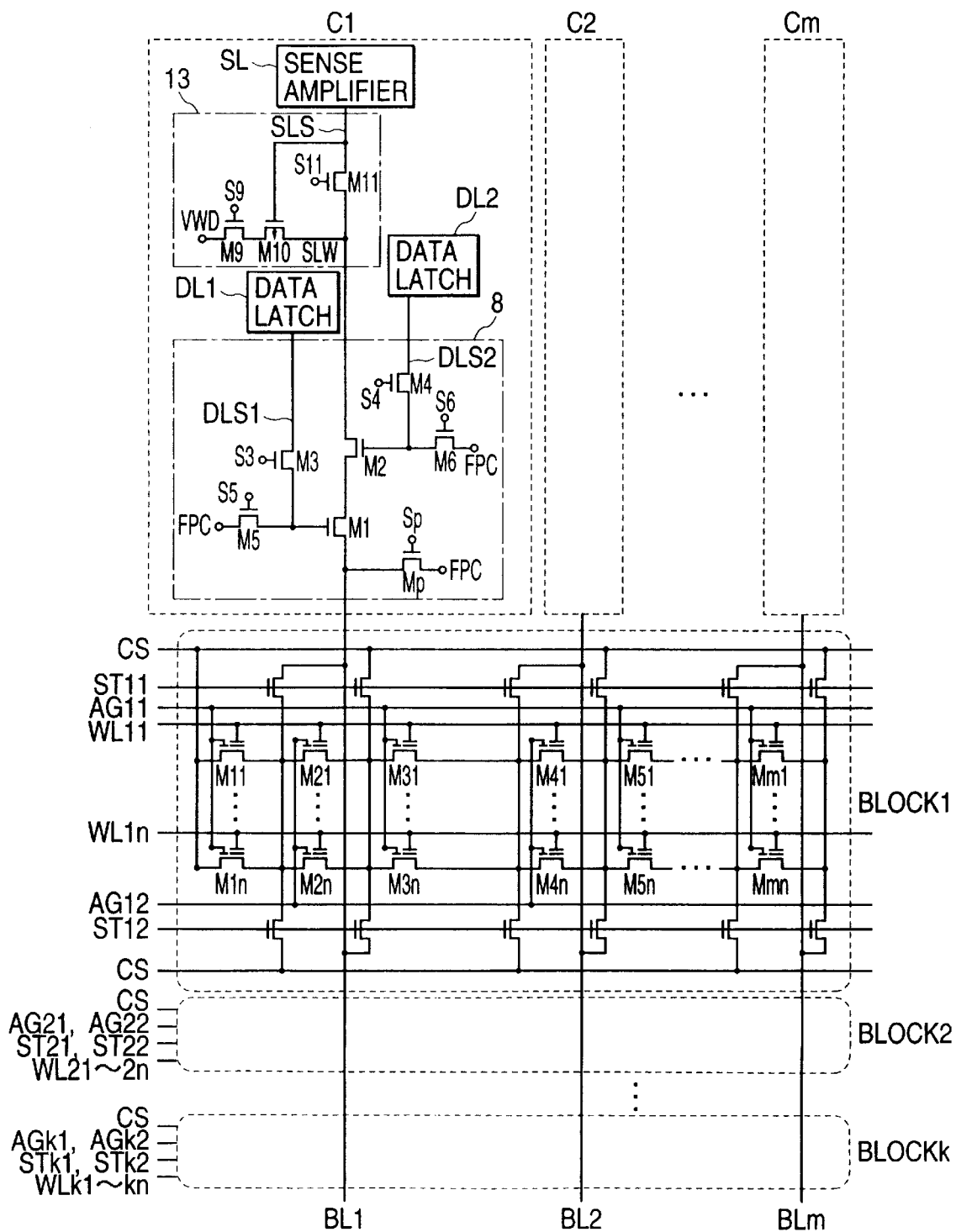
FIG. 52 is a circuit structure diagram for explaining a preferred Embodiment 16 of the present invention.

Using FIGS. 52 through 54, a preferred Embodiment 16 of the present invention will be explained below.

A feature of Embodiment 16 is that faster programming is achieved by applying different programming bias for different programming data, which is implemented by using the memory array structure of Embodiment 5 shown in FIG. 21.

The circuit structure of Embodiment 16 is that shown in FIG. 21 to which the bias control circuit 13 shown in FIG. 45 for controlling the node SLS is added. Verification is performed as in Embodiment 5.

As the result of verification, if incompletely programmed memory cell exist, the node SLS retains the LO states as the verify results of these memory cells. Then, programming bias application action is performed, following the verify action. Using the timing chart shown in FIG. 53, how programming bias is applied in Embodiment 16 will be explained.

Initially, the voltage on selected word lines WL for programming is set at a programming bias voltage VW, for example, 12 V. Then, the gate voltage STj1 of the select transistors is increased and the selected gate voltage VAGj1 is increased, thereby activating the memory cells in the odd rows among the memory cells connected to the selected word lines.

In phase 1, a programming drain bias VWD that is applied to the transistor M9 is set at VWD1 (for example, 3 V) and a timing signal S9 rises to a sufficiently higher voltage than 3 V, thereby charging the node SLW at 3 V, providing the node is to make the connection to the bit line that has put the node SLS in the LO state. Subsequently, timing signals S4 and S5 rise, thereby turning the MOS transistors M1 and M2 ON only for the programming data of bits '01' and '11' and making the connection between bit line BL and node SLW. Then, in the group of the memory cells into which bits '01' or '11' must be programmed, for a memory cell judged programming incomplete by the preceding verify action, a programming bias of 3 V is applied to the bit line to it, and SSI injection thereby takes place to program the data into it. When the timing signals S4 and S5 fall, the phase 1 terminates, then phase 2 programming follows.

In phase 2, the programming drain bias VWD is set at VWD2 (for example, 4 V) and the timing signal S9 rises to a sufficiently higher voltage than 4 V, thereby charging the node SLW at 4 V, providing the node is to make the connection to the bit line that has put the node SLS in the LO state. Subsequently, timing signals S3 and S6 rise, thereby turning the MOS transistors M1 and M2 ON only for the programming data of bits '10' and '11' and making the connection between bit line BL and node SLW. Then, in the group of the memory cells into which bits '10' or '11' must be programmed, for a memory cell judged programming incomplete by the preceding verify action, a programming bias of 4 V is applied to the bit line to it, and SSI injection thereby takes place in it. The programming bias applied to the memory cell to cause SSI injection in phase 2 is higher than that in phase 1. Thus, the higher programming voltage is applied for '10' level programming for which a higher threshold voltage than '01' level is set and this enables the programming to finish in a time equal to the time required for '01' programming. When the timing signals S3 and S6 fall, the phase 2 terminates, then phase 3 programming follows.

In phase 3, the programming drain bias VWD is set at VWD3 (for example, 5 V) and the timing signal S9 rises to a sufficiently higher voltage than 5 V, thereby charging the node SLW at 5 V, providing the node is to make the connection to the bit line that has put the node SLS in the LO state. Subsequently, timing signals S3 and S4 rise, thereby turning the MOS transistors M1 and M2 ON only for the programming data of bits '11' and making the connection between bit line BL and node SLW. Then, in the group of the memory cells into which bits '11' must be programmed, for a memory cell judged programming incomplete by the preceding verify action, a programming bias of 5 V is applied to the bit line to it, and SSI injection thereby takes place to program the data into it. The programming bias applied to the memory cell to cause SSI injection in phase 3 is higher than that in phase 1 and phase 2. That is, the greatest programming bias is applied for '11' level programming for which the highest threshold voltage is set and this enables the '11' programming to finish in a time equal to the time required for '01' and '10' programming. When the timing signals S3 and S4 fall, the phase 3 terminates, and subsequently the verification procedure starts to verify whether programming is complete.

As described above, Embodiment 16 makes it possible to apply different programming bias for different level programming without installing the programming bias controller 11 shown in FIG. 44 per bit line. This reduces the programming time in total.

In the above example, the VWD1 programming bias is not applied to the bit line to a memory cell into which bits '10' must be programmed in the phase 1. FIG. 54 shows another example in which more efficient programming is achieved by applying the programming bias even to a memory cell into which bits '10' must be programmed in the phase 1.

Figure 53:
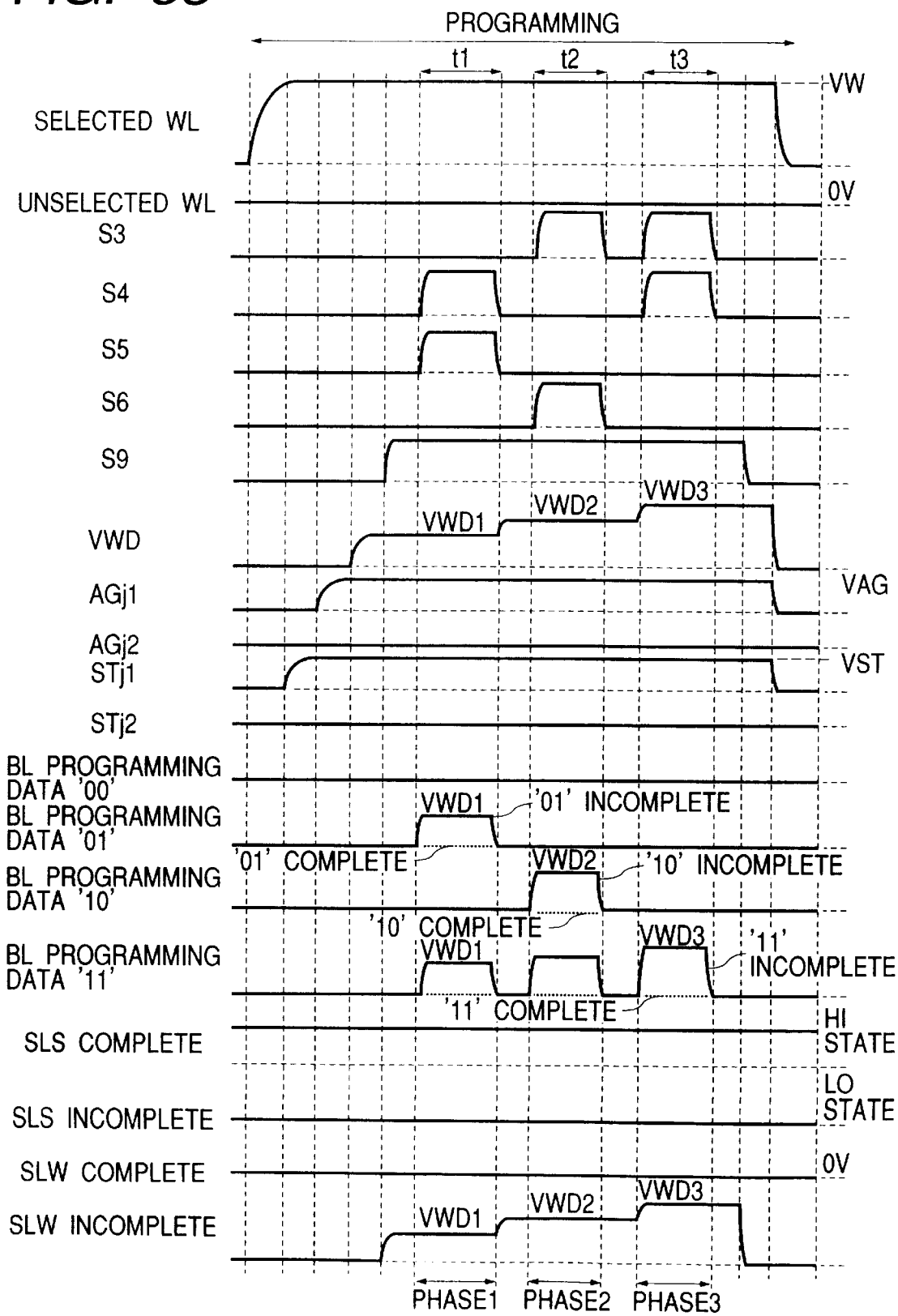
FIG. 53 is a timing chart for explaining programming to be performed in Embodiment 16.
Figure 54:
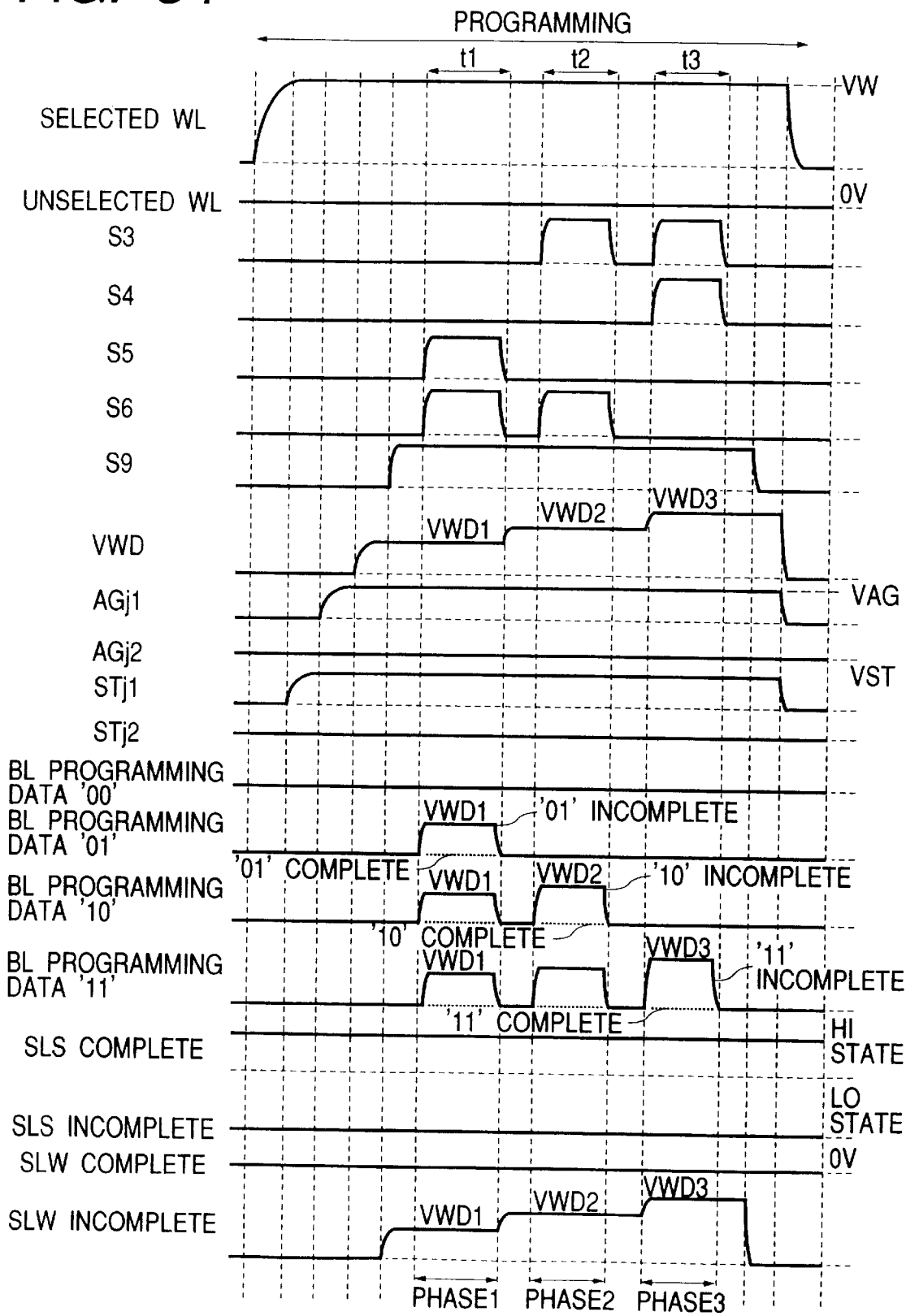
FIG. 54 is a timing chart for explaining another manner of programming to be performed in Embodiment 16.

In the case of FIG. 53, during the programming period t1, timing signals S4 and S5 rise and only the programming of bits '01' and '11' into the appropriate memory cells is executed, whereas, in the case of FIG. 54, during the programming period 11, timing signals S5 and S6 rise, thereby applying the programming bias to all memory cells to be programmed, that is, the memory cells into which bits '01,' '10,' or '11' must be programmed.

The programming manner in the latter case can achieve more efficient programming, because the VWD1 programming bias is applied even to the bit line to a memory cell into which bits '10' must be programmed in the phase 1.

Embodiment 17

Using FIGS. 55 and 56, a preferred Embodiment 17 of the present invention will be explained below.

For the purpose of applying different bias to program different programming data, Embodiment 16 takes the steps of controlling the bit line voltage, or in other words, the drain voltage of a memory cell, whereas Embodiment 13 takes the steps of controlling the word line voltage, or in other words, the gate voltage of a memory cell. The circuit structure of Embodiment 17 is the same as that of Embodiment 16 shown in FIG. 52.

As in Embodiment 16, as the result of verification, if incompletely programmed memory cell exist, the sense latch node SLS retains the LO states as the verify results of these memory cells. Then, programming bias application action is performed, following the verify action. Using the timing chart shown in FIG. 55, how programming bias is applied in Embodiment 17 will be explained.

Initially, the voltage on selected word lines WL for programming is set at a programming bias voltage VW1, for example, 12 V. Then, the gate voltage STj1 of the select transistors is increased and the selected gate voltage VAGj1 is increased, thereby activating the memory cells in the odd rows among the memory cells connected to the selected word lines.

In phase 1, a timing signal S9 rises to a programming drain voltage VWD (a voltage that is sufficiently higher than 4 V, for example, 7 V), thereby charging the node SLW at 4 V, providing the node is connected to the bit line that has put the node SLS in the LO state. Subsequently, timing signals S4 and S5 rise, thereby turning the MOS transistors M1 and M2 ON only for the programming data of bits '01' and '11.' Then, for a memory cell judged programming incomplete by the preceding verify action, a programming bias of 4 V is applied to the bit line to it, and SSI injection thereby takes place to program the data into it. When the timing signals S4 and S5 fall, the phase 1 terminates, then phase 2 programming follows.

In phase 2, the word line WL voltage is set at a second programming word line voltage VWW2 (for example, 13 V) and timing signals S3 and S6 rise, thereby turning the MOS transistors M1 and M2 ON only for the programming data of bits '10' and '11.' Then, for a memory cell judged programming incomplete by the preceding verify action, a programming bias of 4 V is applied to the bit line to it, and SSI injection thereby takes place in it. When this SSI injection is carried out, the programming bias higher than that for '01' programming is applied to the memory cell to cause SSI injection. When the timing signals S3 and S6 fall, the phase 2 terminates, then phase 3 follows.

In phase 3, the word line WL voltage is set at a third voltage VWW3 (for example, 14 V) and timing signals S3 and S4 rise, thereby turning the MOS transistors M1 and M2 ON only for the programming data of bits '11.' Then, for a memory cell judged programming incomplete by the preceding verify action, a programming bias of 4 V is applied to the bit line to it, and SSI injection thereby takes place in it. The programming bias applied to cause this SSI injection is even higher than that for '01' and '10' programming, thus enabling more efficient programming of bits '11.' When the timing signals S3 and S4 fall, the phase 3 terminates.

As described above, Embodiment 17 makes it possible to apply different programming bias for different level programming without installing the programming bias controller 11 shown in FIG. 44 per bit line. This reduces the programming time in total.

In the above example, the VWD1 programming bias is not applied to the bit line to a memory cell into which bits '10' must be programmed in the phase 1. FIG. 56 shows another example in which more efficient programming is achieved by applying the programming bias even to a memory cell into which bits '10' must be programmed in the phase 1.

Figure 55:
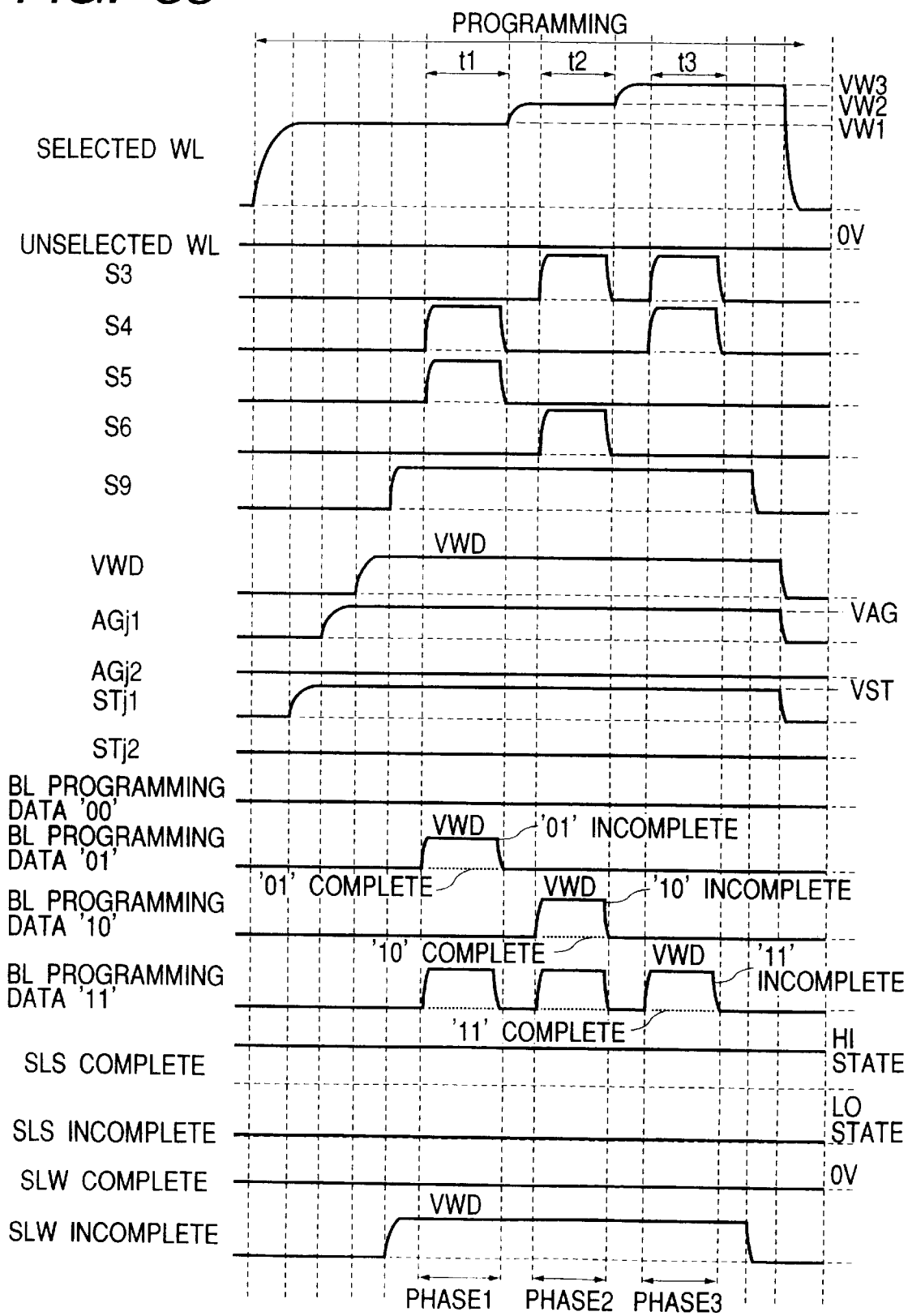
FIG. 55 is a timing chart for explaining programming to be performed in a preferred Embodiment 17 of the present invention.
Figure 56:
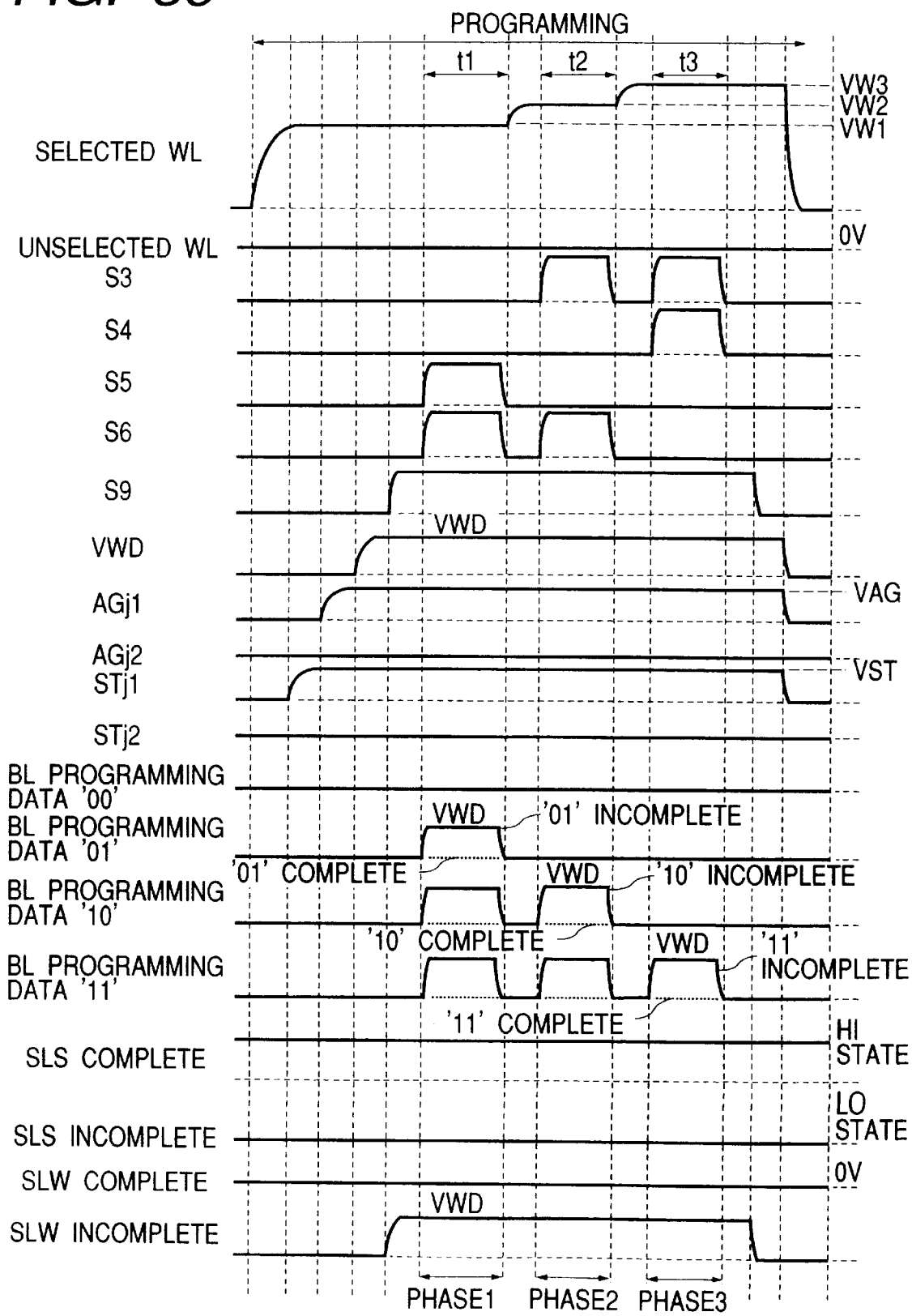
FIG. 56 is a timing chart for explaining another manner of programming to be performed in Embodiment 17.

In the case of FIG. 55, during the programming period t1, timing signals S4 and S5 rise and only the programming of bits '01' and '11' into the appropriate memory cells is executed, whereas, in the case of FIG. 56, during the programming period 11, timing signals S5 and S6 rise, thereby applying the programming bias to all memory cells to be programmed, that is, the memory cells into which bits '01,' '10,' or '11' must be programmed.

The programming manner in the latter case can achieve more efficient programming, because the VWD1 programming bias is applied even to the bit line to a memory cell into which bits '10' must be programmed in the phase 1.

Embodiment 18

Using FIGS. 57 and 58, a preferred Embodiment 18 of the present invention will be explained below.

For the purpose of applying different bias to program different programming data, Embodiment 17 takes the steps of controlling the word line voltage, or in other words, the gate voltage of a memory cell, whereas, Embodiment 18 takes the steps of controlling selected gate voltages VAG1 and VAG2. The circuit structure of Embodiment 18 is the same as that of Embodiment 16 shown in FIG. 52.

As in Embodiment 16, as the result of verification, if incompletely programmed memory cell exist, the sense latch node SLS retains the LO states as the verify results of these memory cells. Then, programming bias application action is performed, following the verify action. Using the timing chart shown in FIG. 57, how programming bias is applied in Embodiment 18 will be explained.

Initially, the voltage on selected word lines WL for programming is set at a programming bias voltage VW (for example, 13 V). Then, the gate voltage STj1 of the select transistors is increased and the selected gate voltage VAGj1 is increased to VAGS1, for example, 2V, thereby activating the memory cells in the odd rows among the memory cells connected to the selected word lines.

In phase 1, a timing signal S9 rises to a programming drain voltage VWD (a voltage that is sufficiently higher than 4 V, for example, 7 V), thereby charging the node SLW at 4 V, providing the node is connected to the bit line that has put the node SLS in the LO state. Subsequently, timing signals S4 and S5 rise, thereby turning the MOS transistors M1 and M2 ON only for the programming data of bits '01' and '11.' Then, for a memory cell judged programming incomplete by the preceding verify action, a programming bias of 4 V is applied to the bit line to it, and SSI injection thereby takes place in it. When the timing signals S4 and S5 fall, the phase 1 terminates, then phase 2 programming follows.

In phase 2, the selected gate voltage VAGj1 is set at VAGS2 (for example, 2.5 V) and timing signals S3 and S6 rise, thereby turning the MOS transistors M1 and M2 ON only for the programming data of bits '10' and '11.' Then, for a memory cell judged programming incomplete by the preceding verify action, a programming bias of 4 V is applied to the bit line to it, and SSI injection thereby takes place in the memory cell into which bits '10' or '11' must be programmed. The selected gate voltage VAGj1 to cause the SSI injection in phase 2 is higher than that for '01' programming, and consequently the programming of phase 2 is performed in a stronger electric field. When the timing signals S3 and S6 fall, the phase 2 terminates, then phase 3 follows.

In phase 3, the selected gate voltage VAGj1 is set at VAGS3 (for example, 3 V) and timing signals S3 and S4 rise, thereby turning the MOS transistors M1 and M2 ON only for the programming data of bits '11.' Then, for a memory cell judged programming incomplete by the preceding verify action, a programming bias of 4 V is applied to the bit line to it, and SSI injection thereby takes place to program the data into it. The selected gate voltage VAGj1 to cause the SSI injection in phase 3 is even higher than that for '01' and '10' programming, and consequently the programming of phase 3 is performed in a even stronger electric field. When the timing signals S3 and S4 fall, the phase 3 terminates.

As described above, Embodiment 18 makes it possible to apply different programming bias for different level programming without installing the programming bias controller 11 shown in FIG. 44 per bit line. This reduces the programming time in total.

In the above example, the VWD1 programming bias is not applied to the bit line to a memory cell into which bits '10' must be programmed in the phase 1. FIG. 58 shows another example in which more efficient programming is achieved by applying the programming bias even to a memory cell into which bits '10' must be programmed in the phase 1.

Figure 57:
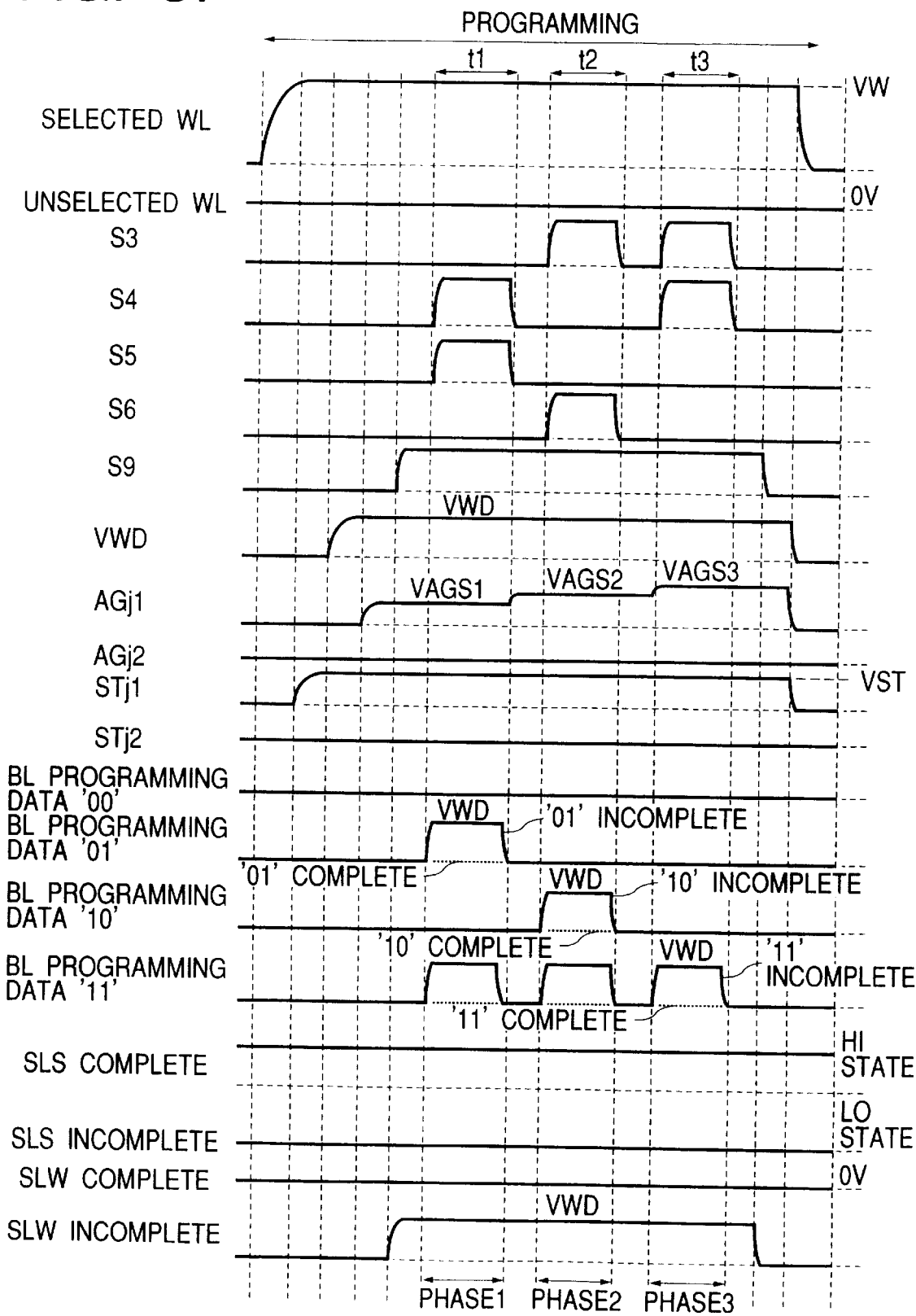
FIG. 57 is a timing chart for explaining programming to be performed in a preferred Embodiment 18 of the present invention.
Figure 58:
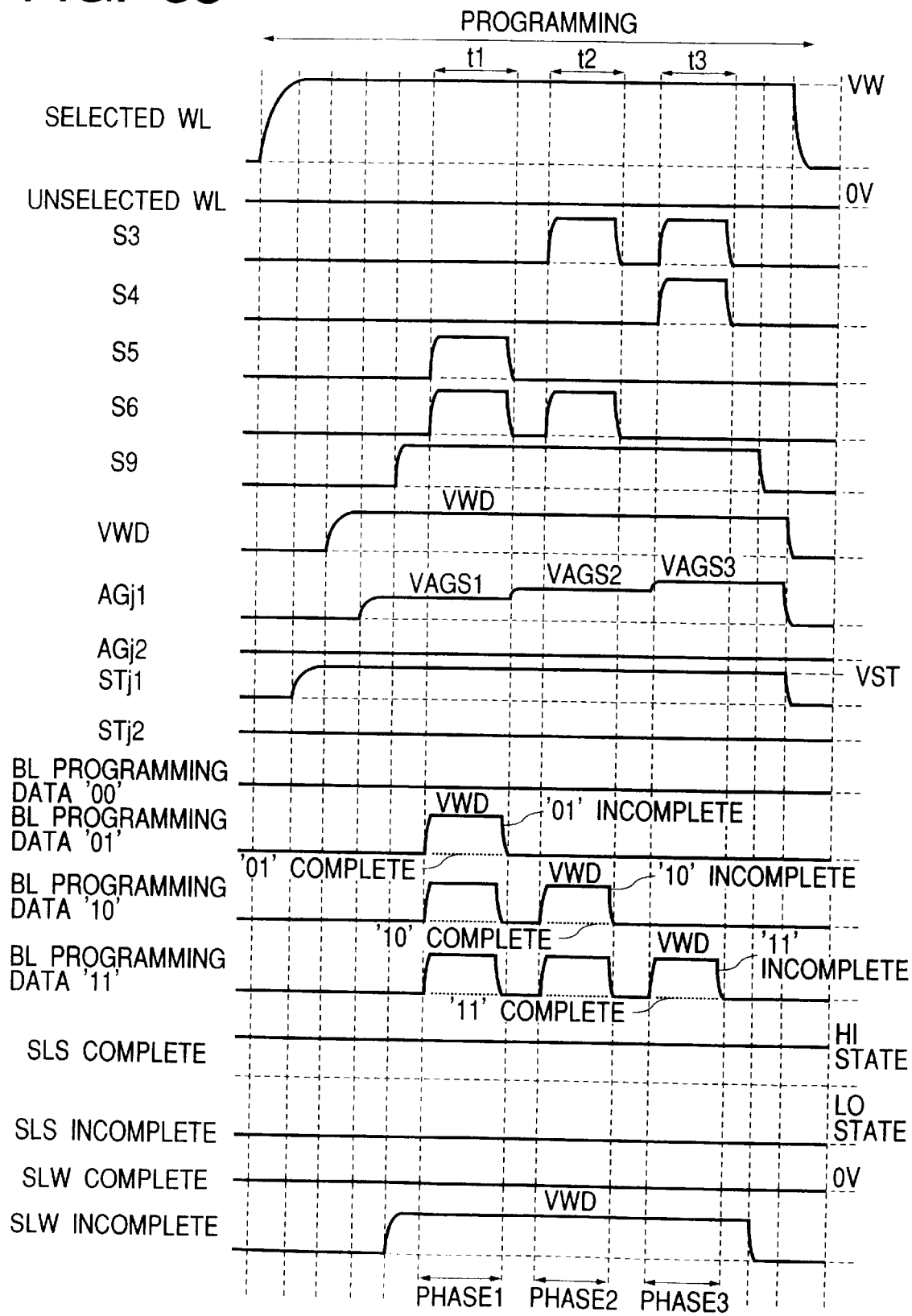
FIG. 58 is a timing chart for explaining another manner of programming to be performed in Embodiment 18.
Figure 59:
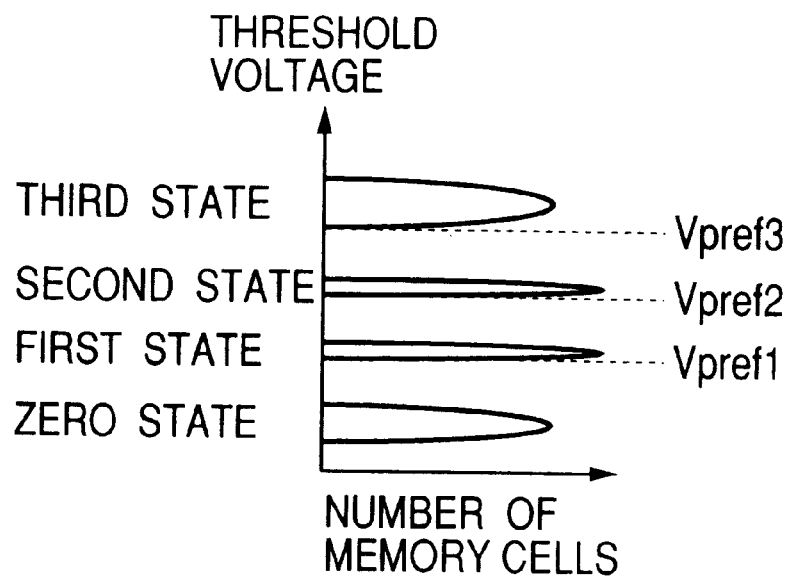
FIG. 59 is a diagram showing an example of distribution of threshold voltages of memory cells.
Figure 60:
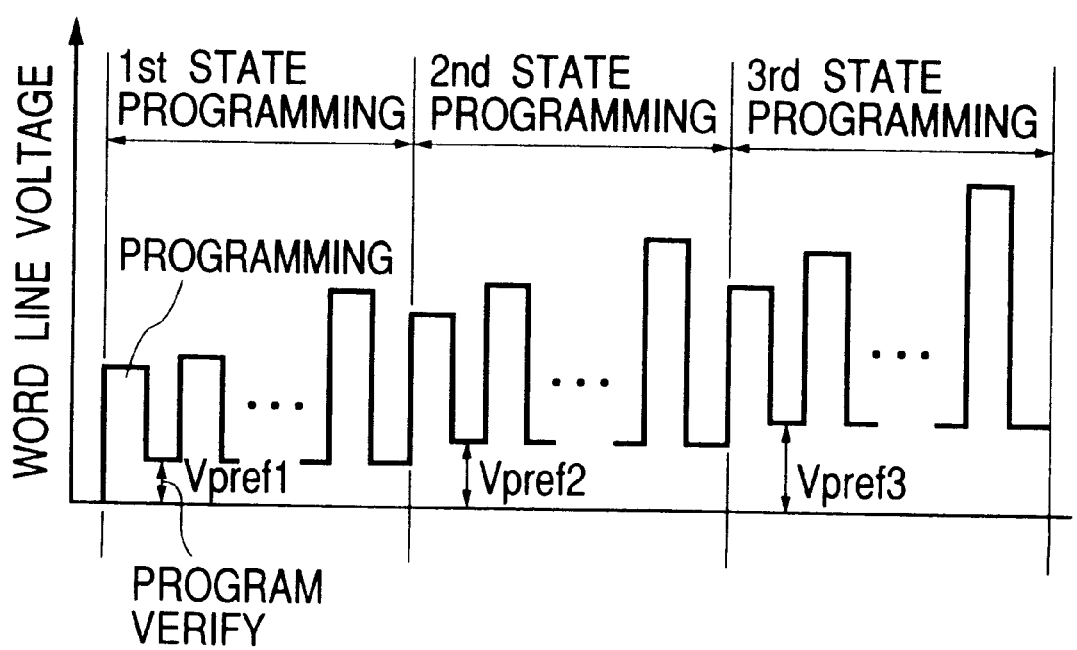
FIG. 60 is a timing chart for explaining a previous programming and verification scheme.
Figure 61:
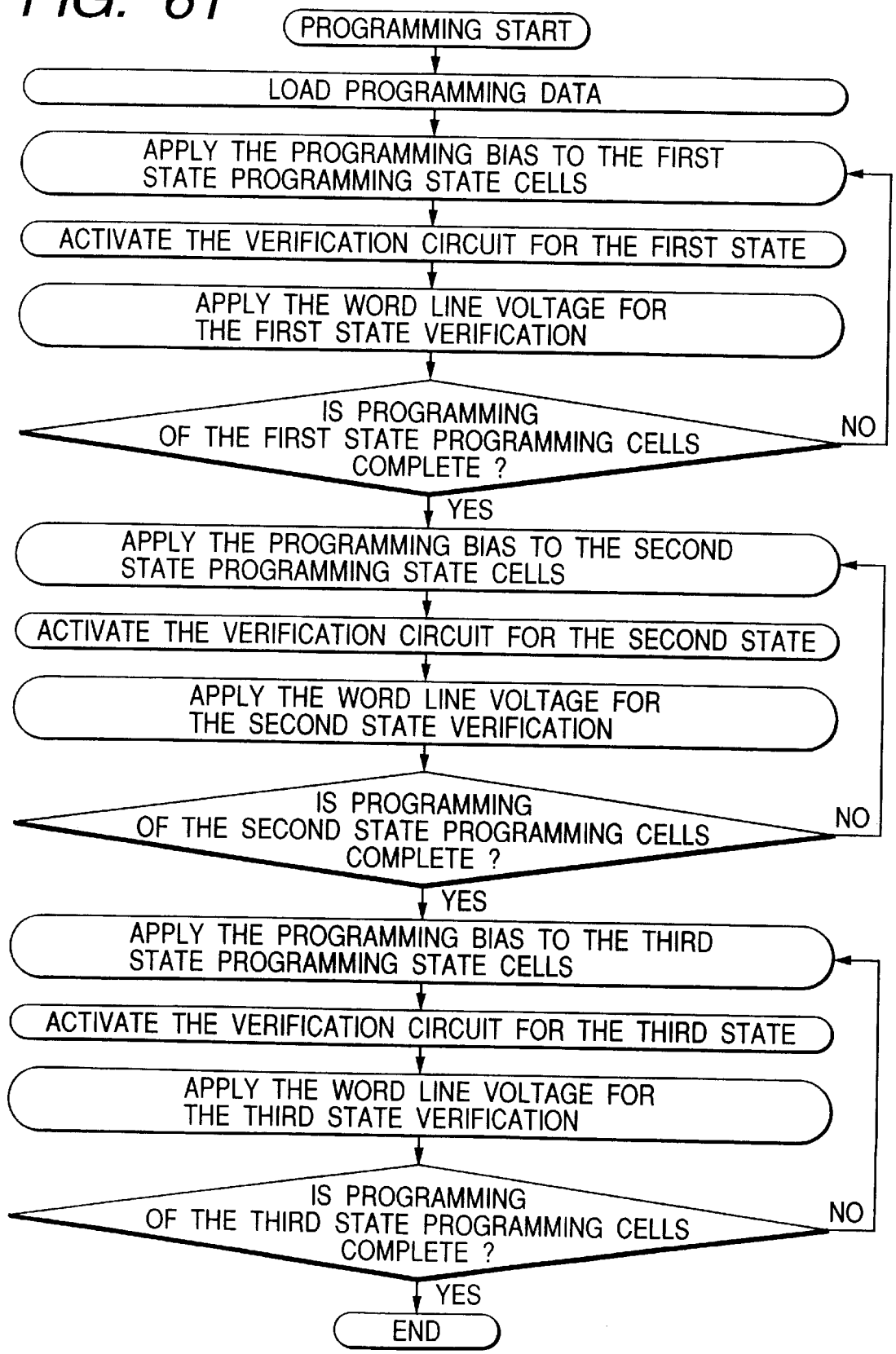
FIG. 61 is a flowchart for explaining a previous programming and verification scheme.
Figure 62:
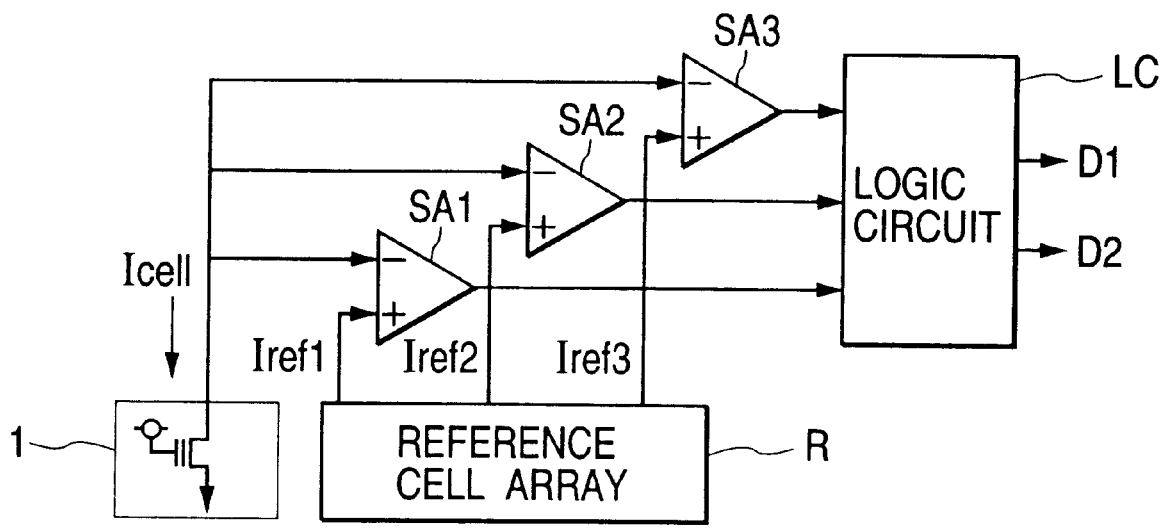
FIG. 62 is a circuit diagram for explaining another previous programming and verification scheme.
Figure 63:
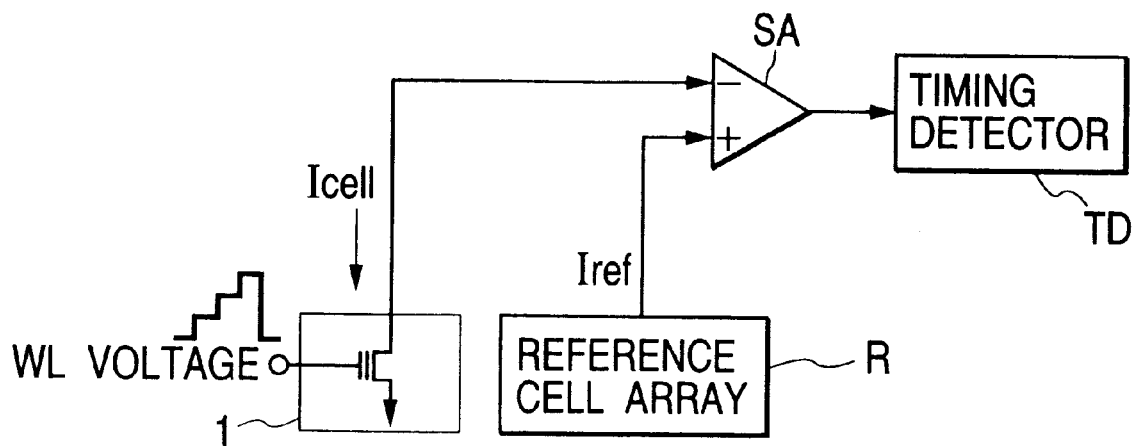
FIG. 63 is another circuit diagram for explaining another previous programming and verification scheme.

In the case of FIG. 57, during the programming period t1, timing signals S4 and S5 rise and only the programming of bits '01' and '11' into the appropriate memory cells is executed, whereas, in the case of FIG. 58, during the programming period 11, timing signals S5 and S6 rise, thereby applying the programming bias to all memory cells to be programmed, that is, the memory cells into which bits '01,' '10,' or '11' must be programmed.

The programming manner in the latter case can achieve more efficient programming, because the VWD1 programming bias is applied even to the bit line to a memory cell into which bits '10' must be programmed in the phase 1.

The present invention makes it possible to verify whether data has been programmed by detecting the energized or de-energized state of multilevel memory cells without static steady current flowing across the memory cells. The invention also makes it possible to perform a series of multilevel verify actions by setting up verification phases corresponding to programming levels and selecting an appropriate phase for the programming data to verify. Thus, the invention can realize a nonvolatile semiconductor memory device featuring rapid programming and a high programming throughput, for which simultaneous programming verification for a great number of memory cells can be performed.

In addition, the invention makes it possible to perform a series of multilevel programming actions by setting up programming phases corresponding to programming levels and selecting an appropriate phase for the data to be programmed and can implement rapid multilevel programming.

It is to be understood that the above-described embodiments are merely illustrative of the principles of the invention and that many variations may be devised by those skills in the art without departing from the spirit and scope of the invention. It is therefore intended that variations be included within the scope of the claims.

What is claimed is:

1. A nonvolatile semiconductor memory device, comprising:

a plurality of memory cells, each of which has a floating gate and a threshold voltage level that depends on a quantity of charge accumulated at said floating gate;

word lines connected to said memory cells at respective control gates thereof;

a bit line to which source and drain paths of said memory cells are connected;

a sense amplifier that is connected to said bit line;

a data latch circuit that is connected to said bit line and holds data to be programmed into said memory cells; and a word line voltage driver that generates a word line voltage that is applied to selected word lines connected to memory cells for which programming or verification is carried out;

wherein said threshold voltage level of each of said memory cells is set in one of at least three states of threshold voltage, including first, second, and third states for programming into said memory cells, depending on the data held by said data latch circuit, said second state being placed between said first state and said third state;

said word line voltage driver applies a first word line voltage on said selected word lines, selects memory cells to enter said second state, depending on the data held by said data latch circuit, and allows said sense amplifier to verify whether the memory cells selected to enter said second state have been programmed, according to energized or de-energized states thereof;

said word line voltage driver changes the voltage applied on said selected word lines substantially stepwise from said first word line voltage to a second word line voltage that is higher than said first word line voltage, selects memory cells to enter said third state, depending on the data held by said data latch circuit, and allows said sense amplifier to verify whether the memory cells selected to enter said third state have been programmed, according to energized or de-energized states thereof.

2. The nonvolatile semiconductor memory device according to claim 1, wherein:

for all possible states for programming into said memory cells, verification is carried out as to whether the corresponding selected memory cells have been programmed, according to the energized or de-energized states thereof, and subsequently, programming into insufficiently programmed memory cells is executed.

3. The nonvolatile semiconductor memory device according to claim 1, wherein:

said first state is a data erased state.

4. The nonvolatile semiconductor memory device according to claim 1, wherein:

the data that is held by said data latch circuit is N-bit data;

said data latch circuit consists of N latch circuit portions; and source and drain paths are formed from said memory cells through said bit line and to said sense amplifier via N transistors that are controlled so as to be turned on, depending on the bits of data held by said N latch circuit portions.

5. The nonvolatile semiconductor memory device according to claim 1, wherein:

said sense amplifier verifies whether selected memory cells have been programmed by detecting whether or not the bit line is discharged from a precharged state through the source and drain paths of those memory cells; and said bit line is precharged before and after verification is carried out as to whether the memory cells selected to enter said second state have been programmed.

6. The nonvolatile semiconductor memory device according to claim 1, wherein:

programming into said memory cells is carried out by applying a word line voltage of a pulse waveform to said word lines and a bit line voltage of a pulse waveform to said bit line, while gradually increasing a pulse width of said word line voltage and/or said bit line voltage.

7. The nonvolatile semiconductor memory device according to claim 1, wherein:

programming into said memory cells is carried out by applying a word line voltage of a pulse waveform to said word lines and a bit line voltage of a pulse waveform to said bit line, while gradually increasing a pulse height of said word line voltage and/or said bit line voltage.

8. A nonvolatile semiconductor memory device, comprising:

a plurality of memory cells, each of which has a floating gate and a threshold voltage level that depends on a quantity of charge accumulated at said floating gate;

word lines connected to said memory cells at respective control gates thereof;

a bit line to which source and drain paths of said memory cells are connected;

a sense amplifier that is connected to said bit line;

a data latch circuit that is connected to said bit line and holds data to be programmed into said memory cells; and a word line voltage driver that generates a word line voltage that is applied to selected word lines connected to memory cells for which programming or verification is carried out;

wherein said threshold voltage level of each of said memory cells is set in one of first, second, third, and fourth states of threshold voltage, depending on the data held by said data latch circuit, said second state being placed between said first state and said third states and said third state being placed between said second state and said fourth state;

said word line voltage driver generates a first word line voltage on said selected word lines, selects memory cells to enter said fourth state, depending on the data held by said data latch circuit, and allows said sense amplifier to verify whether the memory cells selected to enter said fourth state have been programmed, according to energized or de-energized states thereof;

programming is executed for insufficiently programmed memory cells among the memory cells selected to enter said fourth state;

after completion of programming into the memory cells selected to enter said fourth state, said word line voltage driver generates a second word line voltage on said selected word lines, selects memory cells to enter said second state, depending on the data held by said data latch circuit, and allows said sense amplifier to verify whether the memory cells selected to enter said second state have been programmed, according to energized or de-energized states thereof;

said word line voltage driver changes the voltage applied to the selected word lines substantially stepwise from said second word line voltage to a third word line voltage, selects memory cells to enter said third state, depending on the data held by said data latch circuit, and allows said sense amplifier to verify whether the memory cells selected to enter said third state have been programmed, according to energized or de-energized states thereof; and said third word line voltage is higher than said second word line voltage and said first word line voltage is higher than said second word line voltage and said third word line voltage.

9. The nonvolatile semiconductor memory device according to claim 8, wherein:

additional programming is executed for insufficiently programmed memory cells among the respective memory cells selected to enter said second and third states.

10. The nonvolatile semiconductor memory device according to claim 8, wherein:

said first state is a data erased state.

11. The nonvolatile semiconductor memory device according to claim 8, wherein:

the data that is held by said data latch circuit is N-bit data;

said data latch circuit consists of N latch circuit portion; and source and drain paths are formed from said memory cells through said bit line and to said sense amplifier via N transistors that are controlled so as to be turned on, depending on the bits of data held by said N of latch circuit portion.

12. The nonvolatile semiconductor memory device according to claim 8, wherein:

said sense amplifier verifies whether selected memory cells have been programmed by detecting whether or not the bit line is discharged from a precharged state through the source and drain paths of those memory cells; and said bit line is precharged before and after completion of programming into the memory cells selected to enter said fourth state.

13. The nonvolatile semiconductor memory device according to claim 12, wherein:

said bit line is precharged again after completion of programming into the memory cells selected to enter said second state.

14. The nonvolatile semiconductor memory device according to claim 8, wherein:

programming into said memory cells is carried out by applying a word line voltage of a pulse waveform to said word lines and a bit line voltage of a pulse waveform to said bit line, while gradually increasing a pulse width of said word line voltage and/or said bit line voltage.

15. The nonvolatile semiconductor memory device according to claim 8, wherein:

programming into said memory cells is carried out by applying a word line voltage of a pulse waveform to said word lines and a bit line voltage of a pulse waveform to said bit line, while gradually increasing a pulse height of said word line voltage and/or said bit line voltage.

16. A nonvolatile semiconductor memory device, comprising:

a plurality of memory cells, each of which has a floating gate and a threshold voltage level that depends on a quantity of charge accumulated at said floating gate;

word lines connected to said memory cells at respective control gates thereof; and a bit line to which source and drain paths of said memory cells are connected;

wherein said threshold level of each of said memory cells is to be set in one of first, second, third, and fourth states of threshold voltage, said second state being placed between said first state and said third state, and said third state being placed between said second state and said fourth state;

first programming is executed to set the threshold levels of selected memory cells among at least one of said second, third, and fourth states, depending on multilevel data to be programmed into the selected memory cells;

verification is carried out to verify whether said memory cells for which said first programming has been executed have been programmed to the corresponding threshold voltage states and to distinguish insufficiently programmed memory cells; and second programming is executed to set the threshold levels of insufficiently programmed memory cells according to the multilevel data to be programmed therein.

17. The nonvolatile semiconductor memory device according to claim 16, wherein:

a word line voltage that changes substantially stepwise is applied to the word lines of the selected memory cells for the purpose of verifying whether those memory cells have been programmed to corresponding threshold voltage states.

18. The nonvolatile semiconductor memory device according to claim 16, wherein:

after the completion of programming into the memory cells that are to be set to a threshold voltage state that has a greatest difference from a threshold voltage level of a data erased state, programming is executed for the memory cells to be set to the remaining threshold voltage states that differ from said data erased state.

19. The nonvolatile semiconductor memory device according to claim 17, wherein:

after said bit line is precharged, verification is carried out to verify whether the selected memory cells have been programmed to the corresponding threshold voltage states by sensing voltage change on said precharged bit line as the word line voltage that changes substantially stepwise is applied.

20. The nonvolatile semiconductor memory device according to claim 19 wherein:

for each said corresponding threshold voltage state, said bit line is precharged before a start of verifying whether memory cells have been programmed to that threshold voltage state.

* * * * *